(12) United States Patent
Choi et al.

(10) Patent No.: US 11,532,620 B2
(45) Date of Patent: Dec. 20, 2022

(54) INTEGRATED CIRCUIT DEVICES AND METHODS OF MANUFACTURING THE SAME

(71) Applicant: Samsung Electronics Co., Ltd., Suwon-si (KR)

(72) Inventors: Kyungin Choi, Seoul (KR); Dahye Kim, Yongin-si (KR); Jaemun Kim, Seoul (KR); Jinbum Kim, Seoul (KR); Seunghun Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/524,128

(22) Filed: Nov. 11, 2021

(65) Prior Publication Data

US 2022/0068920 A1 Mar. 3, 2022

Related U.S. Application Data

(63) Continuation of application No. 16/946,060, filed on Jun. 4, 2020, now Pat. No. 11,205,649.

(30) Foreign Application Priority Data

Oct. 23, 2019 (KR) .................. 10-2019-0132392

(51) Int. Cl.
*H01L 27/088* (2006.01)
*H01L 29/165* (2006.01)
(Continued)

(52) U.S. Cl.
CPC .... *H01L 27/0886* (2013.01); *H01L 21/02532* (2013.01); *H01L 21/02592* (2013.01);
(Continued)

(58) Field of Classification Search
CPC ......... H01L 21/02532; H01L 21/02592; H01L 21/02598; H01L 21/02603;
(Continued)

(56) References Cited

U.S. PATENT DOCUMENTS 9,343,300 B1   5/2016   Jacob et al.
9,412,849 B1   8/2016   Suk et al.
(Continued)

*Primary Examiner* — David C Spalla
(74) *Attorney, Agent, or Firm* — Myers Bigel, P.A.

(57) ABSTRACT

Integrated circuit devices may include a fin-type active area, a semiconductor liner contacting a side wall of the fin-type active area and including a protrusion portion protruding outward from the fin-type active area in the vicinity of an edge of an upper surface of the fin-type active area, and an isolation layer spaced apart from the fin-type active area with the semiconductor liner therebetween. To manufacture the integrated circuit devices, a crystalline semiconductor layer covering the fin-type active area with a first thickness and an amorphous semiconductor layer covering the mask pattern with a second thickness may be formed, an extended crystalline semiconductor layer covering the mask pattern may be formed by crystalizing the amorphous semiconductor layer, and a semiconductor liner including a protrusion portion may be formed from the extended crystalline semiconductor layer and the crystalline semiconductor layer.

20 Claims, 47 Drawing Sheets

(51) Int. Cl.
  *H01L 29/06* (2006.01)
  *H01L 21/8234* (2006.01)
  *H01L 21/02* (2006.01)
  *H01L 29/66* (2006.01)
  *H01L 21/306* (2006.01)
  *H01L 21/762* (2006.01)

(52) U.S. Cl.
  CPC .. *H01L 21/02598* (2013.01); *H01L 21/02667* (2013.01); *H01L 21/30604* (2013.01); *H01L 21/76224* (2013.01); *H01L 21/823431* (2013.01); *H01L 21/823487* (2013.01); *H01L 29/0673* (2013.01); *H01L 29/165* (2013.01); *H01L 29/66545* (2013.01)

(58) Field of Classification Search
  CPC ......... H01L 21/02667; H01L 21/30604; H01L 21/76224; H01L 21/823431; H01L 21/823487; H01L 21/823821; H01L 21/845; H01L 27/0886; H01L 27/0924; H01L 27/10879; H01L 27/1211; H01L 29/0665; H01L 29/0669; H01L 29/0673; H01L 29/165; H01L 29/41791; H01L 29/66439; H01L 29/66545; H01L 29/66795; H01L 29/775; H01L 29/785; H01L 29/7851; H01L 29/7853; H01L 29/7855; H01L 2029/7858
  See application file for complete search history.

(56) References Cited

U.S. PATENT DOCUMENTS

| | | | |
|---|---|---|---|
| 9,865,597 B2 | 1/2018 | Cha et al. | |
| 9,984,937 B1* | 5/2018 | Bi | H01L 29/7827 |
| 9,991,262 B1 | 6/2018 | Ching et al. | |
| 10,276,449 B1* | 4/2019 | Wu | H01L 21/31111 |
| 2018/0145131 A1 | 5/2018 | Wang et al. | |
| 2018/0151677 A1* | 5/2018 | Glass | H01L 29/0653 |
| 2018/0350969 A1 | 12/2018 | Ching et al. | |
| 2019/0067111 A1 | 2/2019 | Tsai et al. | |
| 2019/0267465 A1 | 8/2019 | Chen et al. | |

* cited by examiner

Y – Y'

INTEGRATED CIRCUIT DEVICES AND METHODS OF MANUFACTURING THE SAME

CROSS-REFERENCE TO RELATED APPLICATION

This application is a continuation of U.S. patent application Ser. No. 16/946,060, filed Jun. 4, 2020, which claims priority under 35 U.S.C. § 119 to Korean Patent Application No. 10-2019-0132392, filed on Oct. 23, 2019, in the Korean Intellectual Property Office, the disclosure of which is incorporated herein in its entirety by reference.

BACKGROUND

The inventive concept relates to an integrated circuit device and a method of manufacturing the same, and particularly, to an integrated circuit device including a field-effect transistor and a manufacturing method thereof.

Along with the development of electronic technology, recent semiconductor devices have been rapidly downscaled. Recently, because not only a fast operating speed but also operation accuracy become important for semiconductor devices, various research for a structure of transistors included in a semiconductor device has been conducted.

SUMMARY

The inventive concept provides integrated circuit devices having a structure capable of improving the performance of a transistor.

The inventive concept also provides methods of manufacturing an integrated circuit device having a structure capable of improving the performance of a transistor.

According to some embodiments of the inventive concept, there is provided an integrated circuit device including: a fin-type active area protruding from a substrate in a vertical direction; a semiconductor liner being in contact with a side wall of the fin-type active area and including an inner surface facing the fin-type active area and an outer surface opposite the inner surface, the semiconductor liner further comprising a protrusion portion that is adjacent to an edge of an upper surface of the fin-type active area, and the outer surface of the protrusion portion protrudes outward; and an isolation layer on a lower portion of the side wall of the fin-type active area and spaced apart from the fin-type active area by interposing the semiconductor liner therebetween.

According to some embodiments of the inventive concept, there is provided an integrated circuit device including: a first fin-type active area protruding from a substrate in a first area of the substrate and including a first channel area including a first semiconductor material; a second fin-type active area protruding from the substrate in a second area of the substrate and including a second channel area including a second semiconductor material that is different from the first semiconductor material; a first semiconductor liner being in contact with a side wall of the first fin-type active area and including at least one first protrusion portion that protrudes outward and is adjacent to an edge of an upper surface of the first fin-type active area; a second semiconductor liner being in contact with a side wall of the second fin-type active area and including at least one second protrusion portion that protrudes outward and is adjacent to an edge of an upper surface of the second fin-type active area; and an isolation layer on a lower portion of the side wall of the first fin-type active area and on a lower portion of the side wall of the second fin-type active area.

According to some embodiments of the inventive concept, there is provided an integrated circuit device including: a fin-type active area protruding from a substrate in a vertical direction; a plurality of nanosheets overlapping each other in the vertical direction on an upper surface of the fin-type active area; a semiconductor liner being in contact with a side wall of the fin-type active area; a gate line including a main gate portion extending in a direction intersecting with the fin-type active area on the substrate, and a plurality of sub-gate portions respectively interposed between the plurality of nanosheets; and an isolation layer on the side wall of the fin-type active area by interposing the semiconductor liner therebetween.

According to some embodiments of the inventive concept, there is provided a method of manufacturing an integrated circuit device, the method including: forming a mask pattern on a substrate; forming a fin-type active area, using the mask pattern as an etching mask, by etching a portion of the substrate; forming a crystalline semiconductor layer extending on a surface of the fin-type active area with a first thickness, and an amorphous semiconductor layer extending on a surface of the mask pattern with a second thickness that is greater than the first thickness; forming an isolation layer on the crystalline semiconductor layer and the amorphous semiconductor layer; forming an extended crystalline semiconductor layer on a side wall of the mask pattern by crystalizing a first portion of the amorphous semiconductor layer adjacent to an interface between the crystalline semiconductor layer and the amorphous semiconductor layer; removing a second portion of the amorphous semiconductor layer remaining on the extended crystalline semiconductor layer and the mask pattern; reducing a size of the extended crystalline semiconductor layer; and performing a recess process for removing a portion of the isolation layer such that a portion of the fin-type active area protrudes upwardly beyond the isolation layer. A semiconductor liner including a protrusion portion that protrudes outward and is adjacent an edge of an upper surface of the fin-type active area is formed by modifying the extended crystalline semiconductor layer and the crystalline semiconductor layer while performing the recess process.

According to some embodiments of the inventive concept, there is provided a method of manufacturing an integrated circuit device, the method including: forming a semiconductor structure on a substrate; forming a mask pattern on the semiconductor structure; forming a fin-type active area including a portion of the substrate and a portion of the semiconductor structure, using the mask pattern as an etching mask, by etching the semiconductor structure and the substrate; forming a crystalline semiconductor layer extending on a surface of the fin-type active area with a first thickness, and an amorphous semiconductor layer extending on a surface of the mask pattern with a second thickness that is greater than the first thickness; forming an isolation layer on the crystalline semiconductor layer and the amorphous semiconductor layer; forming an extended crystalline semiconductor layer on a side wall of the mask pattern by crystalizing a first portion of the amorphous semiconductor layer from an interface between the crystalline semiconductor layer and the amorphous semiconductor layer; removing a second portion of the amorphous semiconductor layer remaining on the extended crystalline semiconductor layer and the mask pattern; reducing a size of the extended crystalline semiconductor layer; and performing a recess process for removing a portion of the isolation layer such that a portion including the semiconductor structure in the fin-type active area protrudes upwardly beyond the isolation layer. A semiconductor liner including a protrusion portion that protrudes outward and is adjacent to an edge of an upper surface of the fin-type active area is formed by modifying the extended crystalline semiconductor layer and the crystalline semiconductor layer while performing the recess process.

According to some embodiments of the inventive concept, there is provided a method of manufacturing an integrated circuit device, the method including: forming, on a substrate, a stacked structure in which a plurality of sacrificial semiconductor layers and a plurality of nanosheet semiconductor layers are alternately stacked one layer by one layer; forming a mask pattern on the stacked structure; forming a trench in the substrate and forming a fin-type active area including a portion of the substrate, using the mask pattern as an etching mask, by etching the stacked structure and the substrate; forming a crystalline semiconductor layer extending on, with a first thickness, the fin-type active area and the stacked structure remaining on the fin-type active area, and an amorphous semiconductor layer extending on the mask pattern with a second thickness that is greater than the first thickness; forming an isolation layer on the crystalline semiconductor layer and the amorphous semiconductor layer; forming an extended crystalline semiconductor layer on a side wall of the mask pattern by crystalizing a first portion of the amorphous semiconductor layer adjacent to an interface between the crystalline semiconductor layer and the amorphous semiconductor layer; removing a second portion of the amorphous semiconductor layer remaining on the extended crystalline semiconductor layer and the mask pattern; and performing a recess process for removing a portion of the isolation layer such that the stacked structure protrudes upwardly beyond the isolation layer. A semiconductor liner including a protrusion portion that protrudes outward and is adjacent to an edge of an upper surface of an uppermost one of the plurality of nanosheet semiconductor layers is formed by modifying the extended crystalline semiconductor layer and the crystalline semiconductor layer while performing the recess process.

BRIEF DESCRIPTION OF DRAWINGS

Embodiments of the inventive concept will be more clearly understood from the following detailed description taken in conjunction with the accompanying drawings in which:

FIGS. 10A to 17B are cross-sectional views illustrating a method of manufacturing an integrated circuit device according to example embodiments of the inventive concept, wherein FIGS. 10A, 11A, 12A, 13A, 14A, 15A, 16A, and 17A are cross-sectional views taken along line X-X' of FIG. 6A, and FIGS. 10B, 11B, 12B, 13B, 14B, 15B, 16B, and 17B are cross-sectional views taken along line Y-Y' of FIG. 6A.

DETAILED DESCRIPTION

Figure 1A:
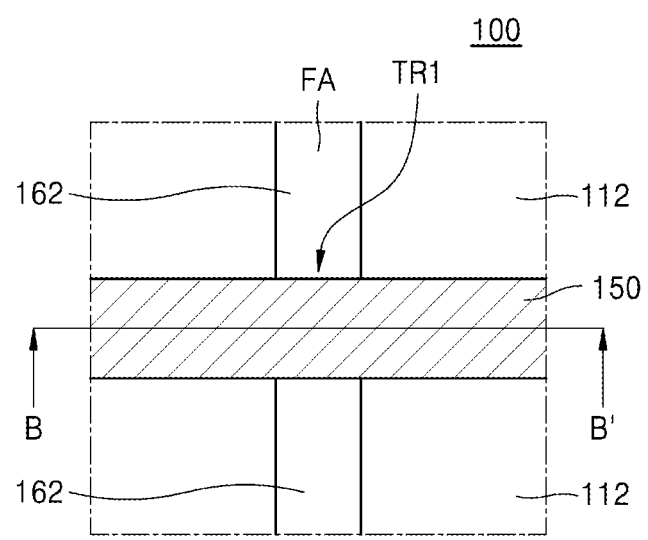
FIG. 1A is a plane layout diagram of an integrated circuit device according to example embodiments of the inventive concept.
Figure 1A:
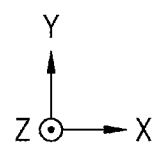

Hereinafter, some example embodiments of the inventive concept will be described in detail with reference to the accompanying drawings. Like reference numerals in the drawings denote like elements, and thus their repetitive description may be omitted.

Figure 1B:
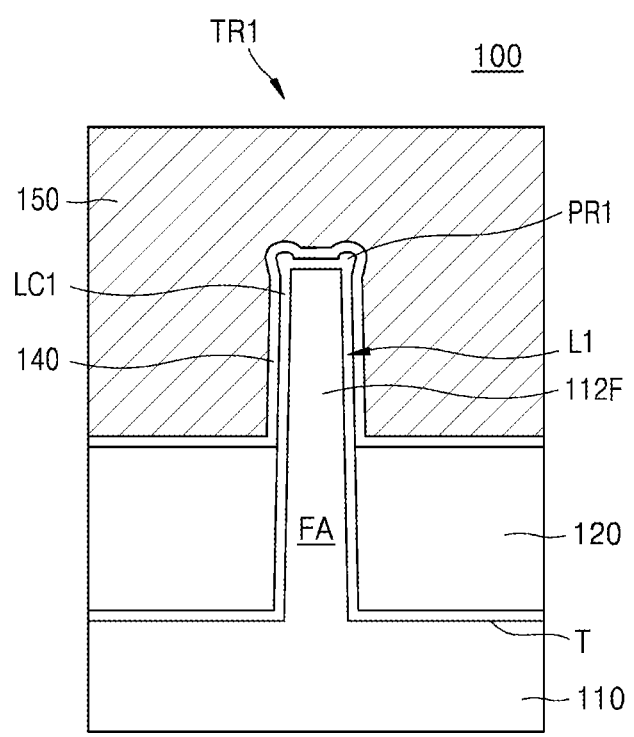
FIG. 1B is a cross-sectional view taken along line B-B' of FIG. 1A.
Figure 1B:
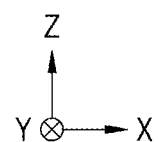
Figure 1C:
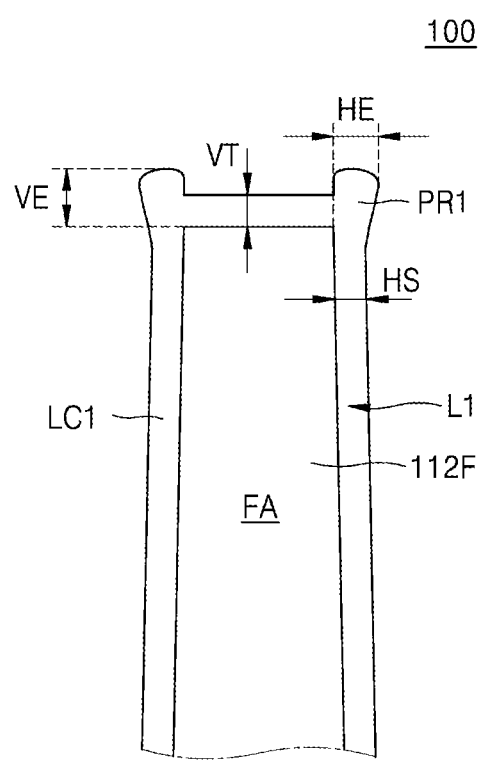
FIG. 1C is a magnified cross-sectional view of portions of the integrated circuit device shown in FIGS. 1A and 1B.

FIG. 1A is a plane layout diagram of an integrated circuit device 100 according to some embodiments of the inventive concept, and FIG. 1B is a cross-sectional view taken along line B-B' of FIG. 1A. FIG. 1C is a magnified cross-sectional view of a portion of a fin-type active area FA and a portion of a semiconductor liner L1 covering the fin-type active area FA in the integrated circuit device 100 shown in FIGS. 1A and 1B. "An element A covering an element B" (or similar language) as used herein means that the element A is on the element B but does not necessarily mean that the element A covers the element B entirely.

Referring to FIGS. 1A to 1C, the integrated circuit device 100 includes the fin-type active area FA protruding on a substrate 110. The fin-type active area refers to an active area protruding from the substrate 110 and having a fin-like shape.

The substrate 110 may include a semiconductor such as silicon (Si) or germanium (Ge) or a compound semiconductor such as SiGe, silicon carbide (SiC), gallium arsenide (GaAs), indium arsenide (InAs), or indium phosphide (InP). The substrate 110 may include a conductive area, e.g., an impurity-doped well or an impurity-doped structure.

The fin-type active area FA may be limited or defined by a trench T formed in the substrate 110. The fin-type active area FA may protrude in a vertical direction (Z direction) that is perpendicular to a main surface of the substrate 110 and may extend along a horizontal direction (e.g., Y direction in FIGS. 1A and 1B) on the substrate 110. An isolation layer 120 covering a lower side wall (i.e., a lower portion of a side wall) of the fin-type active area FA is formed on the substrate 110. The fin-type active area FA includes a channel area 112F protruding upwardly than the isolation layer 120. The fin-type active area FA may protrude from the substrate 110 in the Z direction that is perpendicular to a surface of the substrate 110 as illustrated in FIG. 1B.

According to example embodiments of the inventive concept, the channel area 112F of the fin-type active area FA may include a single material. For example, the entire area of the fin-type active area FA including the channel area 112F may include Si. According to example embodiments of the inventive concept, a partial area including the channel area 112F in the fin-type active area FA may include SiGe, and the other partial area may include Si.

A gate insulating layer 140 and a gate line 150 may extend on the fin-type active area FA and the isolation layer 120 in a horizontal direction (e.g., X direction in FIGS. 1A and 1B) intersecting with a horizontal longitudinal direction of the fin-type active area FA (e.g., Y direction). The gate insulating layer 140 and the gate line 150 may cover both side walls and an upper surface of the channel area 112F.

A transistor TR1 may be formed on a part where the fin-type active area FA intersects with the gate line 150. The transistor TR1 may be a three-dimensional-structure metal oxide semiconductor (MOS) transistor having a channel formed on an upper surface and both side walls of the fin-type active area FA. The transistor TR1 may be an N-type MOS (NMOS) transistor or a P-type MOS (PMOS) transistor.

The surface of the fin-type active area FA is covered by the semiconductor liner L1. The semiconductor liner L1 may include a liner channel area LC1 between a side wall of the fin-type active area FA and the gate insulating layer 140 and being in contact with the channel area 112F, and a protrusion part PR1 protruding outward from the fin-type active area FA in the vicinity of an edge of the upper surface of the fin-type active area FA. A part of the semiconductor liner L1, which covers one fin-type active area FA, may include two protrusion parts PR1 extending along the horizontal longitudinal direction (e.g., Y direction) of the fin-type active area FA in the vicinity of both edges of the upper surface of the fin-type active area FA. As used herein, the term "part" may be interchangeable with the term "portion." In some embodiments, the protrusion part PR1 may be adjacent to an upper corner of the fin-type active area FA as illustrated in FIG. 1B. The semiconductor liner L1 comprises an inner surface facing the fin-type active area FA and an outer surface opposite the inner surface, and the outer surface comprises a portion that is adjacent to an upper corner of the fin-type active area FA and protrudes or bulges in both the horizontal direction and the vertical direction as illustrated in FIG. 1B.

The semiconductor liner L1 may further include a part between the fin-type active area FA and the isolation layer 120 and being in contact with the lower side wall of the fin-type active area FA, and a part between the substrate 110 and the isolation layer 120 and being in contact with the substrate 110 on a bottom surface of the trench T.

According to example embodiments of the inventive concept, the semiconductor liner L1 may include crystalline Si (e.g., monocrystalline Si). The liner channel area LC1 of the semiconductor liner L1, which contacts with the channel area 112F, may be used as a channel area of the transistor TR1 together with the channel area 112F of the fin-type active area FA. A channel area of a transistor refers to an area in which a channel is formed while the transistor is turned on. Accordingly, a channel is formed in the liner channel area LC1 while the transistor TR1 is turned on.

According to example embodiments of the inventive concept, the semiconductor liner L1 may include an undoped Si film. According to example embodiments of the inventive concept, the semiconductor liner L1 may include a doped Si film. A dopant included in the doped Si film may be an N-type or P-type dopant. For example, the dopant included in the doped Si film may include arsenic (As), phosphorous (P), or boron (B). A thickness of the semiconductor liner L1 covering the fin-type active area FA may be approximately 10 Å to 100 Å but is not limited thereto.

As illustrated in FIG. 1C, a part of the semiconductor liner L1, which covers the upper surface of the fin-type active area FA, may have a first vertical height VT from the upper surface of the fin-type active area FA. The protrusion part PR1 of the semiconductor liner L1 may have a second vertical height VE from the upper surface of the fin-type active area FA. The second vertical height VE may be greater than the first vertical height VT. A difference between the second vertical height VE and the first vertical height VT may be greater than approximately 0 and less than or equal to approximately 10 nm. In addition, a part of the semiconductor liner L1, which covers the side wall of the fin-type active area FA, may have a first horizontal width HS from the side wall of the fin-type active area FA. The protrusion part PR1 of the semiconductor liner L1 may have a second horizontal width HE from the side wall of the fin-type active area FA. The second horizontal width HE may be greater than the first horizontal width HS. A difference between the second horizontal width HE and the first horizontal width HS may be greater than approximately 0 and less than or equal to approximately 10 nm.

The gate insulating layer 140 may include an interface layer and a high dielectric layer. The interface layer may include a silicon oxide layer, a silicon oxynitride layer, a silicate layer, or a combination thereof. The interface layer may have a thickness of approximately 5 Å to 20 Å. In some embodiments, the interface layer may be omitted. The high dielectric layer may include a material having a higher dielectric constant than a silicon oxide layer. For example, the high dielectric layer may include a material selected from a hafnium oxide, a lanthanum oxide, a zirconium oxide, an aluminum oxide, and a combination thereof, but the material of the high dielectric layer is not limited thereto. The gate insulating layer 140 may have a thickness of approximately 10 Å to 40 Å but is not limited thereto.

The gate line 150 may include a work function-adjustment metal-containing layer and a gap-fill metal-containing layer which fills a space formed on the work function-adjustment metal-containing layer. According to example embodiments of the inventive concept, the gate line 150 may have a structure in which a metal nitride layer, a metal layer, a conductive capping layer, and a gap-fill metal layer are sequentially stacked. Each of the metal nitride layer and the metal layer may include, for example, at least one metal selected from among titanium (Ti), tungsten (W), rubidium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and lead (Pd). The conductive capping layer may include, for example, a metal nitride, e.g., a titanium nitride (TiN), a tantalum nitride (TaN), or a combination thereof. The gap-fill metal layer may include, for example, a W layer. The gap-fill metal layer may fill, in some embodiments without a void, a recess space formed by a stepped part on an upper surface of the conductive capping layer. According to example embodiments of the inventive concept, the gate line 150 may include a stacked structure of TiAlC/TiN/W, TiN/TaN/

TiAlC/TiN/W, or TiN/TaN/TiN/TiAlC/TiN/W. In the stacked structures, a TiAlC layer or a TiN layer may function as the work function-adjustment metal-containing layer. "An element A filling an element B" (or similar language) as used herein means that the element A is in the element B but does not necessarily mean that the element A fills the element B entirely.

The isolation layer 120 may include, for example, a silicon-containing insulating layer such as a silicon oxide layer, a silicon nitride layer, a silicon oxynitride layer, or a silicon carbonitride, or a combination thereof. For example, the isolation layer 120 may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ).

As illustrated in FIG. 1A, one pair of source/drain areas 162 may be formed on the fin-type active area FA at both sides of the gate line 150. The one pair of source/drain areas 162 may include a semiconductor layer epitaxially grown from the fin-type active area FA. The one pair of source/drain areas 162 may include, for example, an embedded SiGe structure including an epitaxially grown Si layer, an epitaxially grown SiC layer, and an epitaxially grown SiGe layer or the like.

The integrated circuit device 100 described with reference to FIGS. 1A to 1C may include the semiconductor liner L1 being in contact with the side wall and the upper surface of the fin-type active area FA, and the liner channel area LC1 of the semiconductor liner L1, which contacts the channel area 112F, may be used as the channel area of the transistor TR1 together with the channel area 112F of the fin-type active area FA. In particular, the semiconductor liner L1 includes the protrusion part PR1 protruding outward from the fin-type active area FA in the vicinity of an edge of the upper surface of the fin-type active area FA. The semiconductor liner L1 may reduce or prevent consumption of the fin-type active area FA due to oxidation and the like in a manufacturing process of the transistor TR1 including the fin-type active area FA. In particular, it may be possible to reduce or prevent a width of an upper part of the fin-type active area FA to be less than a width of a lower part of the fin-type active area FA in the manufacturing process of the transistor TR1, thereby reducing or preventing an increase of a difference between an upper critical dimension (CD) and a lower CD of the fin-type active area FA. And, an area of the channel area of the transistor TR1 may increase, thereby improving the performance of the transistor TR1.

Figure 2:
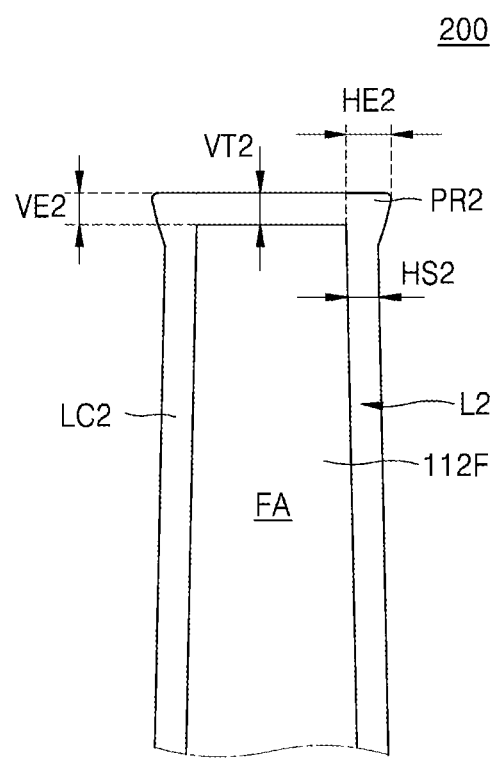
FIG. 2 is a cross-sectional view of an integrated circuit device according to example embodiments of the inventive concept.

FIG. 2 is a cross-sectional view of an integrated circuit device 200 according to example embodiments of the inventive concept.

Referring to FIG. 2, the integrated circuit device 200 has generally the same structure as the integrated circuit device 100 described with reference to FIGS. 1A to 1C. However, the integrated circuit device 200 includes a semiconductor liner L2 covering the surface of the fin-type active area FA. The semiconductor liner L2 may include a liner channel area LC2 being in contact with the channel area 112F of the fin-type active area FA and a protrusion part PR2 protruding outward from the fin-type active area FA in the vicinity of an edge of the upper surface of the fin-type active area FA. A part of the semiconductor liner L2, which covers one fin-type active area FA, may include two protrusion parts PR2 extending along the horizontal longitudinal direction (e.g., Y direction) of the fin-type active area FA in the vicinity of both edges of the upper surface of the fin-type active area FA. In some embodiments, the protrusion part PR2 may be adjacent to an upper corner of the fin-type active area FA as illustrated in FIG. 2. The semiconductor liner L2 comprises an inner surface facing the fin-type active area FA and an outer surface opposite the inner surface, and the outer surface comprises a portion that is adjacent to an upper corner of the fin-type active area FA and protrudes or bulges in the horizontal direction as illustrated in FIG. 2.

A part of the semiconductor liner L2, which covers the upper surface of the fin-type active area FA, may have a first vertical height VT2 from the upper surface of the fin-type active area FA. The protrusion part PR2 of the semiconductor liner L2 may have a second vertical height VE2 from the upper surface of the fin-type active area FA. The second vertical height VE2 may be substantially the same as or similar to the first vertical height VT2. In addition, a part of the semiconductor liner L2, which covers the side wall of the fin-type active area FA, may have a first horizontal width HS2 from the side wall of the fin-type active area FA. The protrusion part PR2 of the semiconductor liner L2 may have a second horizontal width HE2 from the side wall of the fin-type active area FA. The second horizontal width HE2 may be greater than the first horizontal width HS2. A difference between the second horizontal width HE2 and the first horizontal width HS2 may be greater than approximately 0 and less than or equal to approximately 10 nm.

A more detailed structure of the semiconductor liner L2 is generally the same as described about the semiconductor liner L1 with reference to FIGS. 1A to 1C.

The integrated circuit device 200 described with reference to FIG. 2 includes the semiconductor liner L2 being in contact with the surface of the fin-type active area FA. Therefore, a difference between an upper CD and a lower CD of the fin-type active area FA may be reduced, and an area of a channel area of a transistor including the fin-type active area FA and the semiconductor liner L2 may increase, thereby improving the performance of the transistor.

Figure 3:
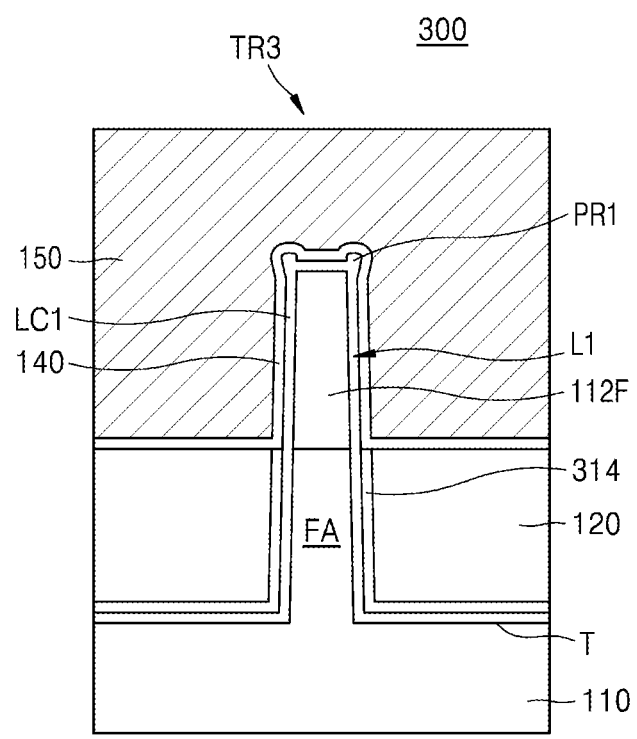
FIG. 3 is a cross-sectional view of an integrated circuit device according to example embodiments of the inventive concept.

FIG. 3 is a cross-sectional view of an integrated circuit device 300 according to example embodiments of the inventive concept.

Referring to FIG. 3, the integrated circuit device 300 has generally the same structure as the integrated circuit device 100 described with reference to FIGS. 1A to 1C. However, the integrated circuit device 300 further includes an insulation liner 314 between the semiconductor liner L1 and the isolation layer 120.

The insulation liner 314 may include a single insulating layer or multiple insulating layers. The insulation liner 314 may include a part extending along the lower side wall of the fin-type active area FA in the trench T and being interposed between the semiconductor liner L1 and the isolation layer 120, and a part extending along the bottom surface of the trench T between the substrate 110 and the isolation layer 120.

The insulation liner 314 may include a material applying tensile stress or compressive stress to the channel area 112F of the fin-type active area FA and the liner channel area LC1 of the semiconductor liner L1. The insulation liner 314 may improve the carrier mobility in the channel area 112F and the liner channel area LC1 by applying a stress to the channel area 112F and the liner channel area LC1. According to example embodiments of the inventive concept, the insulation liner 314 may include, for example, a silicon oxide layer, a silicon nitride layer, or a combination thereof. According to example embodiments of the inventive concept, the insulation liner 314 may include a material including silicon oxynitride (SiON), silicon boronitride (SiBN), silicon carbide (SiC), SiC:H (hydrogen doped SiC, SiCN, SiCN:H, silicon oxycarbonitride (SiOCN), SiOCN:H, silicon oxycarbide (SiOC), or a combination thereof. The insulation liner 314 may have a thickness of approximately 10 Å to 100 Å but is not limited thereto.

Figure 4A:
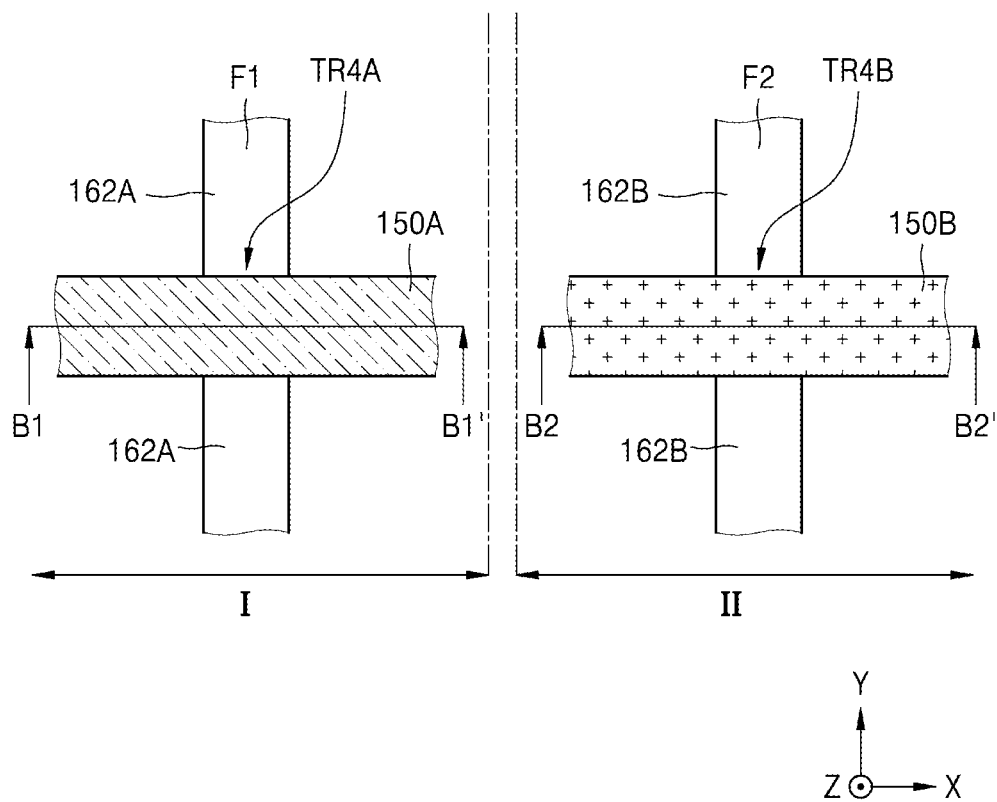
FIG. 4A is a plane layout diagram of an integrated circuit device according to example embodiments of the inventive concept.
Figure 4B:
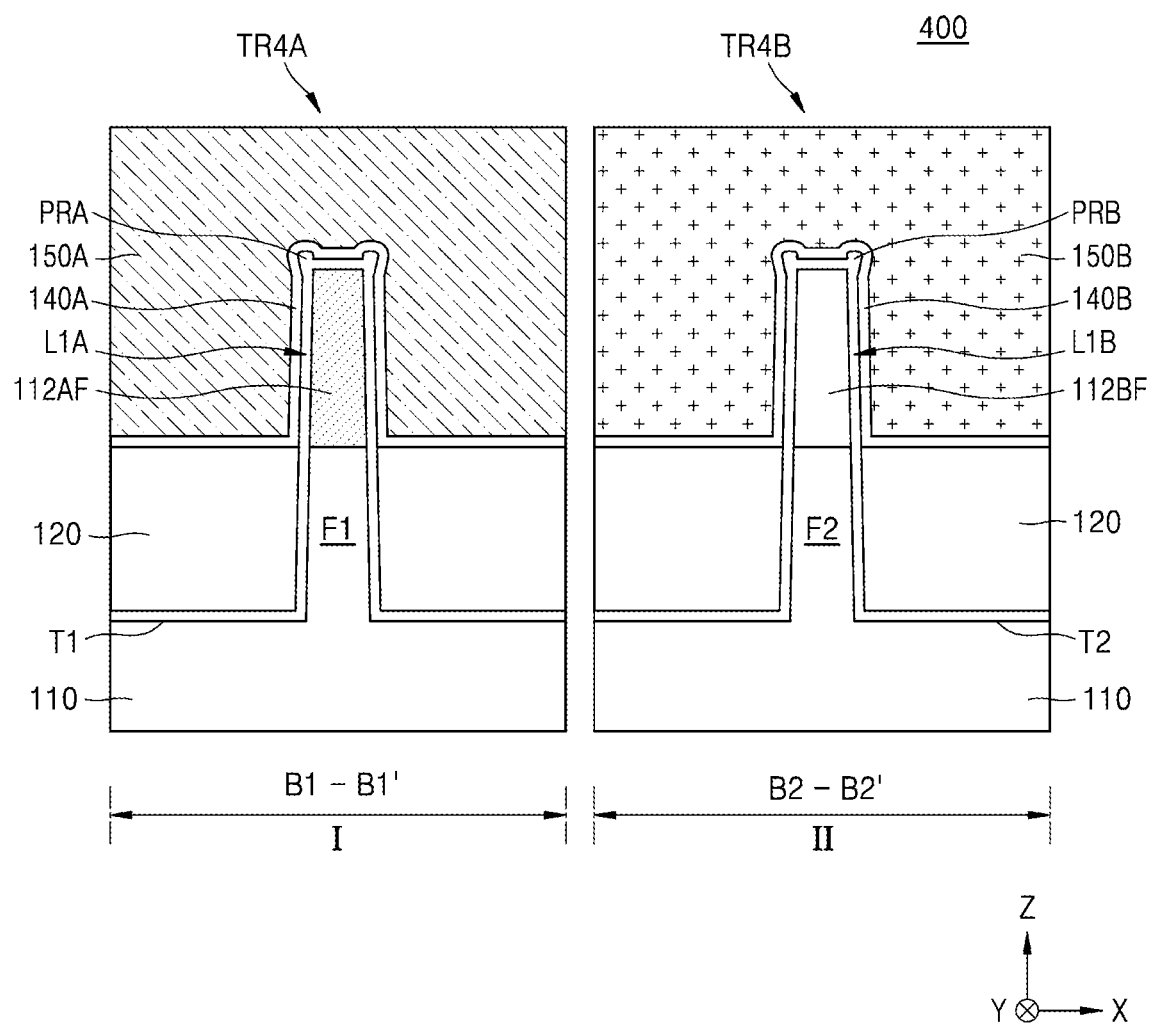
FIG. 4B is a cross-sectional view taken along lines B1-B1' and B2-B2' of FIG. 4A.

FIG. 4A is a plane layout diagram of an integrated circuit device 400 according to example embodiments of the inventive concept. FIG. 4B is a cross-sectional view taken along lines B1-B1' and B2-B2' of FIG. 4A.

Referring to FIGS. 4A and 4B, the integrated circuit device 400 includes a first area I and a second area II. The first area I and the second area II indicate different areas and may require different threshold voltages. According to example embodiments of the inventive concept, the first area I may be a PMOS transistor area, and the second area II may be an NMOS transistor area.

The integrated circuit device 400 includes a first fin-type active area F1 protruding on the substrate 110 in the first area I and a second fin-type active area F2 protruding on the substrate 110 in the second area II. In the first area I, a first gate line 150A extends on the first fin-type active area F1 and in a direction intersecting with the first fin-type active area F1, and in the second area II, a second gate line 150B extends on the second fin-type active area F2 and in a direction intersecting with the second fin-type active area F2. A first transistor TR4A may be formed at a part where the first fin-type active area F1 intersects with the first gate line 150A. A second transistor TR4B may be formed at a part where the second fin-type active area F2 intersects with the second gate line 150B. The first transistor TR4A and the second transistor TR4B may include a three-dimensional MOS transistor having channels on an upper surface and both side surfaces of the first fin-type active area F1 and the second fin-type active area F2, respectively. The first transistor TR4A may include a PMOS transistor, and the second transistor TR4B may include an NMOS transistor.

The numbers of first fin-type active areas F1 and first gate lines 150A arranged in the first area I and the numbers of second fin-type active areas F2 and second gate lines 150B arranged in the second area II are not limited to the example shown in FIG. 4A. In the first area I, at least one first gate line 150A may be arranged so as to extend by intersecting with one or more first fin-type active areas F1, and in the second area II, at least one second gate line 150B may be arranged so as to extend by intersecting with one or more second fin-type active areas F2.

As illustrated in FIG. 4B, in the first area I, the first fin-type active area F1 may protrude in the vertical direction (Z direction) from the substrate 110 and be limited or defined by a first trench T1 formed in the substrate 110. The first fin-type active area F1 may have a first channel area 112AF. According to example embodiments of the inventive concept, the first channel area 112AF of the first fin-type active area F1 may include SiGe, and a lower area remaining by excluding the first channel area 112AF from the first fin-type active area F1 may include Si.

A side wall and an upper surface of the first fin-type active area F1 are covered by a first semiconductor liner L1A. The first semiconductor liner L1A contacts with a lower side wall (i.e., a lower portion of a side wall) of the first fin-type active area F1 and a side wall and an upper surface of the first channel area 112AF. The lower side wall of the first fin-type active area F1 is covered by the isolation layer 120, and the first semiconductor liner L1A is interposed between the first fin-type active area F1 and the isolation layer 120. The first semiconductor liner L1A includes a first protrusion part PRA protruding outward from the first fin-type active area F1 in the vicinity of an edge of the upper surface of the first fin-type active area F1. A part of the first semiconductor liner L1A, which covers one first fin-type active area F1, may include two protrusion parts PRA extending along the horizontal longitudinal direction (e.g., Y direction) of the first fin-type active area F1 in the vicinity of both edges of the upper surface of the first fin-type active area F1. In some embodiments, the first protrusion part PRA may be adjacent to an upper corner of the first fin-type active area F1 as illustrated in FIG. 4B.

In the second area II, the second fin-type active area F2 may protrude in the vertical direction (Z direction) from the substrate 110 and be limited or defined by a second trench T2 formed in the substrate 110. The second fin-type active area F2 may have a second channel area 112BF. According to example embodiments of the inventive concept, all parts including the second channel area 112BF in the second fin-type active area F2 may include Si.

A side wall and an upper surface of the second fin-type active area F2 are covered by a second semiconductor liner L1B. The second semiconductor liner L1B contacts with a lower side wall (e.g., a lower portion of a side wall) of the second fin-type active area F2 and a side wall and an upper surface of the second channel area 112BF. The lower side wall of the second fin-type active area F2 is covered by the isolation layer 120, and the second semiconductor liner L1B is between the second fin-type active area F2 and the isolation layer 120. The second semiconductor liner L1B includes a second protrusion part PRB protruding outward from the second fin-type active area F2 in the vicinity of an edge of the upper surface of the second fin-type active area F2. A part of the second semiconductor liner L1B, which covers one second fin-type active area F2, may include two protrusion parts PRB extending along the horizontal longitudinal direction (e.g., Y direction) of the second fin-type active area F2 in the vicinity of both edges of the upper surface of the second fin-type active area F2. In some embodiments, the second protrusion part PRB may be adjacent to an upper corner of the second fin-type active area F2 as illustrated in FIG. 4B.

Each of the first semiconductor liner L A and the second semiconductor liner L1B may include crystalline Si (e.g., monocrystalline Si). According to example embodiments of the inventive concept, each of the first semiconductor liner L1A and the second semiconductor liner L1B may have the same structure as the structure of the semiconductor liner L1 described with reference to FIGS. 1A to 1C. According to example embodiments of the inventive concept, the first semiconductor liner L1A and the second semiconductor liner L1B may include the protrusion part PR2 described with reference to FIG. 2 instead of the first protrusion part PRA and the second protrusion part PRB, respectively.

In the first area I, a first gate insulating layer 140A is between the first fin-type active area F1 and the first gate line 150A, and in the second area II, a second gate insulating layer 140B is between the second fin-type active area F2 and the second gate line 150B. A detailed structure of the first gate insulating layer 140A and the second gate insulating layer 140B is generally the same as the structure of the gate insulating layer 140 described with reference to FIGS. 1A to 1C.

The first gate line 150A and the second gate line 150B have generally the same structure as the structure of the gate line 150 described with reference to FIGS. 1A to 1C. According to example embodiments of the inventive concept, the first gate line 150A may include, for example, a stacked structure of TiN/TaN/TiN/TiAlC/TiN/W, and the second gate line 150B may include, for example, a stacked structure of TiAlC/TiN/W or TiN/TaN/TiAlC/TiN/W. In the first gate line 150A, a TiN layer may adjust a work function, and in the second gate line 150B, a TiAlC layer may adjust a work function As illustrated in FIG. 4A, in the first area I, one pair of first source/drain areas 162A may be formed on the first fin-type active area F1 at both sides of the first gate line 150A. In the second area II, one pair of second source/drain areas 162B may be formed on the second fin-type active area F2 at both sides of the second gate line 150B. The one pair of first source/drain areas 162A may include a semiconductor layer epitaxially grown from the first fin-type active area F1. The one pair of second source/drain areas 162B may include a semiconductor layer epitaxially grown from the second fin-type active area F2. According to example embodiments of the inventive concept, the one pair of first source/drain areas 162A may have an embedded SiGe structure including a plurality of epitaxially grown SiGe layers, and the one pair of second source/drain areas 162B may include an epitaxially grown Si layer or an epitaxially grown SiC layer.

In the integrated circuit device 400 described with reference to FIGS. 4A and 4B, the first and second areas I and II having different conductive channels may include the first and second semiconductor liners L1A and L1B being in contact with the surfaces of the first and second fin-type active areas F1 and F2, respectively, and the parts of the first and second semiconductor liners L1A and L1B, which cover the first and second channel areas 112AF and 112BF, may be used as the channel areas of the first and second transistors TR4A and TR4B together with the first and second channel areas 112AF and 112BF, respectively, similarly to the description of the liner channel area LC1 illustrated in FIG. 1B. In particular, the first and second semiconductor liners L1A and L1B include the first and second protrusion parts PRA and PRB in the vicinity of edges of the upper surfaces of the first and second fin-type active areas F1 and F2, respectively. Therefore, an increase in a difference between an upper CD and a lower CD of each of the first and second fin-type active areas F1 and F2 may be reduced or prevented by the first and second semiconductor liners L1A and L1B, and an area of a channel area of each of the first and second transistors TR4A and TR4B respectively including the first and second fin-type active areas F1 and F2 and the first and second semiconductor liners L1A and L1B may increase, thereby improving the performance of each of the first and second transistors TR4A and TR4B.

Figure 5:
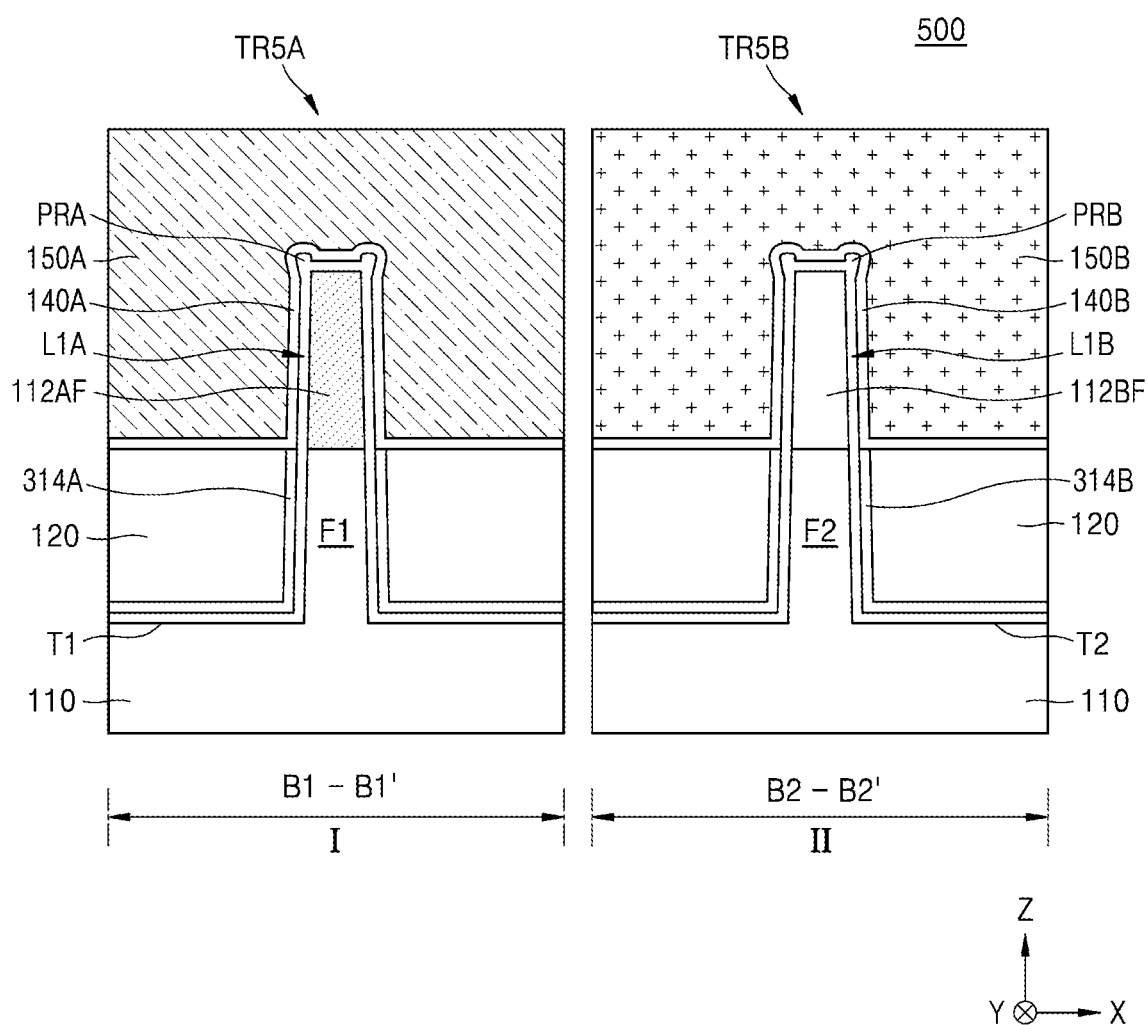
FIG. 5 is a cross-sectional view of an integrated circuit device according to example embodiments of the inventive concept.

FIG. 5 is a cross-sectional view of an integrated circuit device 500 according to example embodiments of the inventive concept.

Referring to FIG. 5, the integrated circuit device 500 has generally the same structure as the integrated circuit device 400 described with reference to FIGS. 4A and 4B. However, the integrated circuit device 500 further includes a first insulation liner 314A between the first semiconductor liner L1A and the isolation layer 120 in the first area I, and a second insulation liner 314B between the second semiconductor liner L1B and the isolation layer 120 in the second area II. According to example embodiments of the inventive concept, the first insulation liner 314A and the second insulation liner 314B may include the same material. According to example embodiments of the inventive concept, the first insulation liner 314A and the second insulation liner 314B may include different materials. According to example embodiments of the inventive concept, the first insulation liner 314A may apply compressive stress to the first channel area 112AF of the first fin-type active area F1, and the second insulation liner 314B may apply tensile stress to the second channel area 112BF of the second fin-type active area F2. A more detailed structure of the first insulation liner 314A and the second insulation liner 314B is generally the same as the insulation liner 314 described with reference to FIG. 3. Any one of the first insulation liner 314A and the second insulation liner 314B may be omitted.

A first transistor TR5A may be formed at a part where the first fin-type active area F1 intersects with the first gate line 150A. A second transistor TR5B may be formed at a part where the second fin-type active area F2 intersects with the second gate line 150B.

According to the integrated circuit device 500 described with reference to FIG. 5, operating characteristics optimized to respective characteristics required for the first and second transistors TR5A and TR5B arranged in different areas on the substrate 110 and forming different conductive channels may be obtained, and the performances of the first and second transistors TR5A and TR5B may be improved.

Figure 6A:
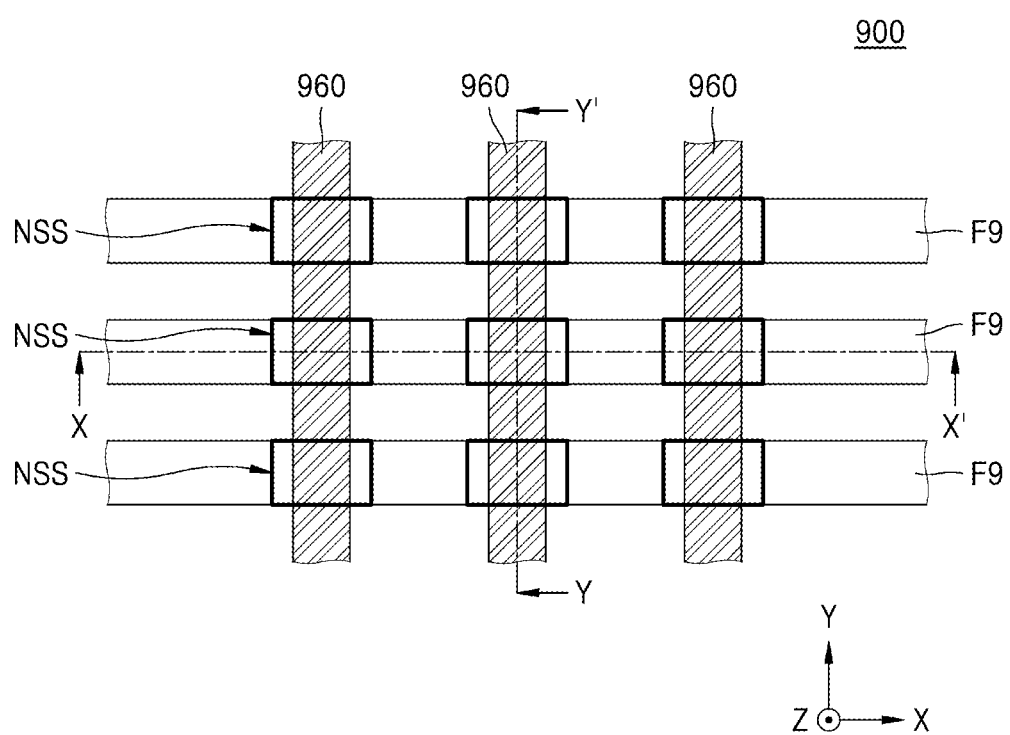
FIG. 6A is a plane layout diagram of an integrated circuit device according to example embodiments of the inventive concept.
Figure 6B:
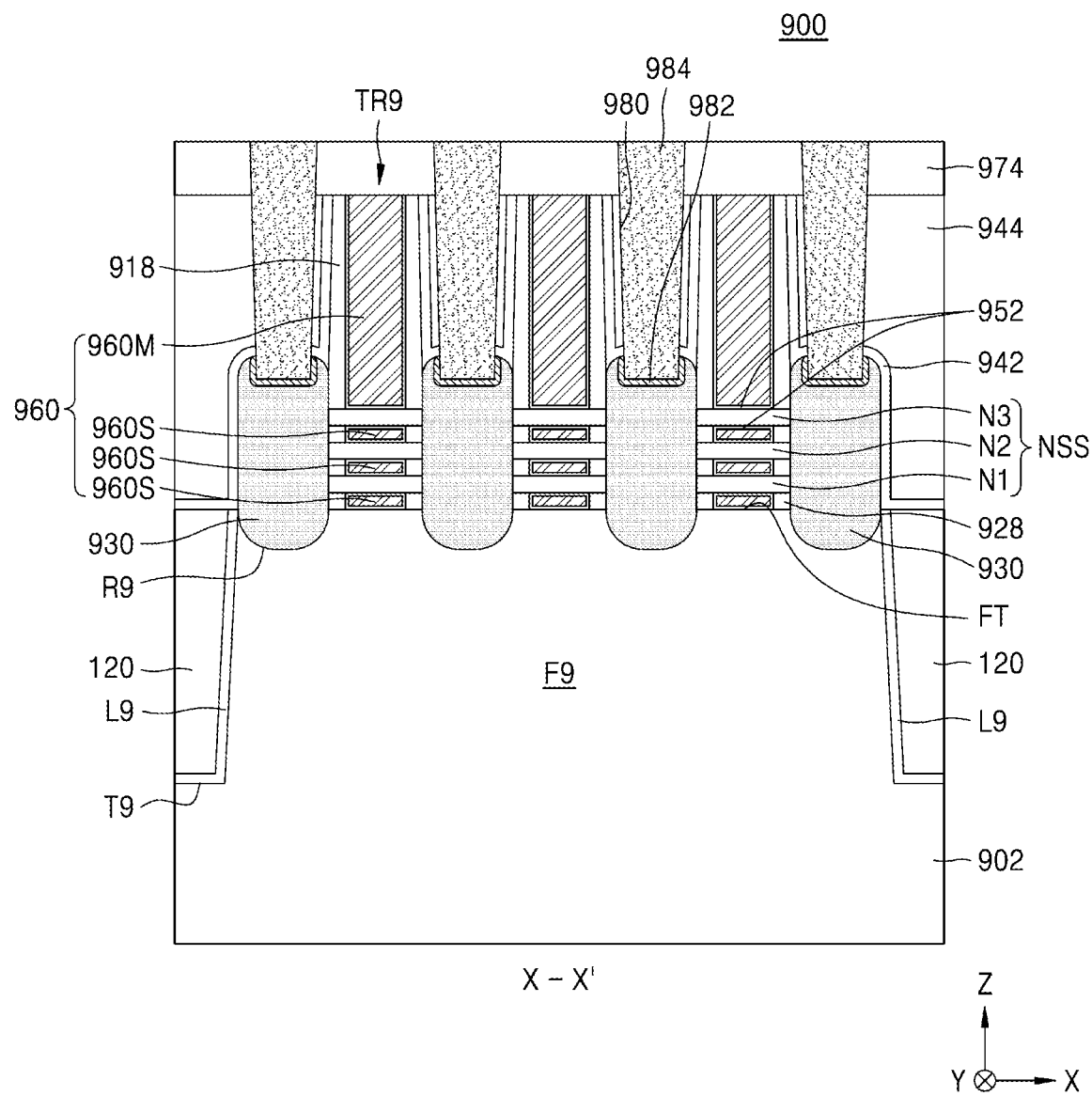
FIG. 6B is a cross-sectional view taken along line X-X' of FIG. 6A.
Figure 6C:
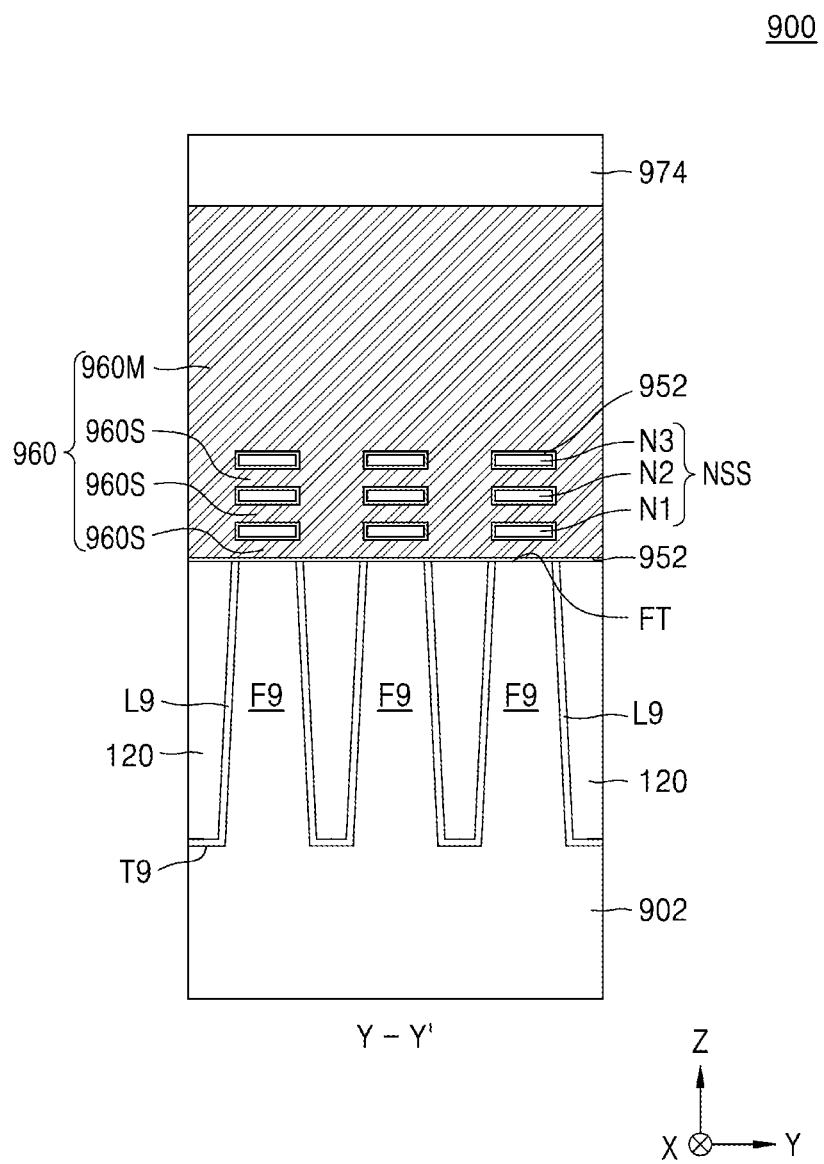
FIG. 6C is a cross-sectional view taken along line Y-Y' of FIG. 6A.

FIG. 6A is a plane layout diagram of an integrated circuit device 900 according to some embodiments of the inventive concept, FIG. 6B is a cross-sectional view taken along line X-X' of FIG. 6A, and FIG. 6C is a cross-sectional view taken along line Y-Y' of FIG. 6A Referring to FIGS. 6A to 6C, the integrated circuit device 900 includes a plurality of fin-type active areas F9 protruding from a substrate 902 and extending along a first horizontal direction (X direction) and a plurality of nanosheet stacks NSS facing upper surfaces FT of the plurality of fin-type active areas F9 at locations spaced in the vertical direction (Z direction) from the plurality of fin-type active areas F9. The term "nanosheet" used in the specification refers to a conductive structure having a cross-section substantially perpendicular to a current flowing direction. It will be understood that the nanosheet includes a nanowire.

The substrate 902 may have, formed therein, a trench T9 limiting or defining the plurality of fin-type active areas F9, and the trench T9 may be filled with the isolation layer 120. The substrate 902 and the plurality of fin-type active areas F9 may have the same structure as the substrate 110 and the fin-type active area FA described with reference to FIG. 1B.

A side wall of each of the plurality of fin-type active areas F9 is covered by a semiconductor liner L9. The semiconductor liner L9 may include a part interposed between each of the plurality of fin-type active areas F9 and the isolation layer 120 and being in contact with a lower side wall (i.e., a lower portion of a side wall) of each of the plurality of fin-type active areas F9, and a part interposed between the substrate 902 and the isolation layer 120 and being in contact with the substrate 902 at a bottom surface of the trench T9. According to example embodiments of the inventive concept, the semiconductor liner L9 may include crystalline Si (e.g., monocrystalline Si). According to example embodiments of the inventive concept, the semiconductor liner L9 may include an undoped Si layer. According to example embodiments of the inventive concept, the semiconductor liner L9 may include a doped Si layer. A more detailed structure of the semiconductor liner L9 is generally the same as the semiconductor liner L1 described with reference to FIGS. 1B and 1C.

A plurality of gate lines 960 may extend on the plurality of fin-type active areas F9 and in a second horizontal direction (e.g., Y direction) intersecting with the first horizontal direction (e.g., X direction). The plurality of nanosheet stacks NSS may be respectively arranged on the upper surfaces FT of the plurality of fin-type active areas F9 in regions where the plurality of fin-type active areas F9 intersect with the plurality of gate lines 960, and may respectively face the upper surfaces FT of the plurality of fin-type active areas F9 at locations spaced from the plurality of fin-type active areas F9. On the substrate 902, a plurality of nanosheet transistors TR9 may be formed at parts where the plurality of fin-type active areas F9 intersect with the plurality of gate lines 960, respectively.

Each of the plurality of nanosheet stacks NSS may include a plurality of nanosheets N1, N2, and N3 mutually overlapping in the vertical direction (Z direction) on the upper surface FT of each of the plurality of fin-type active areas F9. The plurality of nanosheets N1, N2, and N3 may include a first nanosheet N1, a second nanosheet N2, and a third nanosheet N3 having different vertical distances from the upper surface FT of the fin-type active area F9. As used herein, "an element A overlapping an element B in a vertical direction" (or similar language) means that at least one vertical line intersecting both the elements A and B exists.

FIG. 6A illustrates a case where a plane view shape of the nanosheet stack NSS is approximately a quadrangular shape, but the nanosheet stack NSS is not limited thereto. The nanosheet stack NSS may have various plane view shapes according to plane view shapes of each of the fin-type active area F9 and the gate line 960. Although a structure in which a plurality of nanosheet stacks NSS and a plurality of gate lines 960 are formed on one fin-type active area F9, and the plurality of nanosheet stacks NSS are arranged in a line in the first horizontal direction (X direction) on the one fin-type active area F9, is illustrated, the present inventive concept is not limited thereto. According to some embodiments of the inventive concept, the number of nanosheet stacks NSS arranged on one fin-type active area F9 is not particularly limited and may vary. For example, one nanosheet stack NSS may be arranged on one fin-type active area F9. Although FIG. 6B shows that each of the plurality of nanosheet stacks NSS includes three nanosheets, the inventive concept is not limited thereto. For example, the nanosheet stack NSS may include at least two nanosheets, and the number of nanosheets constituting the nanosheet stack NSS is not particularly limited and may vary.

Each of the plurality of nanosheets N1, N2, and N3 may have a channel area. According to example embodiments of the inventive concept, each of the plurality of nanosheets N1, N2, and N3 may have a thickness selected from a range of approximately 4.5 to 5.5 nm. Herein, the thicknesses of the plurality of nanosheets N1, N2, and N3 refer to sizes in the vertical direction (Z direction). According to example embodiments of the inventive concept, the plurality of nanosheets N1, N2, and N3 may have substantially the same thickness. According to example embodiments of the inventive concept, at least some of the plurality of nanosheets N1, N2, and N3 may have different thicknesses. According to example embodiments of the inventive concept, the plurality of nanosheets N1, N2, and N3 may include respective semiconductor layers including the same element. For example, each of the plurality of nanosheets N1, N2, and N3 may include a Si layer. In some embodiments, each of the plurality of nanosheets N1, N2, and N3 may include a SiGe layer. According to example embodiments of the inventive concept, the plurality of nanosheets N1, N2, and N3 may include respective semiconductor layers including different elements. For example, the first nanosheet N1 may include a SiGe layer, and the second and third nanosheets N2 and N3 may include a Si layer.

A plurality of recesses R9 may be formed in the fin-type active area F9, and a plurality of source/drain areas 930 may be formed on the plurality of recesses R9. The plurality of source/drain areas 930 may include an epitaxially grown semiconductor layer. A more detailed structure of the plurality of source/drain areas 930 is generally the same as the one pair of source/drain areas 162 described with reference to FIG. 1A.

The gate line 960 may cover the nanosheet stack NSS on the fin-type active area F9 and encompass each of the plurality of nanosheets N1, N2, and N3. Each of the plurality of gate lines 960 may include a main gate part 960M covering an upper surface of the nanosheet stack and extending along the second horizontal direction (e.g., Y direction), and a plurality of sub-gate parts 960S integrally connected to the main gate part 960M and arranged one by one between the plurality of nanosheets N1, N2, and N3 and between the fin-type active area F9 and the first nanosheet N1. The plurality of nanosheets N1, N2, and N3 may have a gate-all-around (GAA) structure encompassed by the gate line 960. The gate line 960 may include, for example, a metal, a metal nitride, a metal carbide, or a combination thereof. The metal may be selected from, for example, among Ti, W, Ru, Nb, Mo, Hf, Ni, Co, Pt, Yb, Tb, Dy, Er, and Pd. The metal nitride may be, for example, selected from TiN and TaN. The metal carbide may be TiAlC. A gate insulating layer 952 may be between the nanosheet stack NSS and the gate line 960. The gate insulating layer 952 may have generally the same structure as the gate insulating layer 140 described with reference to FIG. 1B.

A metal silicide layer 982 may be formed on an upper surface of each of the plurality of source/drain areas 930. The metal silicide layer 982 may include, for example, titanium silicide but is not limited thereto. The metal silicide layer 982 may be omitted.

Both side walls of the plurality of gate lines 960 may be respectively covered by a plurality of outer insulation spacers 918. The plurality of outer insulation spacers 918 may cover both side walls of the main gate parts 960M on the plurality of nanosheet stacks NSS, respectively. The plurality of outer insulation spacers 918 and the plurality of source/drain areas 930 may be covered by a protective insulating layer 942. Each of the outer insulation spacers 918 and the protective insulating layer 942 may be formed of, for example, SiN, SiCN, SiBN, SiON, SiOCN, SiBCN, SiOC, $SiO_2$, or a combination thereof. The protective insulating layer 942 may be omitted.

A plurality of inner insulation spacers 928 may be interposed one by one between the plurality of nanosheets N1, N2, and N3 and between the fin-type active area F9 and the first nanosheet N1. Both side walls of each of the plurality of sub-gate parts 960S may be covered by the inner insulation spacer 928 by interposing the gate insulating layer 952 therebetween. The plurality of inner insulation spacers 928 may be between the plurality of sub-gate parts 960S and the source/drain area 930. According to example embodiments of the inventive concept, the outer insulation spacer 918 and the inner insulation spacer 928 may include the same material. According to example embodiments of the inventive concept, the outer insulation spacer 918 and the inner insulation spacer 928 may include different materials. The inner insulation spacer 928 may include, for example, SiN, SiCN, SiBN, SiON, SiOCN, SiBCN, SiOC, $SiO_2$, or a combination thereof. The inner insulation spacer 928 may further include an air gap.

An inter-gate insulating layer 944 and an interlayer insulating layer 974 may be sequentially formed on the protective insulating layer 942. Each of the inter-gate insulating layer 944 and the interlayer insulating layer 974 may include, for example, a silicon oxide layer. A plurality of contact plugs 984 may be respectively arranged in a plurality of contact holes 980 penetrating the interlayer insulating layer 974, the inter-gate insulating layer 944, and the protective insulating layer 942. The plurality of contact plugs 984 may be connected to the plurality of source/drain areas 930 through a plurality of metal silicide layers 982, respectively. Each of the plurality of contact plugs 984 may include, for example, a metal, a conductive metal nitride, or a combination thereof. For example, each of the plurality of contact plugs 984 may include, for example, W, Cu, Al, Ti, Ta, TiN, TaN, an alloy thereof, or a combination thereof.

In the integrated circuit device 900, a horizontal CD difference between the first nanosheet N1 closest to the fin-type active area F9 among the plurality of nanosheets N1, N2, and N3 and the third nanosheet N3 farthest from the fin-type active area F9 may be substantially zero or be very small. Therefore, an amount of a current flowing through the third nanosheet N3 farthest from the fin-type active area F9 may increase. As a result, a deviation of an amount of a current flowing through the plurality of nanosheets N1, N2, and N3 in a turn-on state of each of the plurality of nanosheet transistors TR9 may be reduced or minimized to optimize the performances of the plurality of nanosheet transistors TR9 in the turn-on state.

Next, methods of manufacturing an integrated circuit device, according to example embodiments of the inventive concept, will be described with particular examples.

FIGS. 7A to 7I are cross-sectional views illustrating a method of manufacturing an integrated circuit device according to some embodiments of the inventive concept. A method of manufacturing the integrated circuit device 400 shown in FIGS. 4A and 4B is described with reference to FIGS. 7A to 7I. FIGS. 7A to 7I show cross-sectional views according to a process sequence of parts corresponding to the cross-sections taken along lines B1-B1' and B2-B2' of FIG. 4A. In FIGS. 7A to 7I, like reference numerals in FIGS. 1A to 4B denote like elements, and thus their repetitive description may be omitted herein.

Figure 7A:
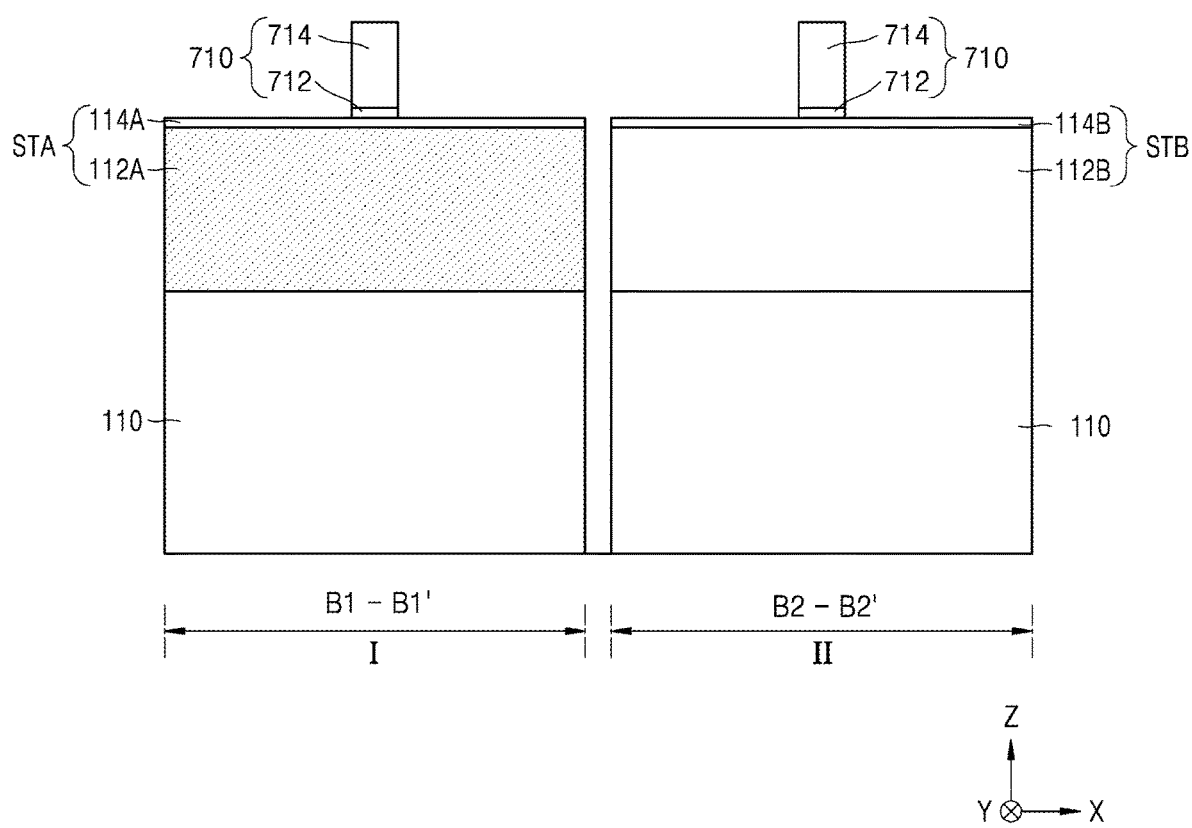
FIGS. 7A to 7I are cross-sectional views illustrating a method of manufacturing an integrated circuit device according to example embodiments of the inventive concept.

Referring to FIG. 7A, in the first area I, a first semiconductor structure STA is formed on the substrate 110, and in the second area II, a second semiconductor structure STB is formed on the substrate 110. The first semiconductor structure STA may include a first semiconductor layer 112A and a first upper semiconductor layer 114A sequentially stacked on the substrate 110. The second semiconductor structure STB may include a second semiconductor layer 112B and a second upper semiconductor layer 114B sequentially stacked on the substrate 110. The first upper semiconductor layer 114A and the second upper semiconductor layer 114B may include the same material and may be formed at the same time. According to example embodiments of the inventive concept, the first semiconductor layer 112A may include SiGe, and the first upper semiconductor layer 114A and the second upper semiconductor layer 114B may include Si.

In the first and second areas I and II, mask patterns 710 are formed on the first and second semiconductor structures STA and STB, respectively. The mask pattern 710 may include a stacked structure of a pad oxide layer pattern 712 and a silicon nitride layer pattern 714. The mask patterns 710 may extend in parallel to each other in the Y direction on the substrate 110. For example, the pad oxide layer pattern 712 may include an oxide layer obtained by thermo-oxidizing the surface of the substrate 110. The pad oxide layer pattern 712 may be omitted.

Figure 7B:
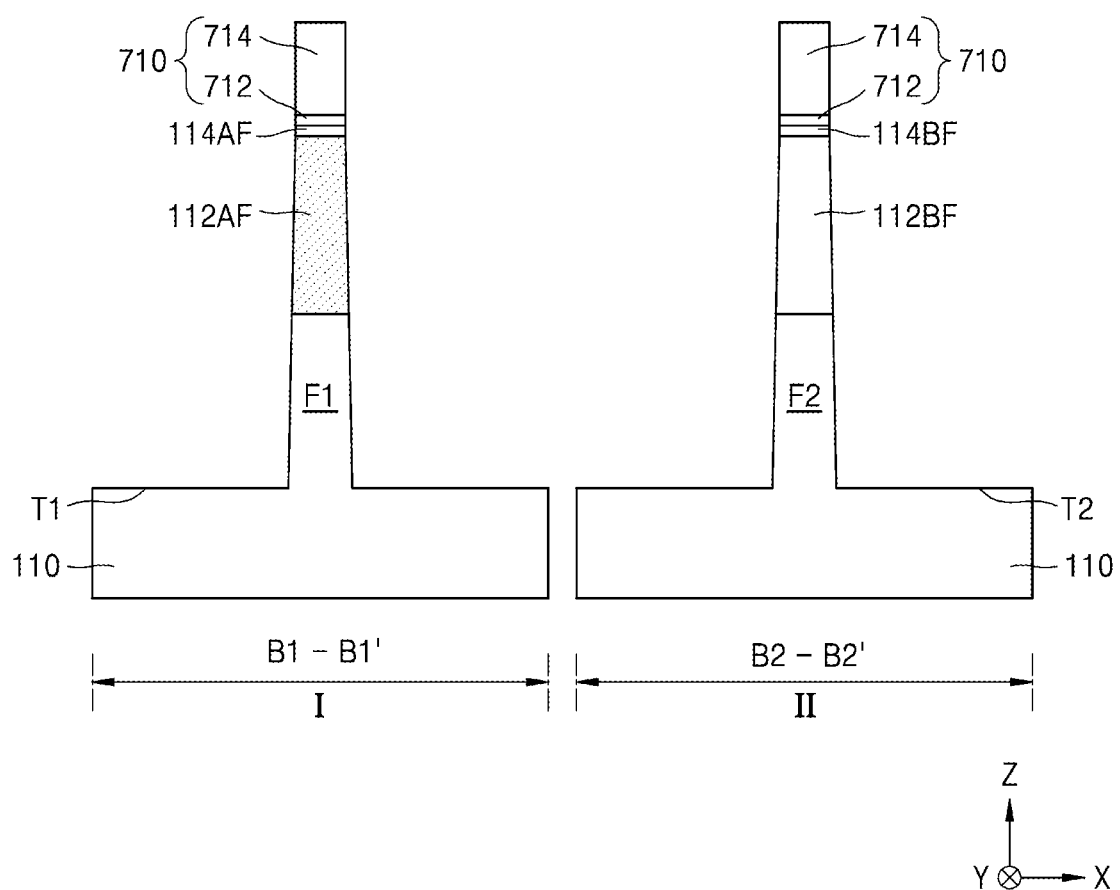

Referring to FIG. 7B, the first trench T1 and the first fin-type active area F1 are formed in the first area I and the second trench T2 and the second fin-type active area F2 are formed in the second area II, by using the mask patterns 710 as an etching mask to etch portions of the first and second semiconductor structures STA and STB and the substrate 110.

The first fin-type active area F1 may include the first channel area 112AF that is a portion of the substrate 110 and a portion of the first semiconductor layer 112A, and a first upper liner area 114AF that is a portion of the first upper semiconductor layer 114A. The second fin-type active area F2 may include the second channel area 112BF that is another portion of the substrate 110 and a portion of the second semiconductor layer 112B, and a second upper liner area 114BF that is a portion of the second upper semiconductor layer 114B.

Figure 7C:
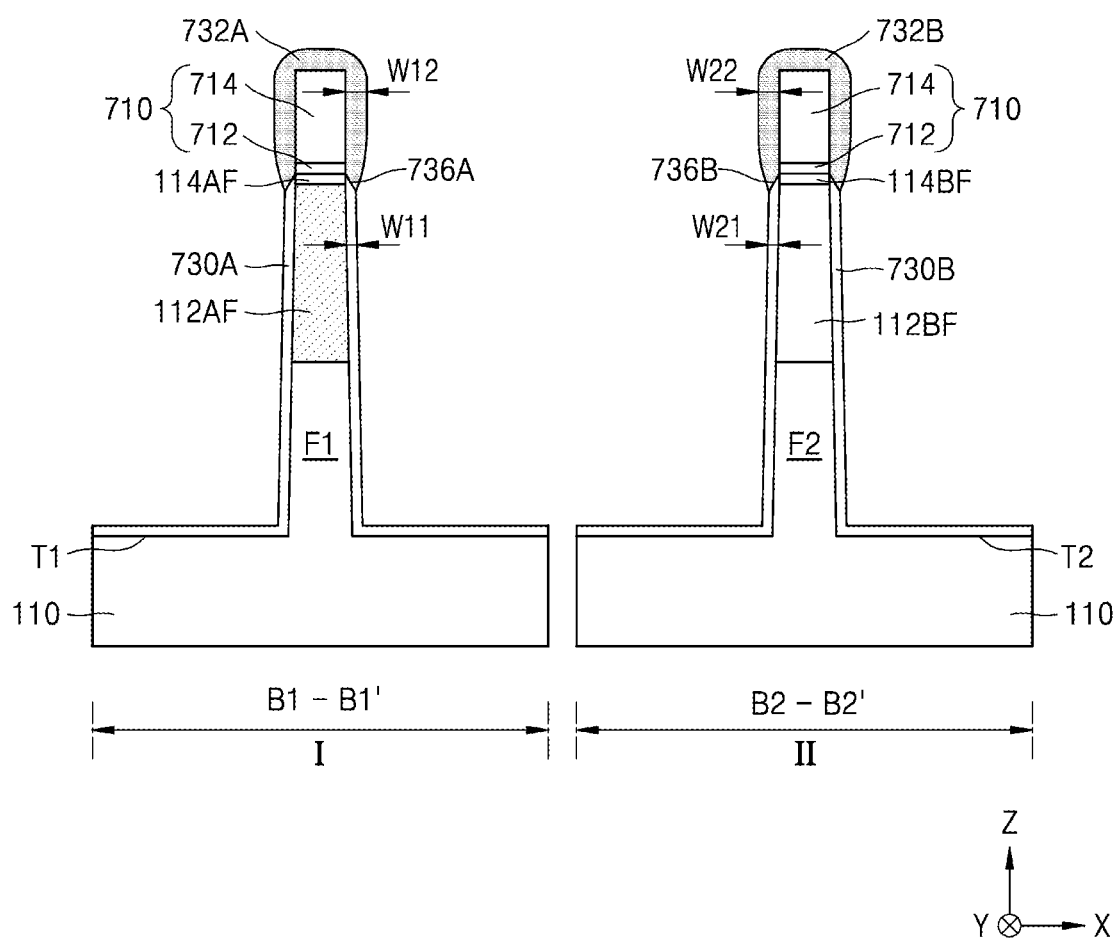

Referring to FIG. 7C, a semiconductor layer is grown from an exposed surface of each of the first and second fin-type active areas F1 and F2 and the mask patterns 710 in the first and second areas I and II by using, for example, a vapor phase epitaxy or liquid phase epitaxy process. As a result, a first crystalline semiconductor layer 730A covering surfaces of the first fin-type active area F1 and a first amorphous semiconductor layer 732A covering surfaces of the mask pattern 710 may be formed in the first area I, and a second crystalline semiconductor layer 730B covering surfaces of the second fin-type active area F2 and a second amorphous semiconductor layer 732B covering surfaces of the mask pattern 710 may be formed in the second area II. In some embodiments, each of the first crystalline semiconductor layer 730A and the second crystalline semiconductor layer 730B may be a monocrystalline semiconductor layer.

According to example embodiments of the inventive concept, each of the first and second crystalline semiconductor layers 730A and 730B and the first and second amorphous semiconductor layers 732A and 732B may include an undoped Si layer. According to example embodiments of the inventive concept, each of the first and second crystalline semiconductor layers 730A and 730B and the first and second amorphous semiconductor layers 732A and 732B may include a doped Si layer.

A growth rate of each of the first and second amorphous semiconductor layers 732A and 732B may be greater than a growth rate of each of the first and second crystalline semiconductor layers 730A and 730B. Therefore, in the first area I, a thickness W12 of the first amorphous semiconductor layer 732A may be greater than a thickness W11 of the first crystalline semiconductor layer 730A, and in the second area II, a thickness W22 of the second amorphous semiconductor layer 732B may be greater than a thickness W21 of the second crystalline semiconductor layer 730B. In the first area I, a first interface 736A exists between the first crystalline semiconductor layer 730A and the first amorphous semiconductor layer 732A, and in the second area II, a second interface 736B exists between the second crystalline semiconductor layer 730B and the second amorphous semiconductor layer 732B.

Figure 7D:
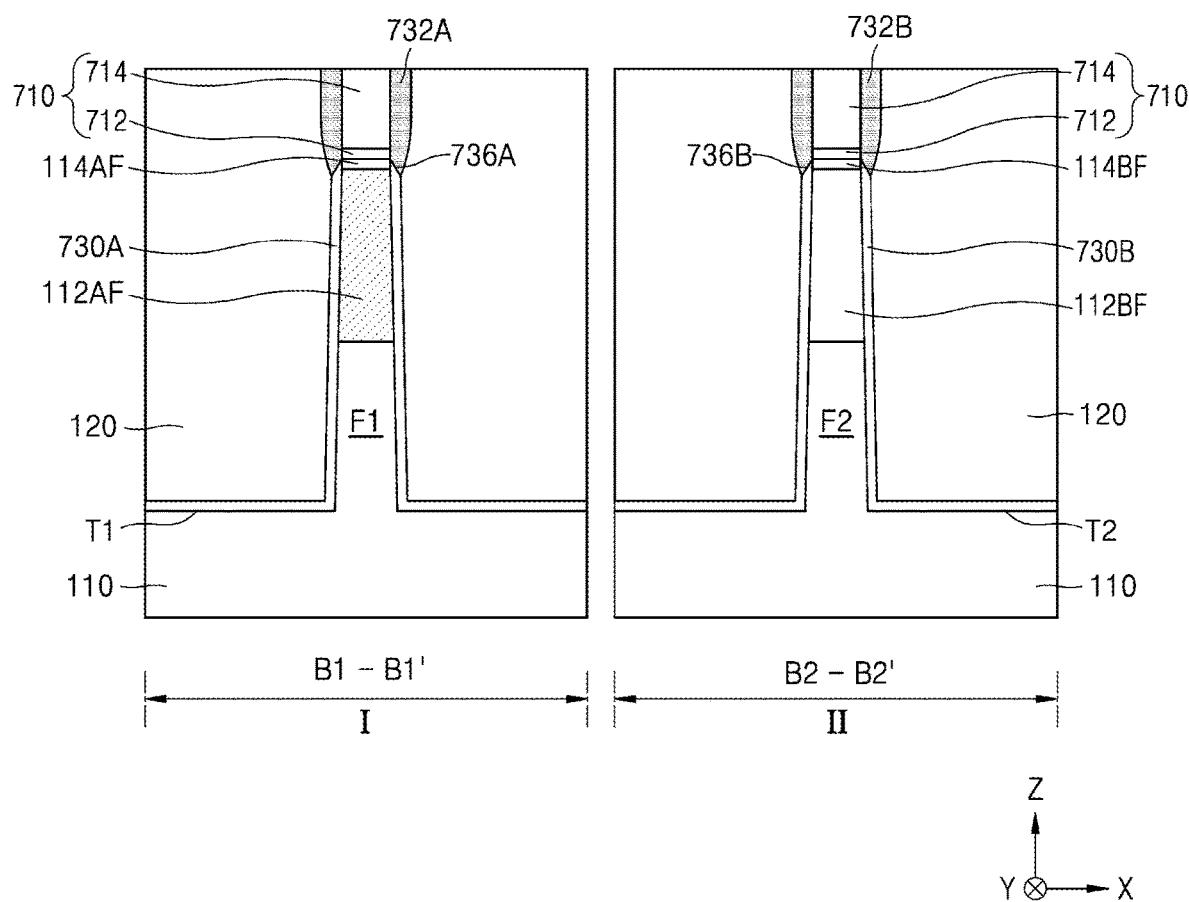

Referring to FIG. 7D, in the first and second areas I and II, the isolation layer 120 covering the side walls of the first and second fin-type active areas F1 and F2 while filling the first and second trenches is formed. In the first area I, the isolation layer 120 may cover the first crystalline semiconductor layer 730A and the first amorphous semiconductor layer 732A and be spaced apart from the first fin-type active area F1 by interposing the first crystalline semiconductor layer 730A therebetween. In the second area II, the isolation layer 120 may cover the second crystalline semiconductor layer 730B and the second amorphous semiconductor layer 732B and be spaced apart from the second fin-type active area F2 by interposing the second crystalline semiconductor layer 730B therebetween.

To form the isolation layer 120, a plasma enhanced chemical vapor deposition (PECVD) process, a high density plasma chemical vapor deposition (HDP CVD) process, an inductively coupled plasma chemical vapor deposition (ICP CVD) process, a capacitor coupled plasma chemical vapor deposition (CCP CVD) process, a flowable chemical vapor deposition (FCVD) process, a spin coating process, or the like may be performed.

The upper surfaces of the mask patterns 710 may be exposed by planarizing a result obtained by forming the isolation layer 120. In this case, a portion of each of the first amorphous semiconductor layer 732A, the second amorphous semiconductor layer 732B, and the mask patterns 710 may be consumed to reduce heights thereof.

Figure 7E:
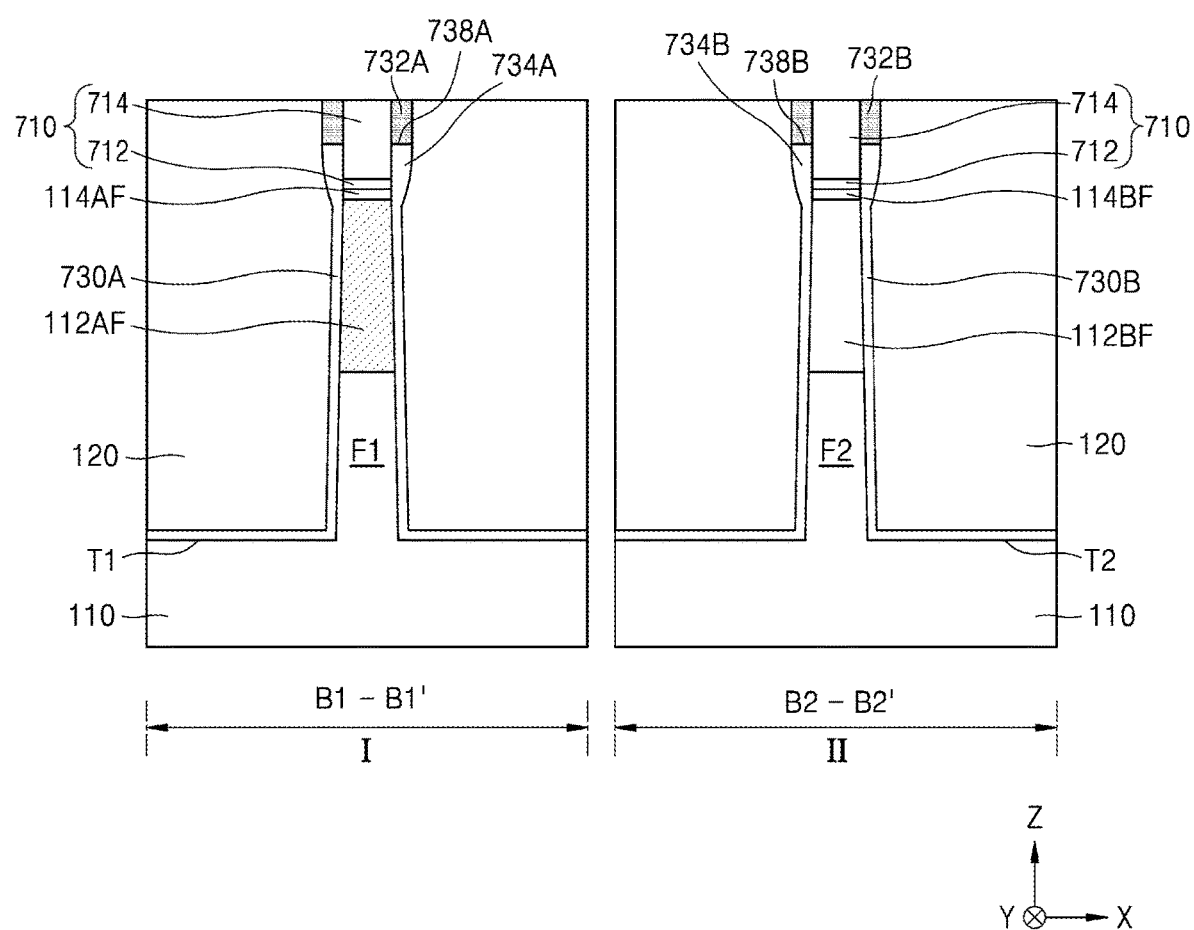

Referring to FIG. 7E, a result of FIG. 7D having the isolation layer 120 is annealed. As a result, in the first area I, an extended first crystalline semiconductor layer 734A covering the side walls of the mask pattern 710 in the first area I may be obtained by crystallizing a portion of the first amorphous semiconductor layer 732A from the first interface 736A, and in the second area II, an extended second crystalline semiconductor layer 734B covering the side walls of the mask pattern 710 in the second area II may be obtained by crystallizing a portion of the second amorphous semiconductor layer 732B from the second interface 736B. In the first area I, the first interface 738A may exist between the first amorphous semiconductor layer 732A and the extended first crystalline semiconductor layer 734A, and in the second area II, the second interface 738B may exist between the second amorphous semiconductor layer 732B and the extended second crystalline semiconductor layer 734B.

According to example embodiments of the inventive concept, the annealing may be performed for several seconds to several hours at a temperature of approximately 500° C. to approximately 1000° C. For example, the annealing may be performed for approximately 30 minutes to approximately 1 hour at a temperature of approximately 700° C. to approximately 800° C. According to example embodiments of the inventive concept, the isolation layer 120 may be densified during the annealing. According to example embodiments of the inventive concept, after performing a first annealing process for densifying the isolation layer 120, a second annealing process for crystallizing a portion of the first amorphous semiconductor layer 732A and a portion of the second amorphous semiconductor layer 732B may be performed to form the extended first crystalline semiconductor layer 734A and the extended second crystalline semiconductor layer 734B. Temperatures and times for the first and second annealing processes may be selected within a temperature range and a time range for the annealing.

Figure 7F:
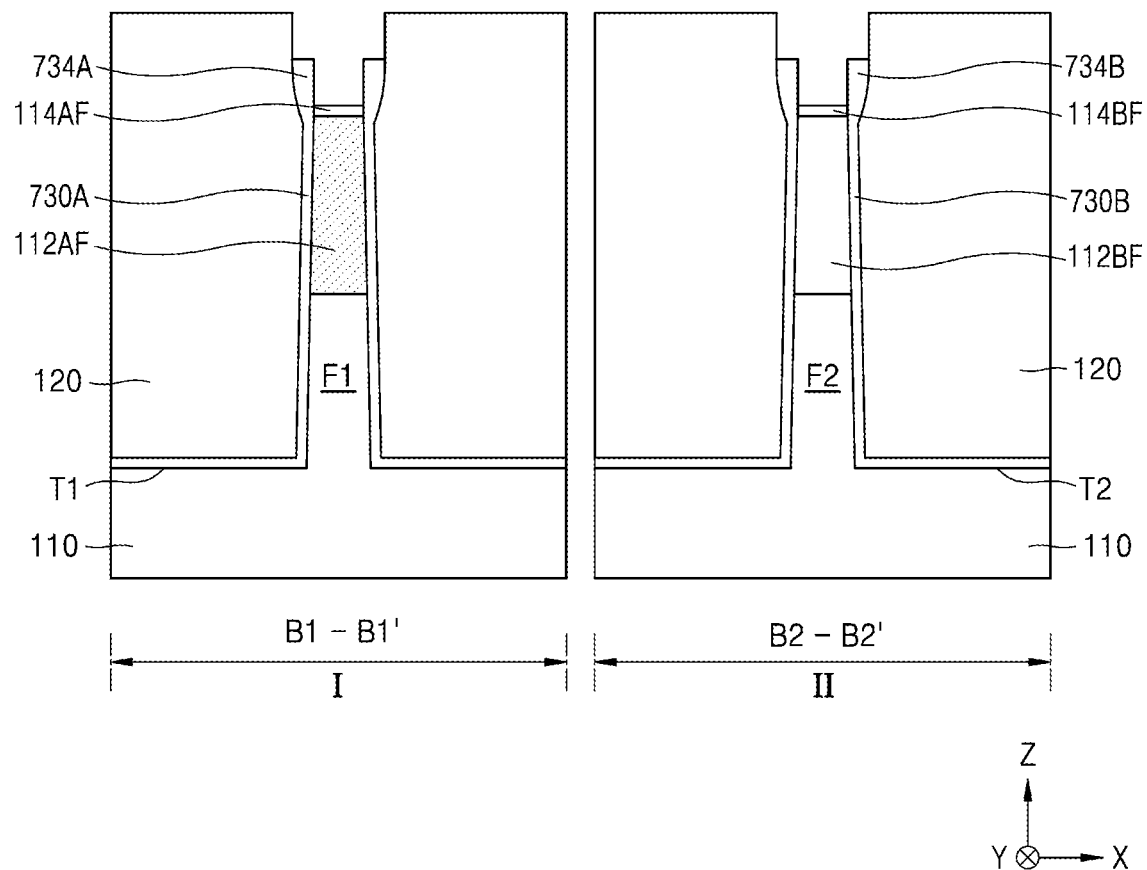

Referring to FIG. 7F, the mask patterns 710, the first amorphous semiconductor layer 732A, and the second amorphous semiconductor layer 732B are selectively removed from a result of FIG. 7E to expose the first upper liner area 114AF and the extended first crystalline semiconductor layer 734A in the first area I and expose the second upper liner area 114BF and the extended second crystalline semiconductor layer 734B in the second area II.

According to example embodiments of the inventive concept, an etching solution including $H_3PO_4$ may be used to selectively remove the silicon nitride layer patterns 714 of the mask patterns 710, the first amorphous semiconductor layer 732A, and the second amorphous semiconductor layer 732B, and an etching solution including diluted hydrofluoric acid (DHF) may be used to remove the pad oxide layer patterns 712 of the mask patterns 710, but types of the etching solutions are not limited thereto.

Figure 7G:
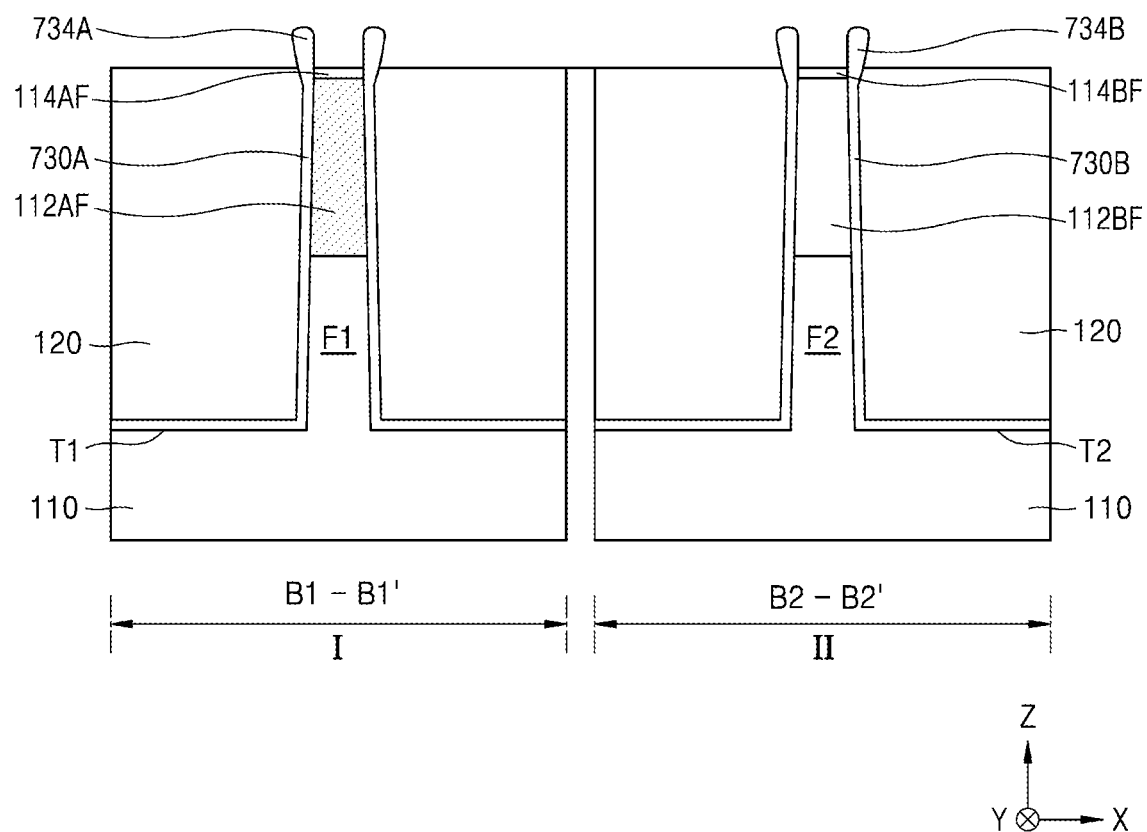

Referring to FIG. 7G, a partial recess process for removing a portion of the isolation layer 120 from a result of FIG. 7F is performed to make the extended first crystalline semiconductor layer 734A and the extended second crystalline semiconductor layer 734B protrude upwardly than an upper surface of the isolation layer 120, and then a size of each of the extended first crystalline semiconductor layer 734A and the extended second crystalline semiconductor layer 734B may be reduced using an etching solution for oxidation. In this case, an application time of the etching solution for oxidation may be adjusted to adjust, to a desired degree, the size of each of the extended first crystalline semiconductor layer 734A and the extended second crystalline semiconductor layer 734B. According to example embodiments of the inventive concept, an etching solution including ammonia ($NH_4OH$), hydrogen peroxide ($H_2O_2$), and water may be used as the etching solution for oxidation. In some embodiments, the sizes of the extended first crystalline semiconductor layer 734A and the extended second crystalline semiconductor layer 734B may be changed by adjusting the process time using the etching solution for oxidation.

According to example embodiments of the inventive concept, to remove a portion of the isolation layer 120 from the result of FIG. 7F by the partial recess process, a process similar to a recess process of the isolation layer 120, which is to be described below with reference to FIG. 7H, may be performed. According to example embodiments of the inventive concept, a process of reducing the size of each of the extended first crystalline semiconductor layer 734A and the extended second crystalline semiconductor layer 734B from the result of FIG. 7F by using the etching solution for oxidation may be performed without the partial recess process.

Figure 7H:
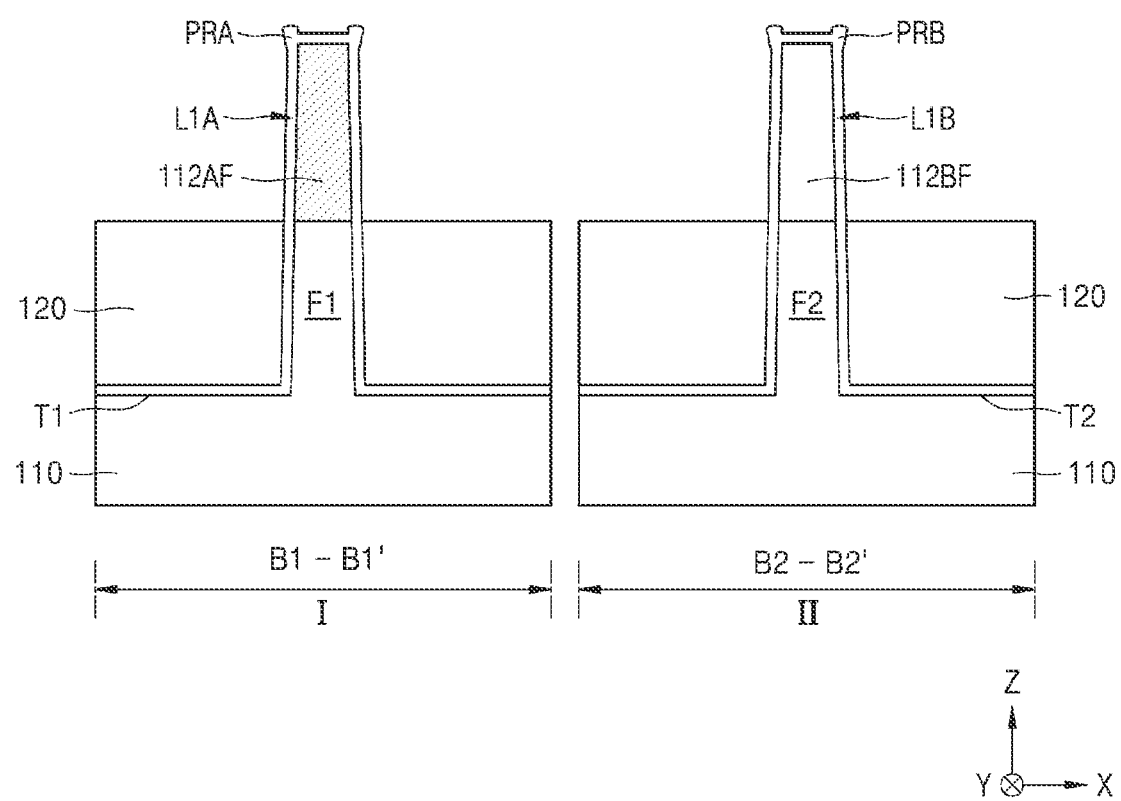

Referring to FIG. 7H, a recess process for removing a portion of the isolation layer 120 from a result of FIG. 7G is performed to expose a part of the first crystalline semiconductor layer 730A, which covers the first channel area 112AF, in the first area I and to expose a part of the second crystalline semiconductor layer 730B, which covers the second channel area 112BF, in the second area II.

As a result of removing a portion of the isolation layer 120 from the result of FIG. 7G, in the first and second areas I and II, a height of the upper surface of the isolation layer 120 decreases, and the first and second channel areas 112AF and 112BF and the first and second crystalline semiconductor layers 730A and 730B in the first and second fin-type active areas F1 and F2 may protrude upwardly than the isolation layer 120, respectively.

To perform the recess process of the isolation layer 120, a dry etching process, a wet etching process, or a dry and wet combined etching process may be used. In this case, a wet etching process using a tetramethyl ammonium hydroxide (TMAH) solution, a potassium hydroxide (KOH) solution, or the like as an etchant or a dry etching process such as an inductively coupled plasma (ICP) process, a transformer coupled plasma (TCP) process, an electron cyclotron resonance (ECR) process, or a reactive ion etch (RIE) process may be used. When the recess process of the isolation layer 120 is performed using a dry etching process, fluorine-containing gas such as carbon tetrafluoride ($CF_4$), chlorine-containing gas such as chlorine ($Cl_2$), or hydrogen bromide (HBr) may be used as etching gas.

While performing the recess process of the isolation layer 120, a portion of each of the extended first crystalline semiconductor layer 734A and the extended second crystalline semiconductor layer 734B remaining on the result of FIG. 7G may be consumed or modified, thereby further decreasing the size of each of the extended first crystalline semiconductor layer 734A and the extended second crystalline semiconductor layer 734B. After performing the recess process of the isolation layer 120, the first crystalline semiconductor layer 730A, the extended first crystalline semiconductor layer 734A, and the first upper liner area 114AF covering the surface of the first fin-type active area F1 in the first area I may remain as the first semiconductor liner L1A. In addition, the second crystalline semiconductor layer 730B, the extended second crystalline semiconductor layer 734B, and the second upper liner area 114BF covering the surface of the second fin-type active area F2 in the second area II may remain as the second semiconductor liner L1B. The first semiconductor liner L1A may include the first protrusion part PRA protruding outward from the first fin-type active area F1 in the vicinity of an edge of the upper surface of the first fin-type active area F1. The second semiconductor liner L1B may include the second protrusion part PRB protruding outward from the second fin-type active area F2 in the vicinity of an edge of the upper surface of the second fin-type active area F2.

While performing the recess process of the isolation layer 120, the first crystalline semiconductor layer 730A, the extended first crystalline semiconductor layer 734A, and the first upper liner area 114AF covering the surface of the first fin-type active area F1 in the first area I and the second crystalline semiconductor layer 730B, the extended second crystalline semiconductor layer 734B, and the second upper liner area 114BF covering the surface of the second fin-type active area F2 in the second area II may protect the first and second channels 112AF and 112BF so as not to be oxidized or consumed. Therefore, while performing the recess process of the isolation layer 120, a decrease in an upper CD of each of the first and second fin-type active areas F1 and F2 may be reduced or prevented.

Figure 7I:
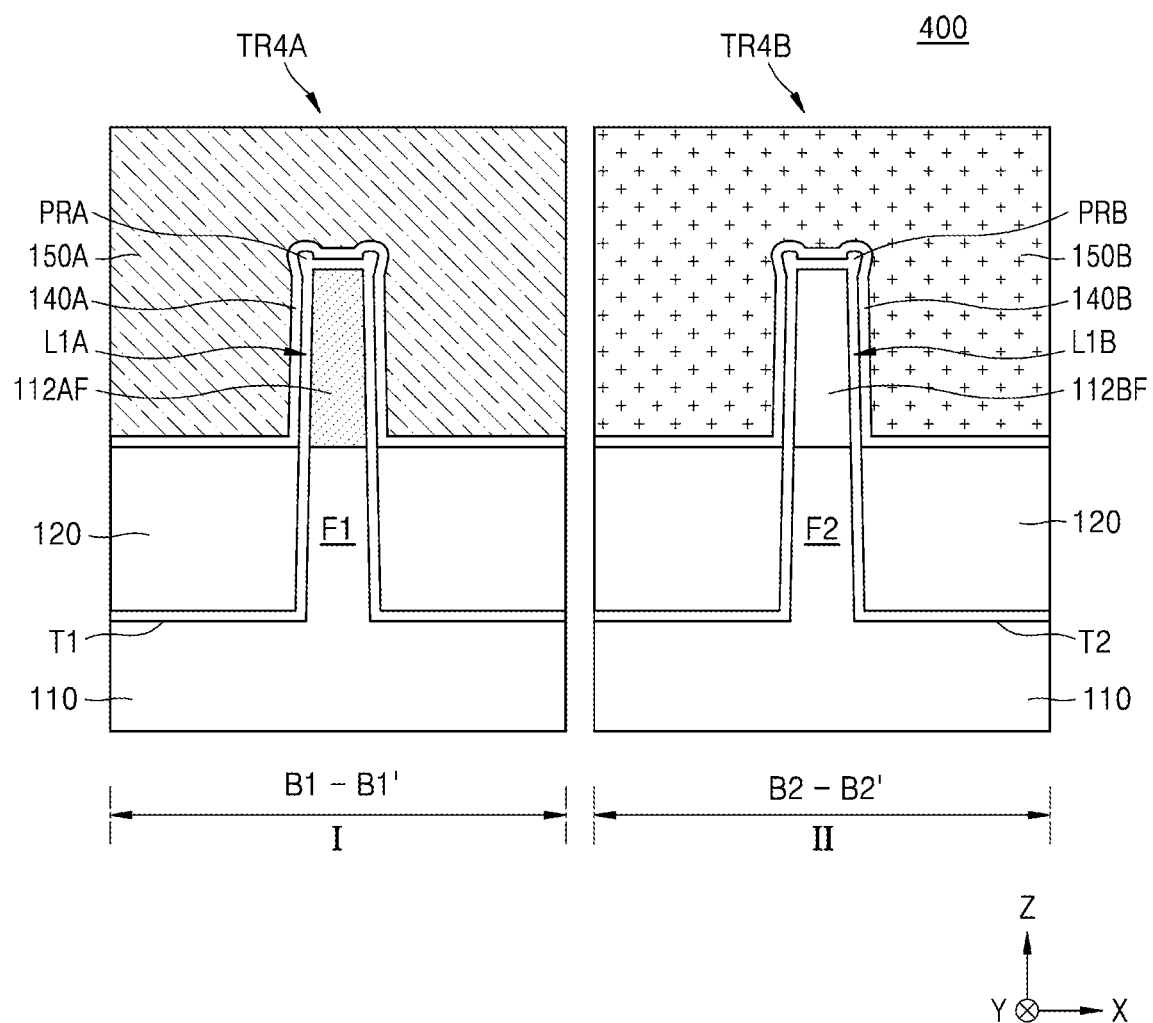

Referring to FIG. 7I, the integrated circuit device 400 shown in FIGS. 4A and 4B may be manufactured by sequentially forming the first and second gate insulating layers 140A and 140B and the first and second gate lines 150A and 150B on the exposed first and second semiconductor liners L1A and L1B in the first and second areas I and II, respectively.

According to example embodiments of the inventive concept, to form the first and second gate insulating layers 140A and 140B and the first and second gate lines 150A and 150B, a plurality of dummy gate patterns and a plurality of insulation spacers covering respective side walls of the plurality of dummy gate patterns may be formed in the first and second areas I and II, then the first and second source/drain areas 162A and 162B (see FIG. 4A) may be formed at both sides of each of the plurality of dummy gate patterns, then the plurality of dummy gate patterns may be removed, and the first and second gate insulating layers 140A and 140B and the first and second gate lines 150A and 150B may be formed in a space remaining as the removal result. The plurality of dummy gate patterns may include polysilicon.

According to the method of manufacturing the integrated circuit device 400, which has been described with reference to FIGS. 7A to 7I, the first and second transistors TR4A and TR4B including the first and second semiconductor liners L1A and L1B being in contact with the surfaces of the first and second fin-type active areas F1 and F2 in the first and second areas I and II, respectively, may be formed by a simplified process. In particular, in the process of forming the first and second transistors TR4A and TR4B, the first and second channel areas 112AF and 112BF may be protected by the first crystalline semiconductor layer 730A, the extended first crystalline semiconductor layer 734A, and the first upper liner area 114AF covering the surface of the first fin-type active area F1 and the first upper liner area 114AF obtained therefrom in the first area I and the second crystalline semiconductor layer 730B, the extended second crystalline semiconductor layer 734B, and the second upper liner area 114BF covering the surface of the second fin-type active area F2 and the second upper liner area 114BF obtained therefrom in the second area II, thereby reducing or preventing a decrease in a CD of each of the first and second channel areas 112AF and 112BF. Therefore, an increase in a difference between an upper CD and a lower CD of each of the first and second fin-type active areas F1 and F2 may be reduced or prevented, and an area of a channel area of each of the first and second transistors TR4A and TR4B respectively including the first and second fin-type active areas F1 and F2 and the first and second semiconductor liners L1A and L1B may increase, thereby manufacturing the first and second transistors TR4A and TR4B having improved performances.

FIGS. 8A to 8G are cross-sectional views illustrating a method of manufacturing an integrated circuit device according to example embodiments of the inventive concept. A method of manufacturing the integrated circuit device 400 shown in FIGS. 4A and 4B is described with reference to FIGS. 8A to 8G. In FIGS. 8A to 8G, like reference numerals in FIGS. 1A to 7I denote like elements, and thus their repetitive description may be omitted herein.

Figure 8A:
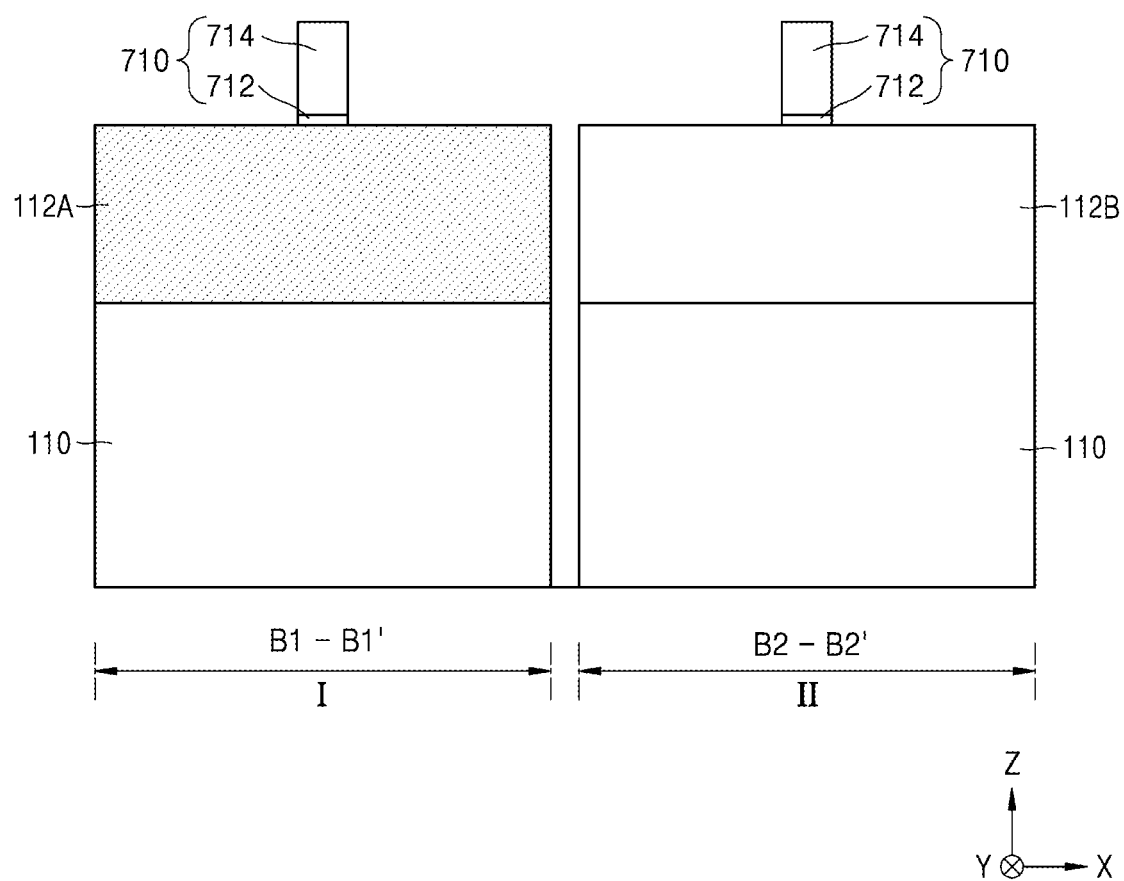
FIGS. 8A to 8G are cross-sectional views illustrating a method of manufacturing an integrated circuit device according to example embodiments of the inventive concept.

Referring to FIG. 8A, by a similar method to that described with reference to FIG. 7A, in the first area I, the first semiconductor layer 112A is formed on the substrate 110, and in the second area II, the second semiconductor layer 112B is formed on the substrate 110. Unlike the process described with reference to FIG. 7A, a process of forming the first upper semiconductor layer 114A and the second upper semiconductor layer 114B is omitted. Thereafter, the mask patterns 710 are respectively formed on the first semiconductor layer 112A and the second semiconductor layer 112B.

Figure 8B:
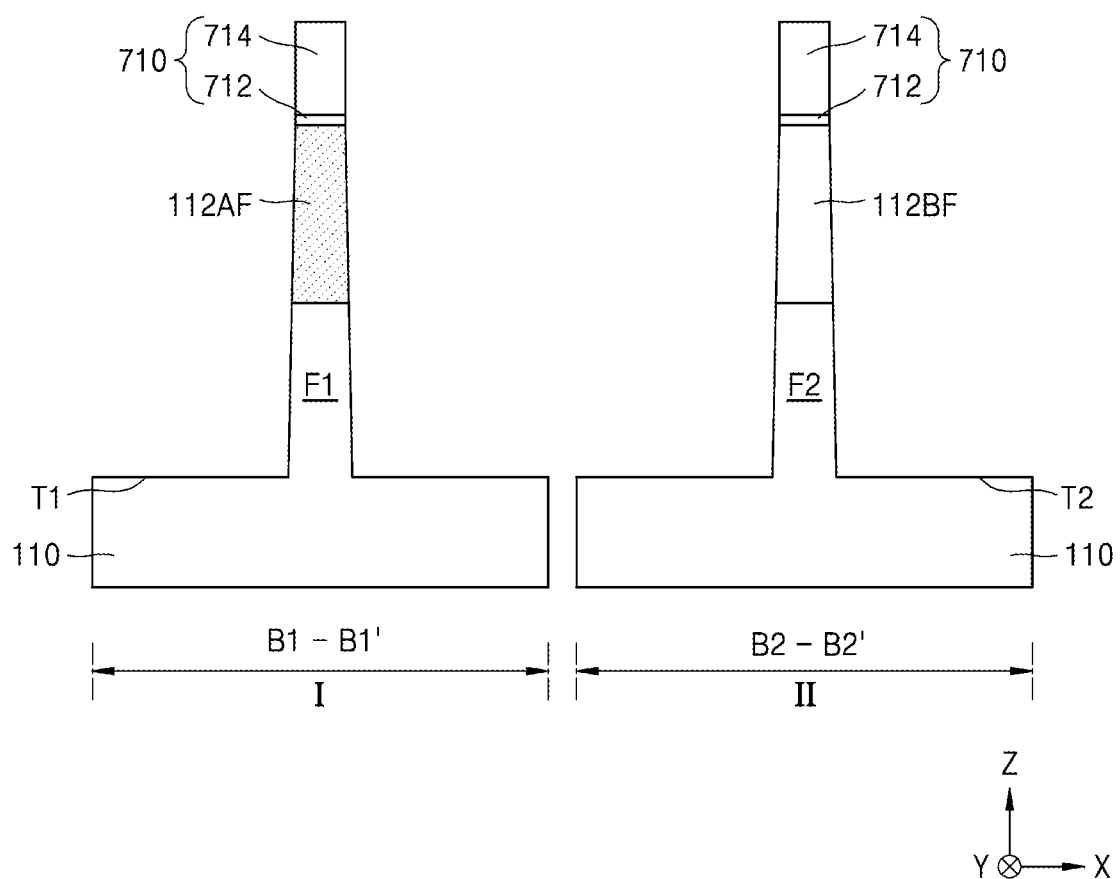

Referring to FIG. 8B, by a similar method to that described with reference to FIG. 7B, by using the mask patterns 710 in a result of FIG. 8A as an etching mask to etch portions of the first semiconductor layer 112A, the second semiconductor layer 112B, and the substrate 110 in the first and second areas I and II, the first trench T1 and the first fin-type active area F1 are formed in the first area I, and the second trench T2 and the second fin-type active area F2 are formed in the second area II. The first fin-type active area F1 includes the first channel area 112AF that is a portion of the substrate 110 and a portion of the first semiconductor layer 112A, and the second fin-type active area F2 includes the second channel area 112BF that is another portion of the substrate 110 and a portion of the second semiconductor layer 112B.

Figure 8C:
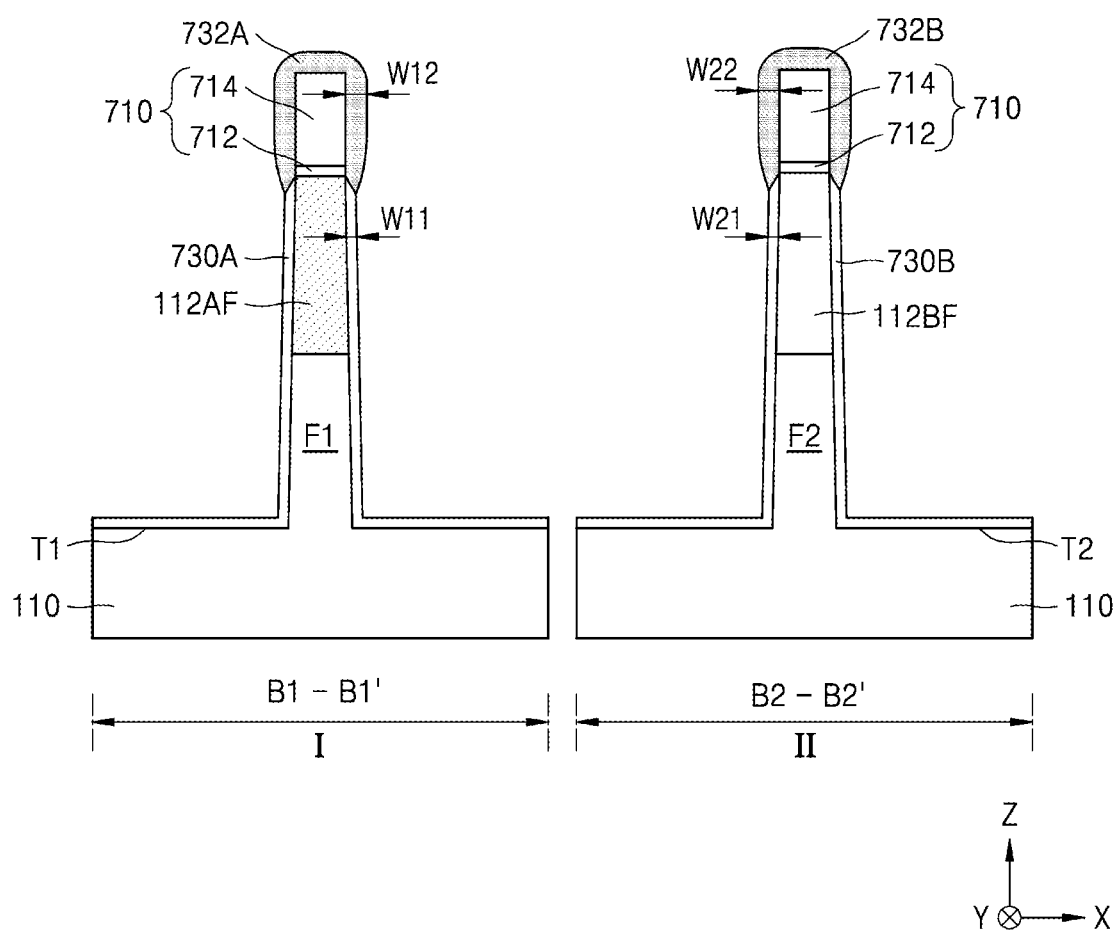

Referring to FIG. 8C, by a similar method to that described with reference to FIG. 7C, semiconductor layers are grown from exposed surfaces of the first and second fin-type active areas F1 and F2 and the mask patterns 710 in the first and second areas I and II, respectively, to form the first crystalline semiconductor layer 730A covering surfaces of the first fin-type active area F1 and the first amorphous semiconductor layer 732A covering surfaces of the mask pattern 710 in the first area I and to form the second crystalline semiconductor layer 730B covering surfaces of the second fin-type active area F2 and the second amorphous semiconductor layer 732B covering surfaces of the mask pattern 710 in the second area II.

Figure 8D:
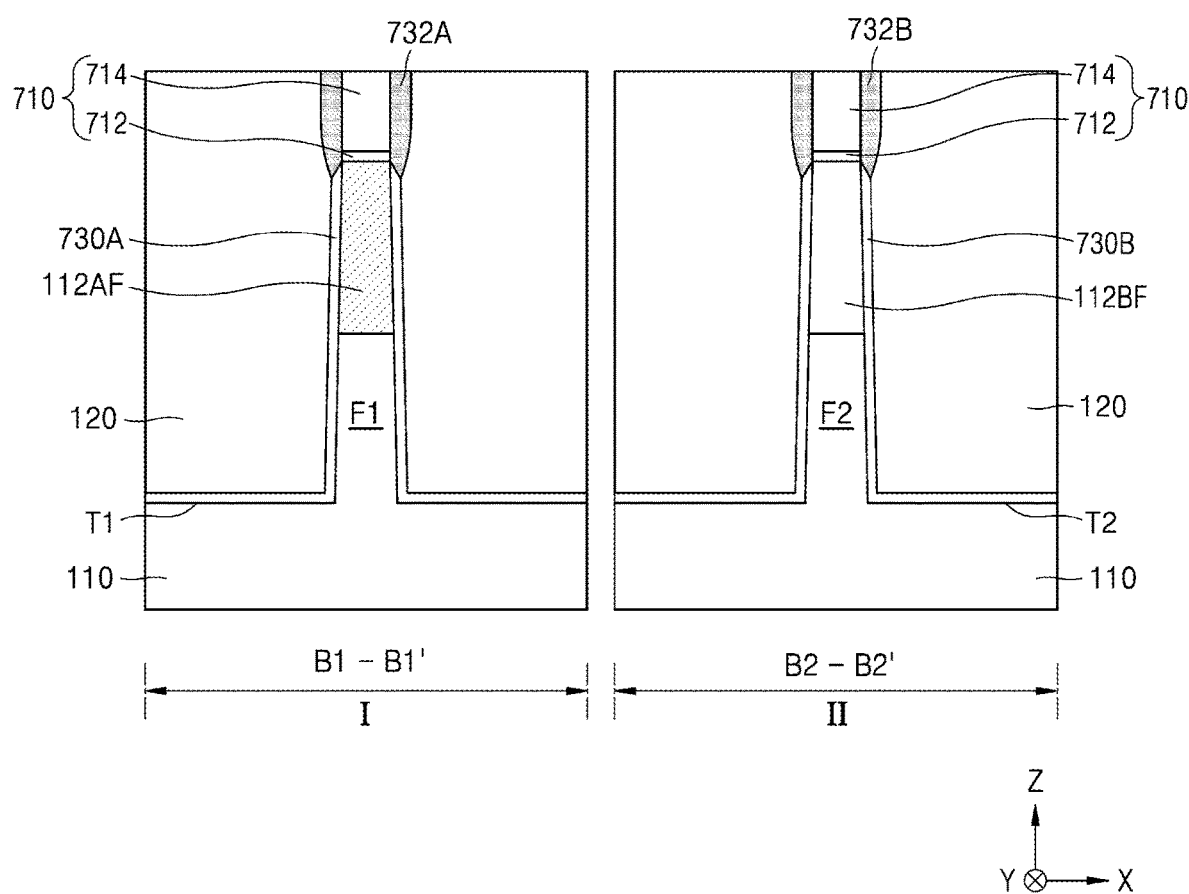

Referring to FIG. 8D, by a similar method to that described with reference to FIG. 7D, the isolation layer 120 is formed in the first and second areas I and II, and the upper surfaces of the mask patterns 710 may be exposed by planarizing a result obtained by forming the isolation layer 120.

Figure 8E:
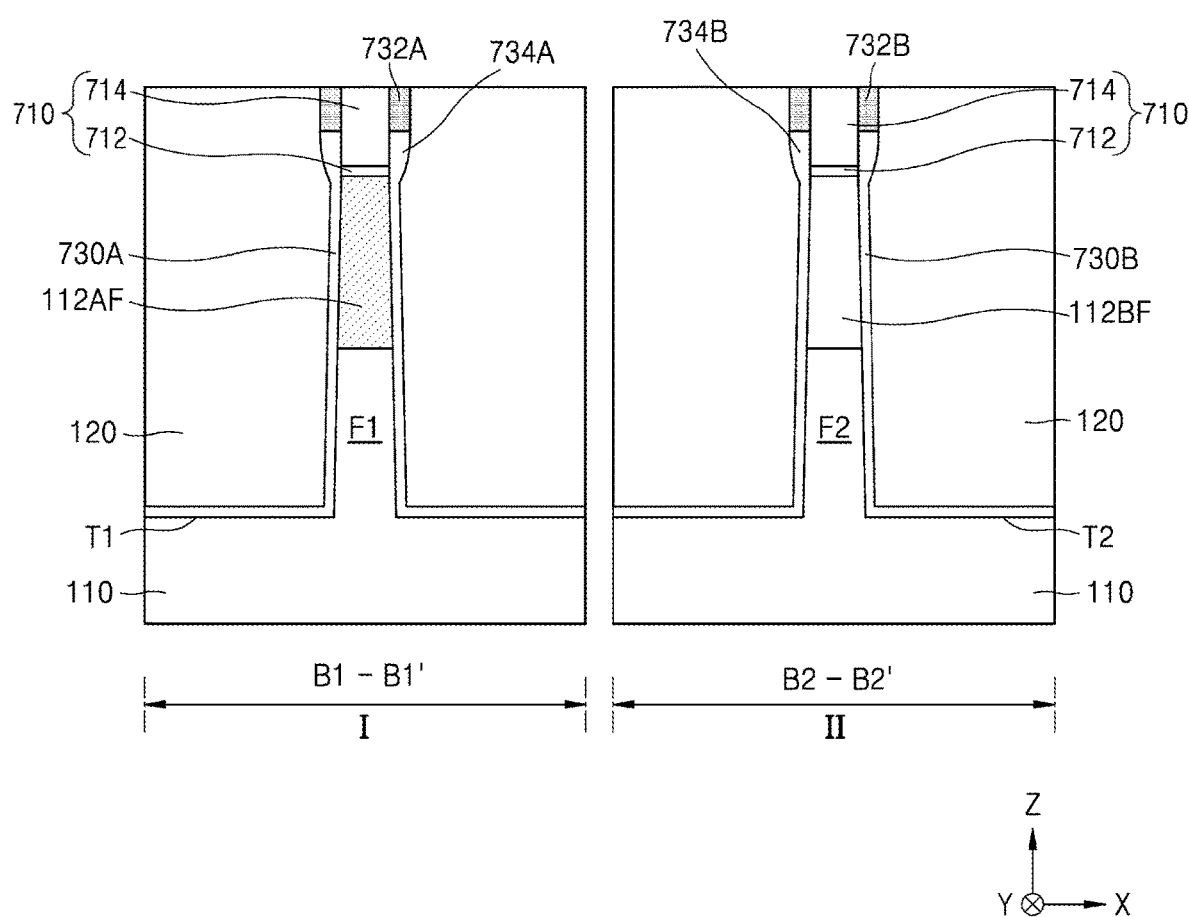

Referring to FIG. 8E, by a similar method to that described with reference to FIG. 7E, by annealing a result of FIG. 8D, the extended first crystalline semiconductor layer 734A is formed in the first area I, and the extended second crystalline semiconductor layer 734B is formed in the second area II.

Figure 8F:
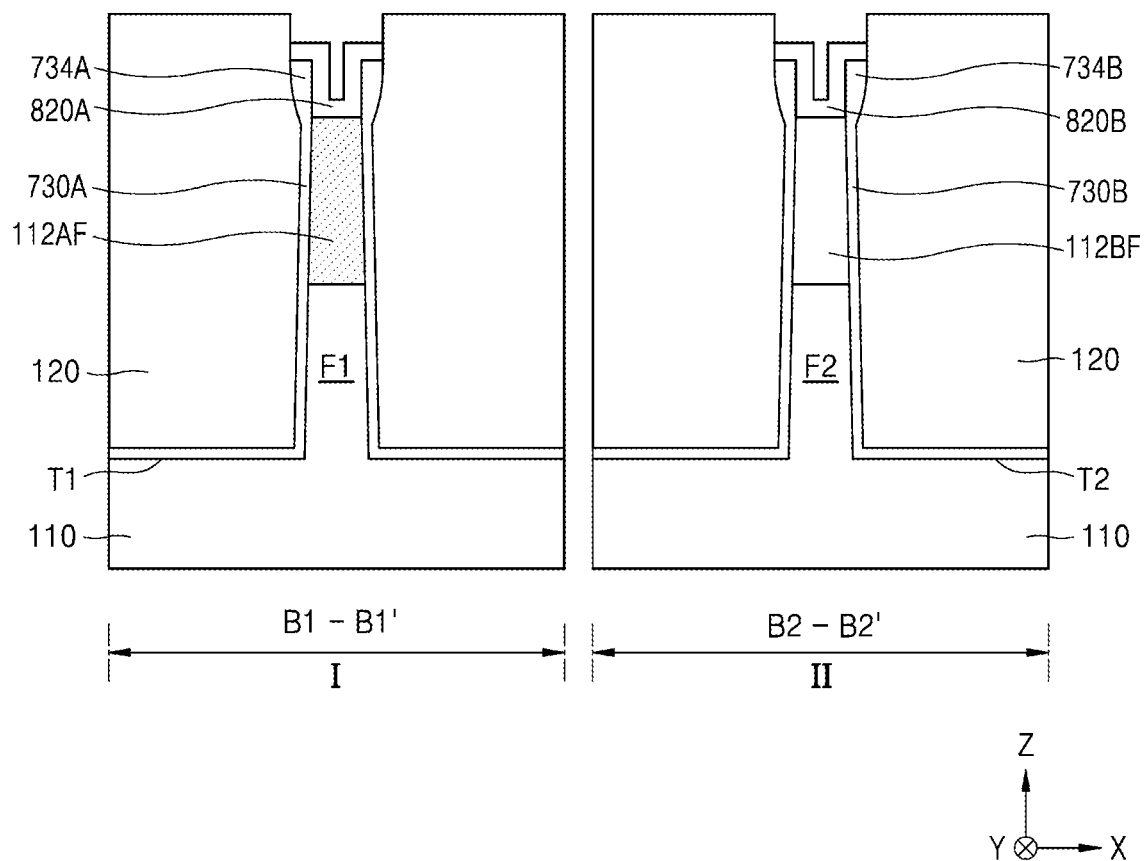

Referring to FIG. 8F, by a similar method to that described with reference to FIG. 7F, the mask patterns 710, the first amorphous semiconductor layer 732A, and the second amorphous semiconductor layer 732B are selectively removed from a result of FIG. 8E to expose the extended first crystalline semiconductor layer 734A and an upper surface of the first channel area 112AF in the first area I and to expose the extended second crystalline semiconductor layer 734B and an upper surface of the second channel area 112BF in the second area II.

Thereafter, by using a selective epitaxy process, a first upper semiconductor layer 820A covering respective exposed surfaces of the first channel area 112AF and the extended first crystalline semiconductor layer 734A in the first area I and a second upper semiconductor layer 820B covering respective exposed surfaces of the second channel area 112BF and the extended second crystalline semiconductor layer 734B in the second area II are formed. According to example embodiments of the inventive concept, each of the first upper semiconductor layer 820A and the second upper semiconductor layer 820B may include an undoped Si layer. According to example embodiments of the inventive concept, each of the first upper semiconductor layer 820A and the second upper semiconductor layer 820B may include a doped Si layer.

Figure 8G:
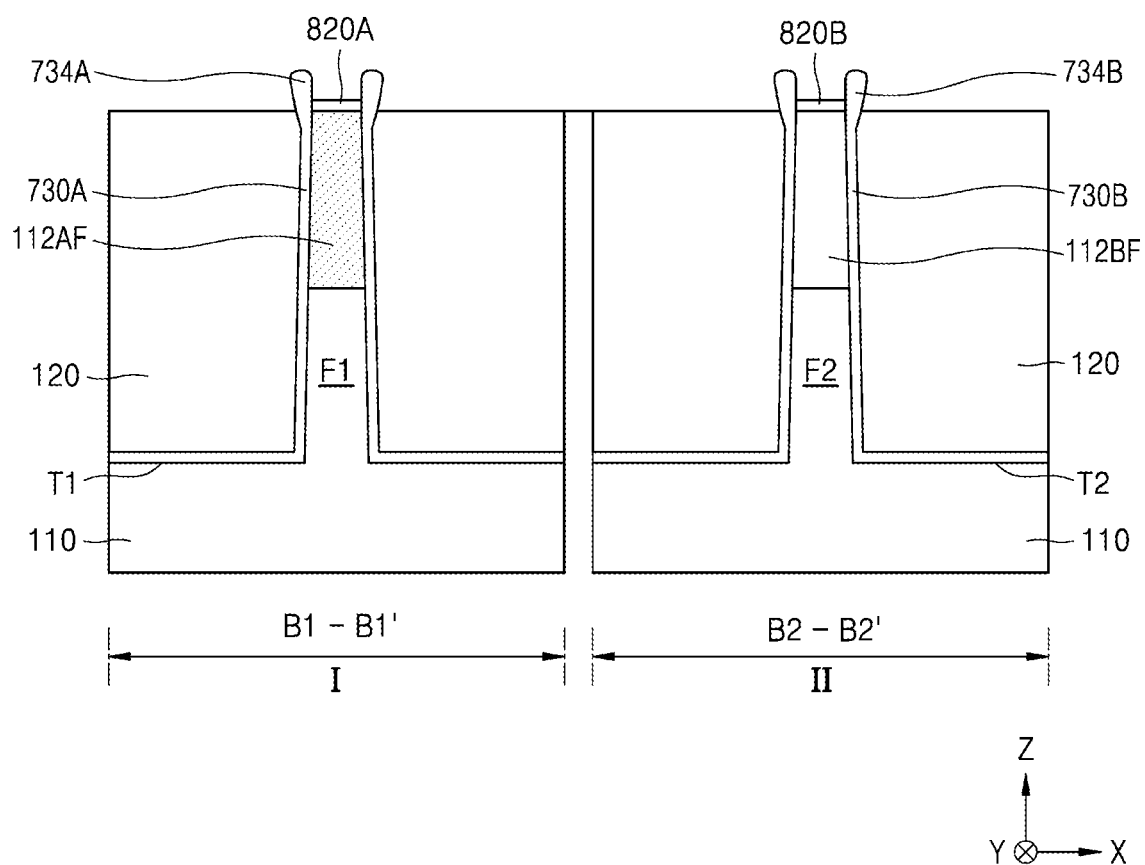

Referring to FIG. 8G, by a similar method to that described with reference to FIG. 7G, a partial recess process for removing a portion of the isolation layer 120 from a result of FIG. 8F, then a portion of each of the first upper semiconductor layer 820A and the second upper semiconductor layer 820B is removed, and a size of each of the extended first crystalline semiconductor layer 734A and the extended second crystalline semiconductor layer 734B is decreased to adjust the size of each of the extended first crystalline semiconductor layer 734A and the extended second crystalline semiconductor layer 734B. Parts remaining by removing the portions of the first and second upper semiconductor layers 820A and 820B may cover upper surfaces of the first and second crystalline semiconductor layers 730A and 730B, respectively.

Thereafter, the processes described with reference to FIGS. 7H to 7I may be performed. The first crystalline semiconductor layer 730A, the extended first crystalline semiconductor layer 734A, and the first upper semiconductor layer 820A covering the surface of the first fin-type active area F1 in the first area I may remain as the first semiconductor liner L1A. In addition, the second crystalline semiconductor layer 730B, the extended second crystalline semiconductor layer 734B, and the second upper semiconductor layer 820B covering the surface of the second fin-type active area F2 in the second area II may remain as the second semiconductor liner L1B.

According to example embodiments of the inventive concept, in the method of manufacturing an integrated circuit device, which has been described with reference to FIGS. 8A to 8G, after performing the process of FIG. 8E, the process described with reference to FIG. 8G may be performed by omitting the process of the first upper semiconductor layer 820A and the second upper semiconductor layer 820B, which has been described with reference to FIG. 8G. In this case, a semiconductor liner which has a similar structure to that of the semiconductor liner L1 having the protrusion part PR1 shown in FIGS. 1B and 1C but does not cover the upper surface of the fin-type active area FA may be obtained.

Figure 9A:
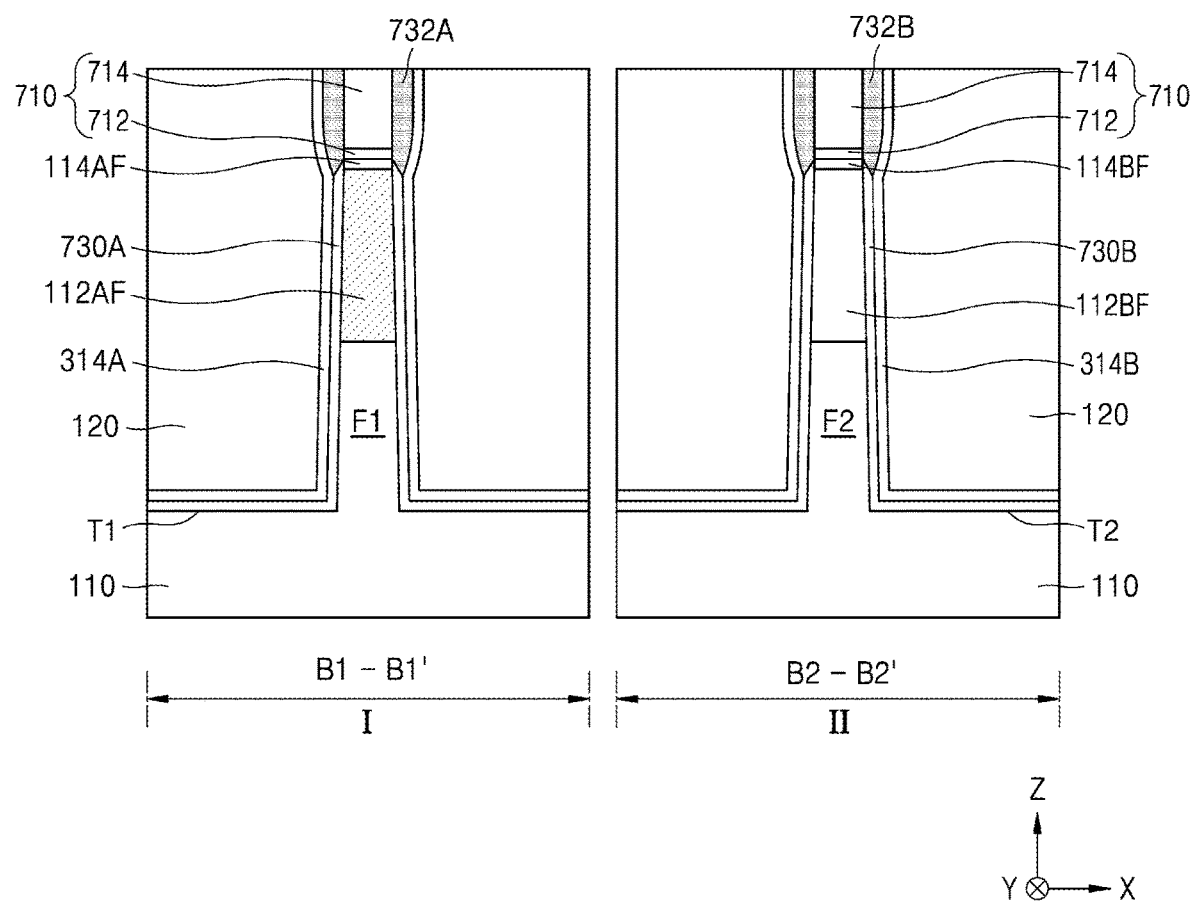
FIGS. 9A and 9B are cross-sectional views illustrating a method of manufacturing an integrated circuit device according to example embodiments of the inventive concept.
Figure 9B:
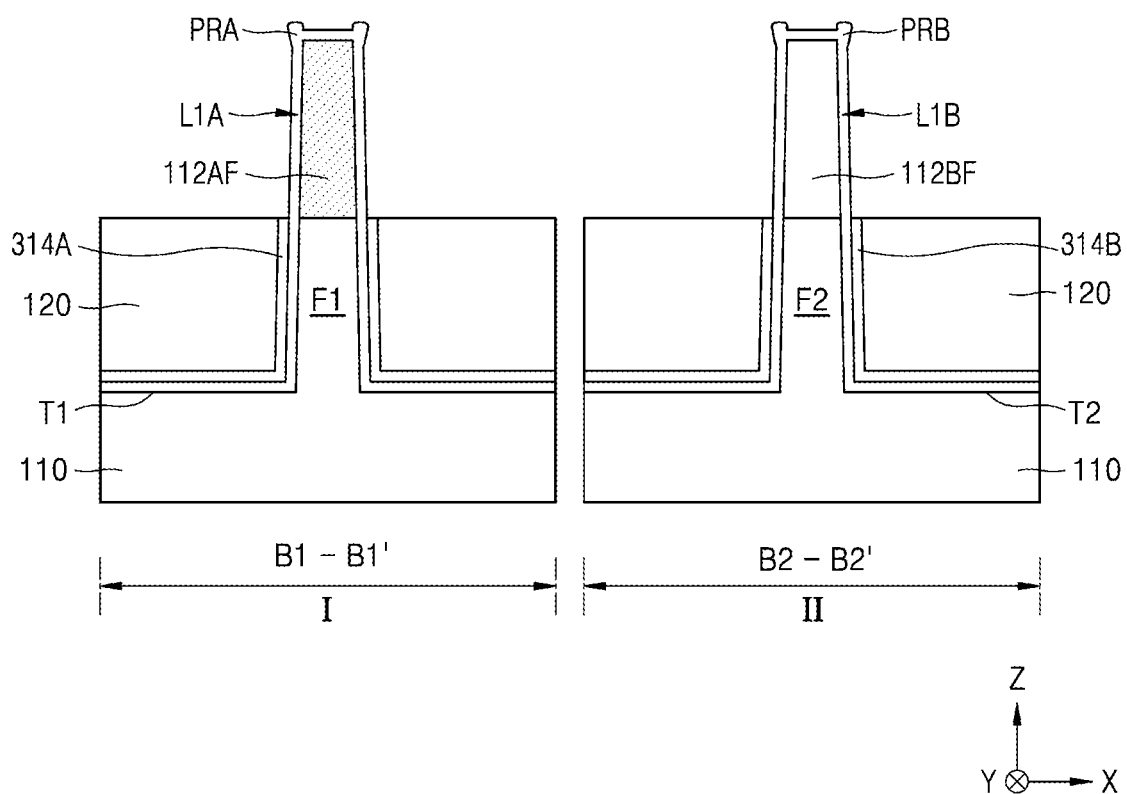

FIGS. 9A and 9B are cross-sectional views illustrating a method of manufacturing an integrated circuit device according to example embodiments of the inventive concept. A method of manufacturing the integrated circuit device 500 shown in FIG. 5 is described with reference to FIGS. 9A and 9B. In FIGS. 9A and 9B, like reference numerals in FIGS. 1A to 7I denote like elements, and thus their repetitive description may be omitted herein.

Referring to FIG. 9A, after performing the processes described with reference to FIGS. 7A to 7C, the first insulation liner 314A conformally covering the first crystalline semiconductor layer 730A and the first amorphous semiconductor layer 732A is formed in the first area I, and the second insulation liner 314B conformally covering the second crystalline semiconductor layer 730B and the second amorphous semiconductor layer 732B is formed in the second area II. When the first insulation liner 314A and the second insulation liner 314B include the same material, the first insulation liner 314A and the second insulation liner 314B may be formed at the same time. When the first insulation liner 314A and the second insulation liner 314B include different materials, the first insulation liner 314A and the second insulation liner 314B may be formed in separate processes. Thereafter, by a similar method to that described with reference to FIG. 7D, the isolation layer 120 is formed on the first insulation liner 314A and the second insulation liner 314B, and upper surfaces of the mask patterns 710 are exposed by planarizing a result obtained by forming the isolation layer 120.

Referring to FIG. 9B, by performing similar processes to those described with reference to FIGS. 7E to 7H on a result of FIG. 9A, respective heights of the isolation layer 120, the first insulation liner 314A, and the second insulation liner 314B are decreased to make portions of the first and second channel areas 112AF and 112BF of the first and second fin-type active areas F1 and F2 and the first and second crystalline semiconductor layers 730A and 730B protrude upwardly than the upper surfaces of the isolation layer 120, the first insulation liner 314A, and the second insulation liner 314B, respectively.

Thereafter, the integrated circuit device 500 shown in FIG. 5 may be manufactured by performing the process described with reference to FIG. 7I on a result of FIG. 9B.

While the methods of manufacturing the integrated circuit device 400 shown in FIGS. 4A and 4B and the integrated circuit device 500 shown in FIG. 5 have been described with reference to FIGS. 7A to 7I, 8A to 8G, 9A, and 9B, integrated circuit devices having various structures illustrated in the specification may be easily manufactured by using various methods modified and changed from the described methods within the scope of the inventive concept.

For example, to manufacture the integrated circuit device 100 shown in FIGS. 1A to 1C, the processes for the first area I or the second area II in the method described with reference to FIGS. 7A to 7I may be used.

To manufacture the integrated circuit device 200 shown in FIG. 2, the time for which the extended first crystalline semiconductor layer 734A and the second crystalline semiconductor layer 734B are exposed to an etching solution for oxidation in the process described with reference to FIG. 7G may be adjusted to decrease sizes of the extended first crystalline semiconductor layer 734A and the second crystalline semiconductor layer 734B by a desired size. Thereafter, as in the process described with reference to FIG. 7H, a recess process of the isolation layer 120 may be performed to form the semiconductor liner L2 including the protrusion part PR2 as shown in FIG. 2.

To manufacture the integrated circuit device 300 shown in FIG. 3, the processes for the first area I or the second area II in the method described with reference to FIGS. 9A and 9B may be used.

FIGS. 10A to 17B are cross-sectional views illustrating a method of manufacturing an integrated circuit device according to example embodiments of the inventive concept. The method of manufacturing the integrated circuit device 900 shown in FIGS. 6A to 6C is described with reference to FIGS. 10A to 17B. In FIGS. 10A to 17B, FIGS. 10A, 11A, 12A, 13A, 14A, 15A, 16A, and 17A are cross-sectional views taken along line X-X' of FIG. 6A, and FIGS. 10B, 11B, 12B, 13B, 14B, 15B, 16B, and 17B are cross-sectional views taken along line Y-Y' of FIG. 6A In FIGS. 10A to 17B, like reference numerals in FIGS. 1A to 6C denote like elements, and thus their repetitive description may be omitted herein.

Figure 10A:
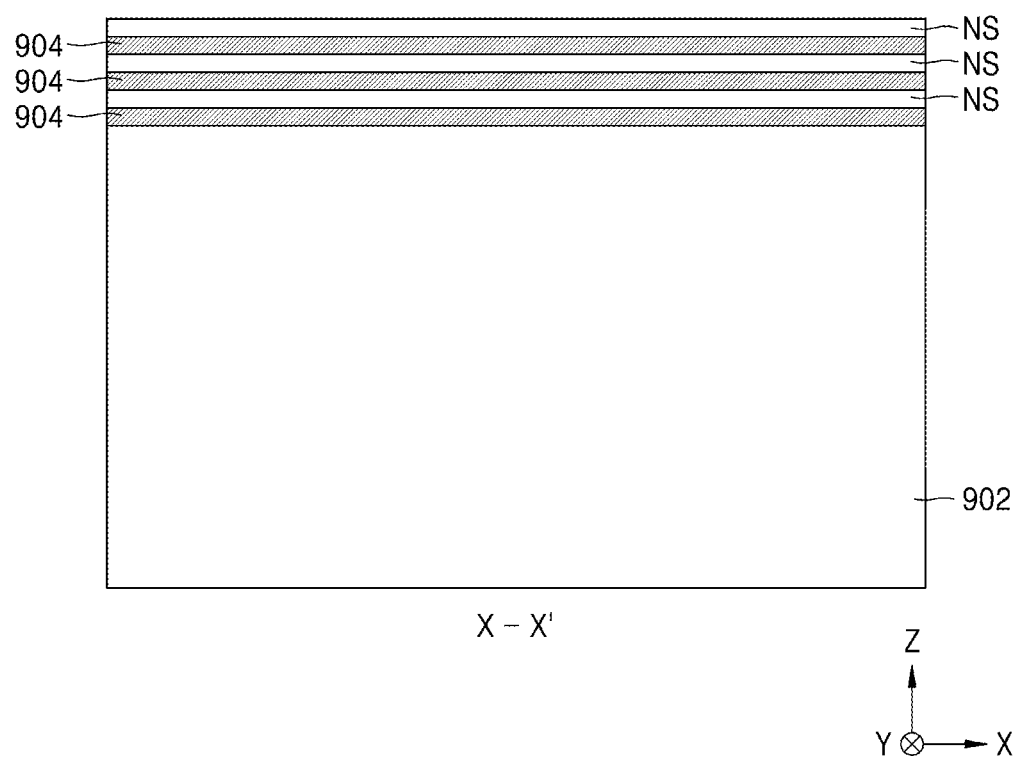
Figure 10B:
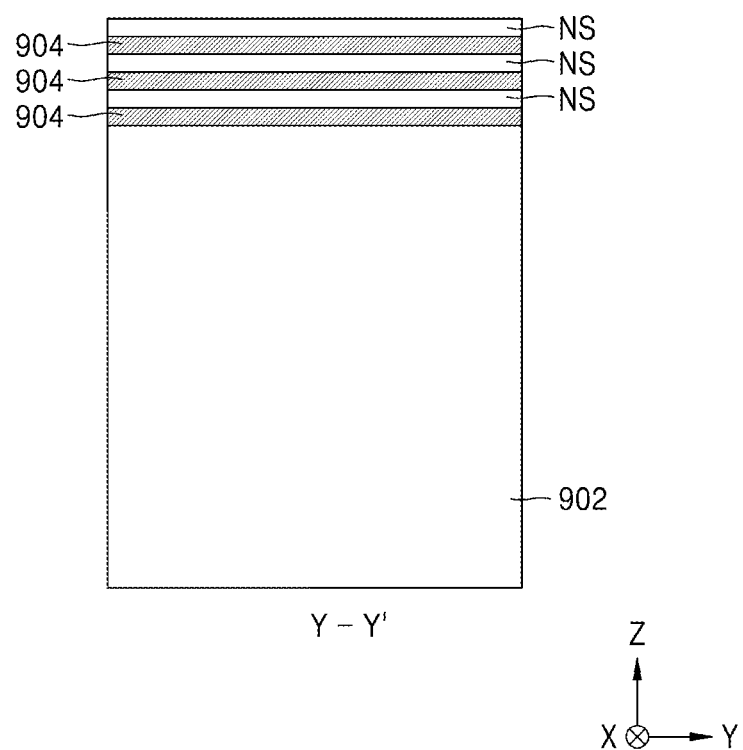

Referring to FIGS. 10A and 10B, a plurality of sacrificial semiconductor layers 904 and a plurality of nanosheet semiconductor layers NS are alternately stacked on the substrate 902 one layer by one layer.

The plurality of sacrificial semiconductor layers 904 and the plurality of nanosheet semiconductor layers NS may include different semiconductor materials. According to example embodiments of the inventive concept, the plurality of sacrificial semiconductor layers 904 may include, for example, SiGe, and the plurality of nanosheet semiconductor layers NS may include, for example, Si.

Figure 11A:
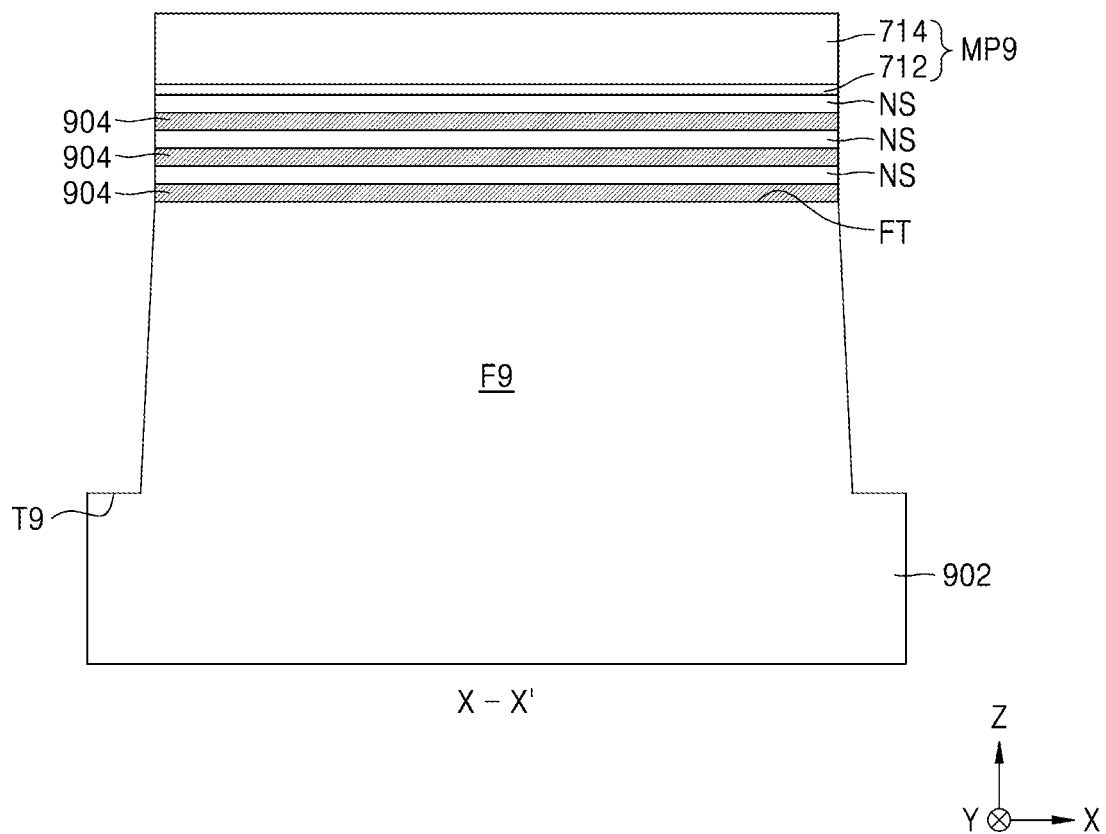
Figure 11B:
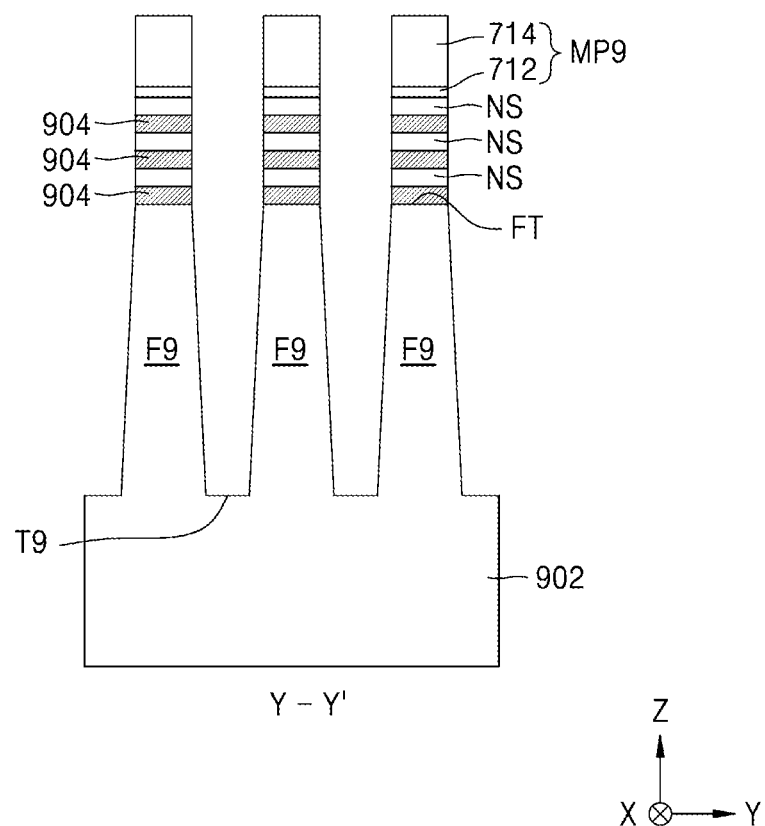

Referring to FIGS. 11A and 11B, a mask pattern MP9 is formed on a stacked structure of the plurality of sacrificial semiconductor layers 904 and the plurality of nanosheet semiconductor layers NS, and the trench T9 is formed by using the mask pattern MP9 as an etching mask to etch portions of the plurality of sacrificial semiconductor layers 904, the plurality of nanosheet semiconductor layers NS, and the substrate 902. As a result, the fin-type active areas F9 defined by the trench T9 are formed The stacked structure of the plurality of sacrificial semiconductor layers 904 and the plurality of nanosheet semiconductor layers NS remains on the upper surface FT of the fin-type active area F9.

Each of the mask pattern MP9 and the fin-type active area F9 may have a line shape extending in the X direction. The mask pattern MP9 may include a stacked structure of the pad oxide layer pattern 712 and the silicon nitride layer pattern 714.

Figure 12A:
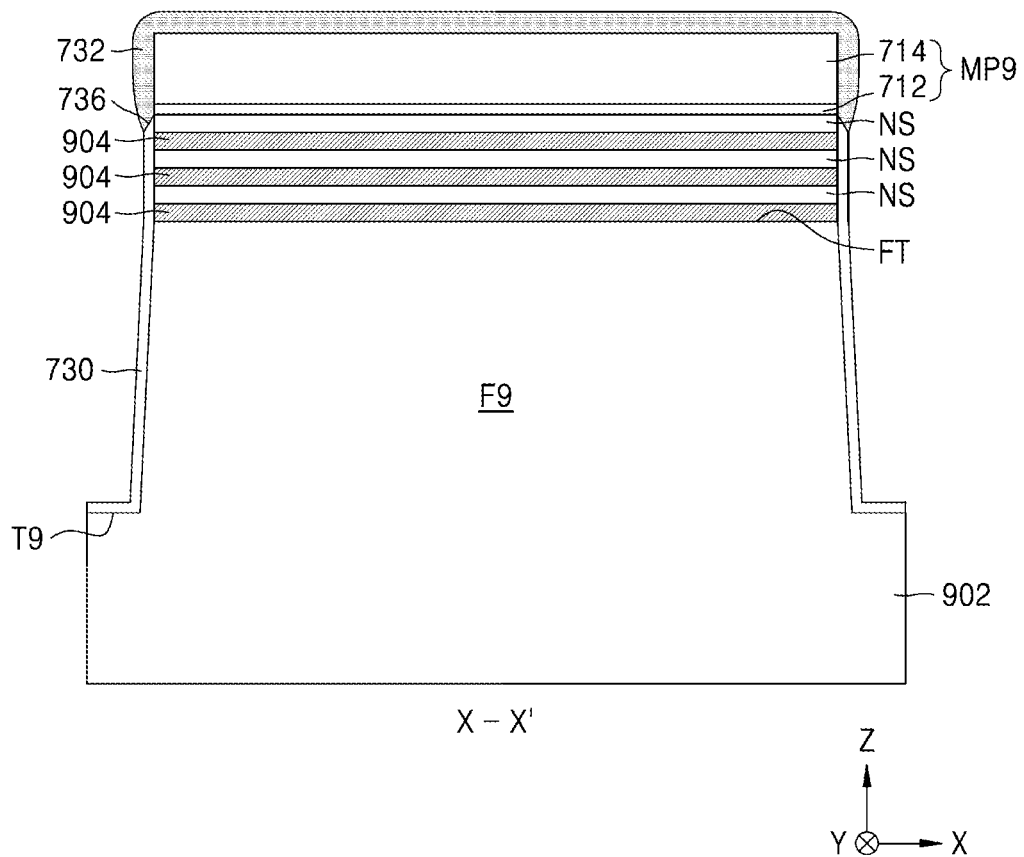
Figure 12B:
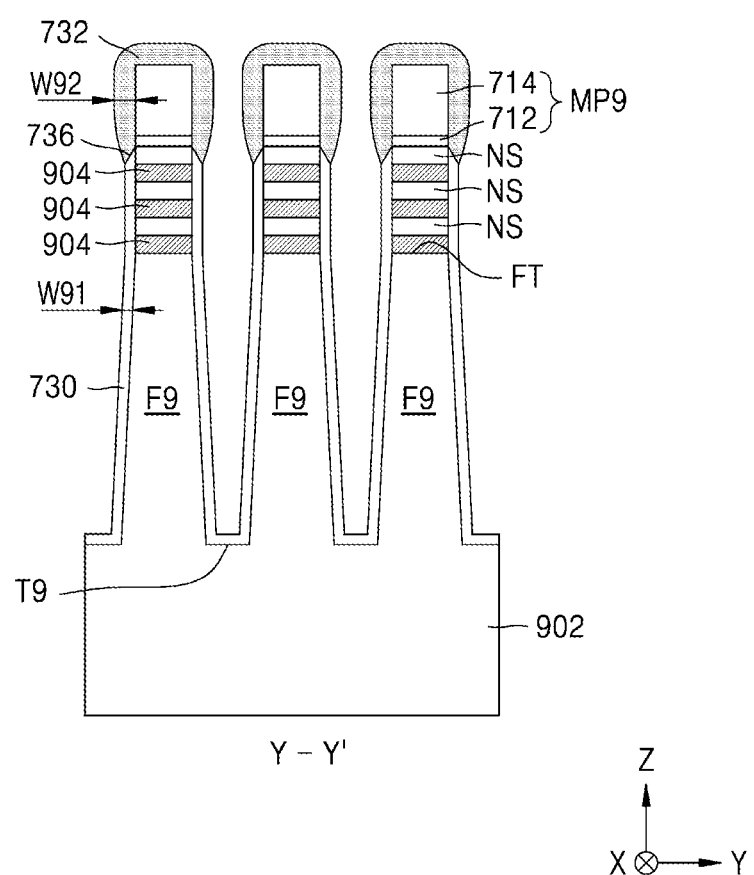

Referring to FIGS. 12A and 12B, by a similar method to the method of forming the first and second crystalline semiconductor layers 730A and 730B and the first and second amorphous semiconductor layers 732A and 732B, which has been described with reference to FIG. 7C, a crystalline semiconductor layer 730 covering surfaces of each of the fin-type active area F9, the plurality of sacrificial semiconductor layers 904, and the plurality of nanosheet semiconductor layers NS and an amorphous semiconductor layer 732 covering surfaces of the mask pattern MP9 are formed from a result of FIGS. 11A and 11B. An interface 736 may exist between the crystalline semiconductor layer 730 and the amorphous semiconductor layer 732. According to example embodiments of the inventive concept, each of the crystalline semiconductor layer 730 and the amorphous semiconductor layer 732 may include an undoped Si layer. According to some example embodiments of the inventive concept, each of the crystalline semiconductor layer 730 and the amorphous semiconductor layer 732 may include a doped Si layer. A growth rate of the amorphous semiconductor layer 732 may be greater than a growth rate of the crystalline semiconductor layer 730. Therefore, a thickness W92 of the amorphous semiconductor layer 732 may be greater than a thickness W91 of the crystalline semiconductor layer 730.

Figure 13A:
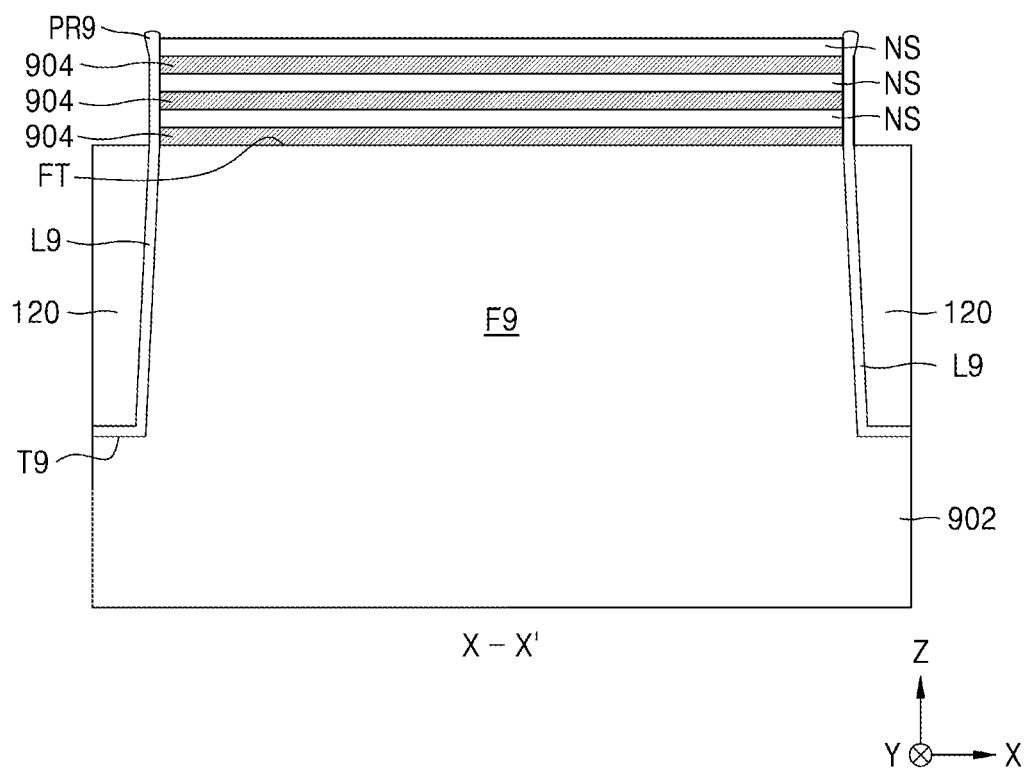
Figure 13B:
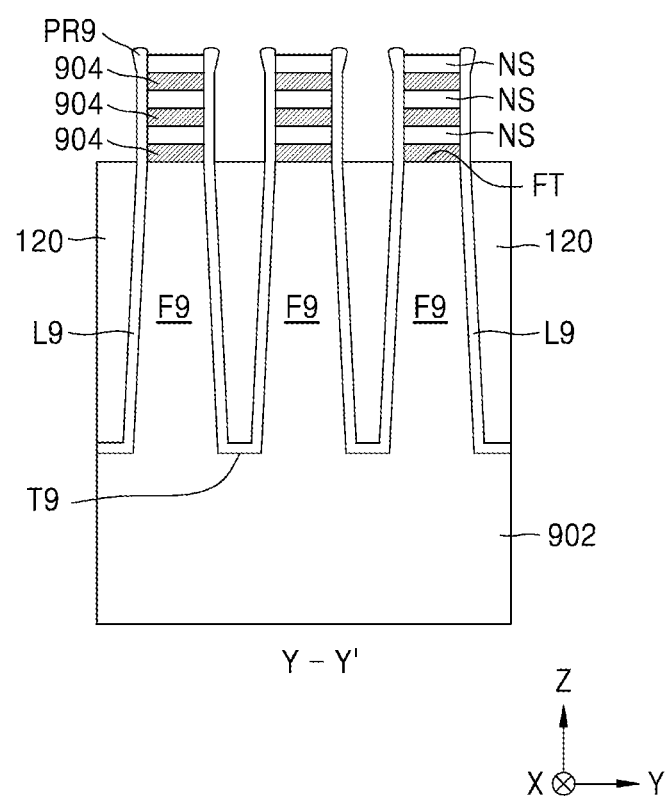

Referring to FIGS. 13A and 13B, by performing similar processes to those described with reference to FIGS. 7D to 7H on a result of FIGS. 12A and 12B, the semiconductor liner L9 having a protrusion part PR9 is formed from the crystalline semiconductor layer 730 and the amorphous semiconductor layer 732 covering the side walls of each of the fin-type active area F9, the plurality of sacrificial semiconductor layers 904, and the plurality of nanosheet semiconductor layers NS, and the isolation layer 120 is formed in the trench T9. The plurality of sacrificial semiconductor layers 904 and the plurality of nanosheet semiconductor layers NS and the semiconductor liner L9 covering the side walls thereof may protrude upwardly than the isolation layer 120. The semiconductor liner L9 may include the protrusion part PR9 protruding outward from the plurality of nanosheet semiconductor layers NS in the vicinity of an edge of an upper surface of the uppermost semiconductor layer NS among the plurality of nanosheet semiconductor layers NS. After forming the isolation layer 120 in the trench T9, the upper surface of the uppermost semiconductor layer NS among the plurality of nanosheet semiconductor layers NS may be exposed to the outside, and the protrusion part PR9 of the semiconductor liner L9 may further protrude upward in the vertical direction from the upper surface of the plurality of nanosheet semiconductor layers NS.

Figure 14A:
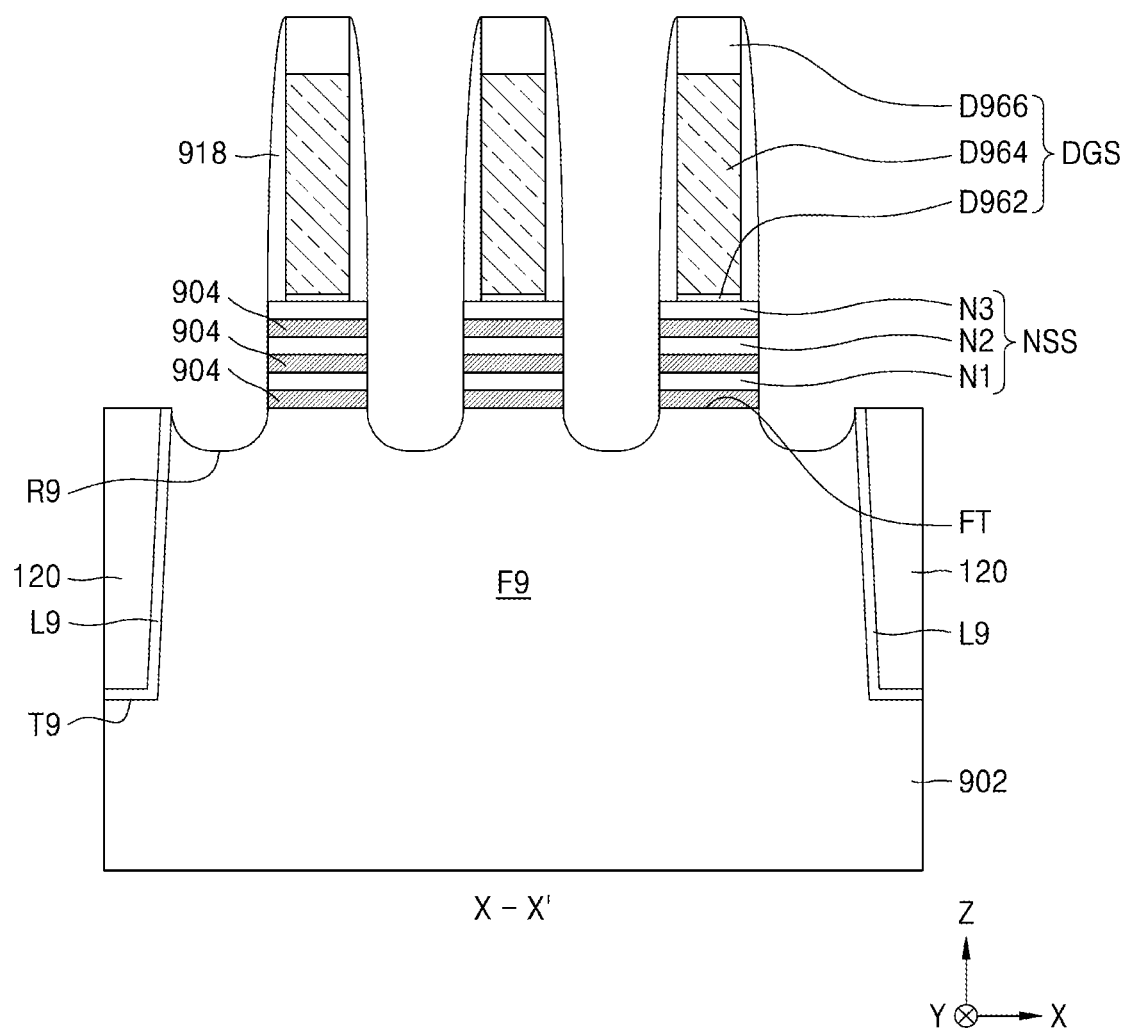
Figure 14B:
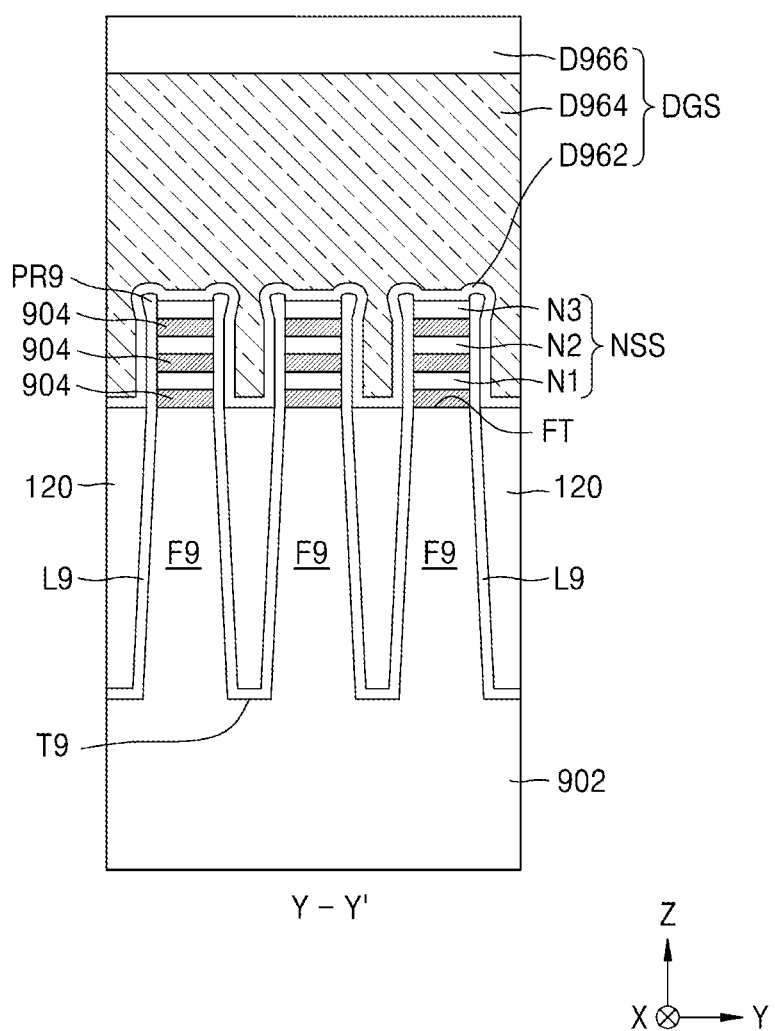

Referring to FIGS. 14A and 14B, from a result of FIGS. 13A and 13B, a plurality of dummy structures DGS are formed on stacked structures of the plurality of sacrificial semiconductor layers 904 and the plurality of nanosheet semiconductor layers NS, and a plurality of outer insulation spacers 918 respectively covering both side walls of the plurality of dummy structures DGS are formed. Thereafter, the plurality of nanosheet semiconductor layers NS are divided into the plurality of nanosheet stacks NSS including the plurality of nanosheets N1, N2, and N3 by using the plurality of dummy structures DGS and the plurality of outer insulation spacers 918 as an etching mask to etch a portion of each of the plurality of sacrificial semiconductor layers 904 and the plurality of nanosheet semiconductor layers NS.

Thereafter, the plurality of recesses R9 are formed on the fin-type active area F9 are formed by etching the fin-type active area F9 exposed between the plurality of nanosheet stacks NSS. To form the plurality of recesses R9, the fin-type active area F9 may be etched by a dry etching process, a wet etching process, or a combination thereof.

Each of the plurality of dummy structures DGS may extend in a horizontal direction (Y direction) intersecting with the fin-type active area F9. Each of the plurality of dummy structures DGS may have a structure in which an insulating layer D962, a dummy gate layer D964, and a capping layer D966 are sequentially stacked. According to example embodiments of the inventive concept, the insulating layer D962 may include a silicon oxide, the dummy gate layer D964 may include polysilicon, and the capping layer D966 may include a silicon nitride.

Figure 15A:
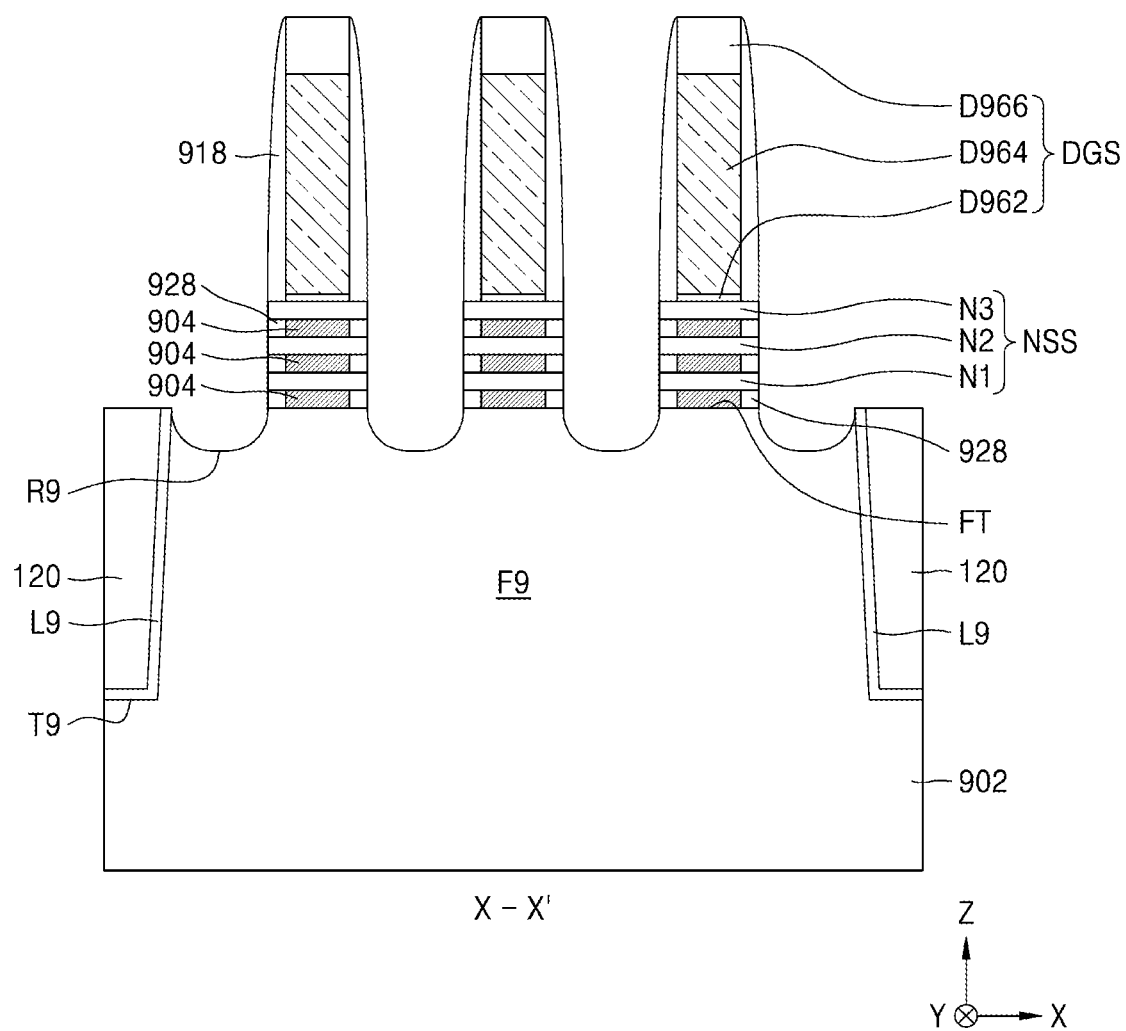
Figure 15B:
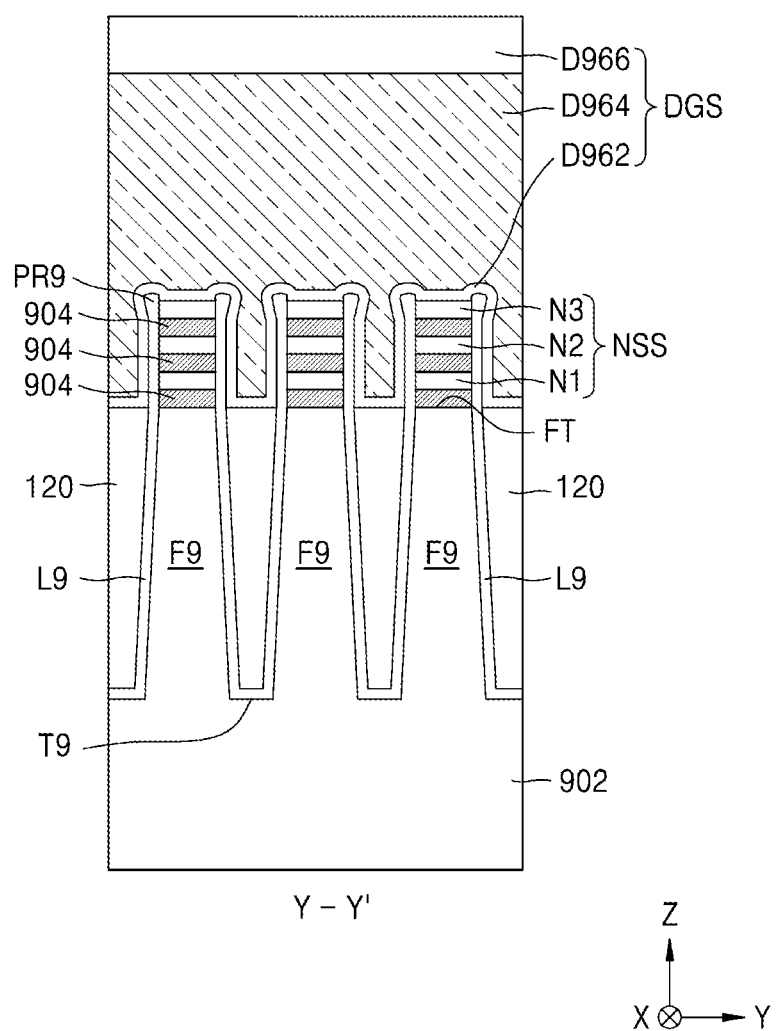

Referring to FIGS. 15A and 15B, from a result of FIGS. 14A and 14B, a plurality of indent areas are formed between the plurality of nanosheets N1, N2, and N3 and between the first nanosheet N1 and the upper surface FT by removing a portion of each of the plurality of sacrificial semiconductor layers 904 exposed around the plurality of recesses R9, and then a plurality of inner insulation spacers 928 filling the plurality of indent areas are formed.

Figure 16A:
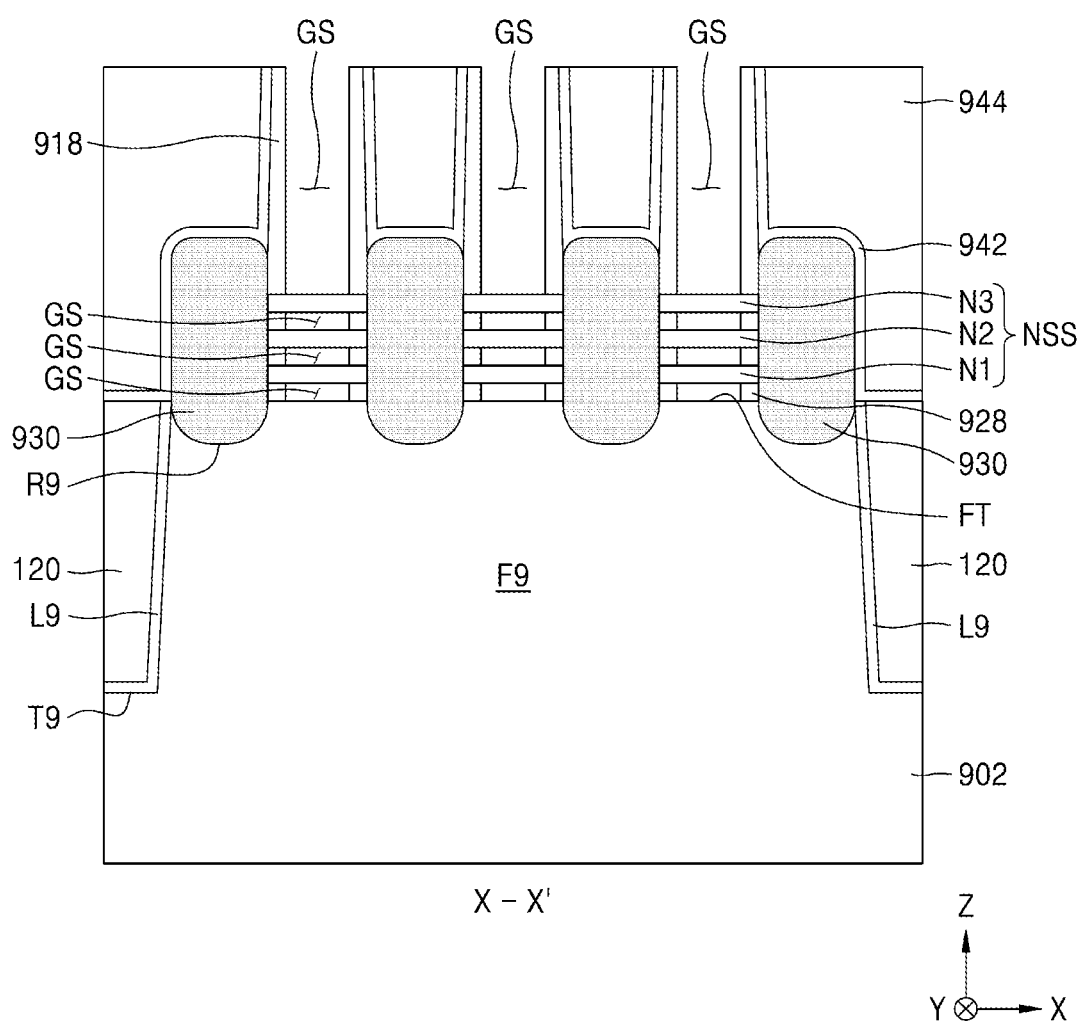
Figure 16B:
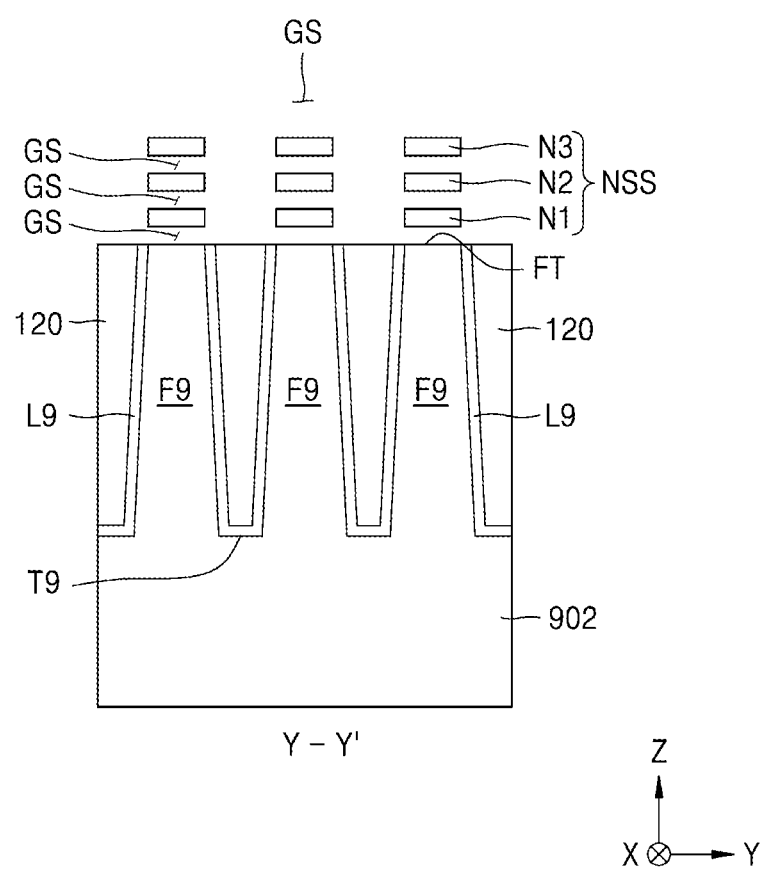

Referring to FIGS. 16A and 16B, from a result of FIGS. 15A and 15B, the plurality of source/drain areas 930 are formed by epitaxial-growing a semiconductor material from exposed surfaces of the plurality of recesses R9, the protective insulating layer 942 covering a result obtained by forming the plurality of source/drain areas 930 is formed, the inter-gate insulating layer 944 is formed on the protective insulating layer 942, and then an upper surface of the capping layer D966 (see FIGS. 15A and 15B) is exposed by planarizing the protective insulating layer 942 and the inter-gate insulating layer 944. Thereafter, the plurality of dummy structures DGS are removed, and a portion of the semiconductor liner L9 exposed as a result thereof is removed to form gate spaces GS through which side walls of the plurality of sacrificial semiconductor layers 904 are respectively exposed. Thereafter, the plurality of sacrificial semiconductor layers 904 are removed through the gate spaces GS to make the gate spaces GS extend to spaces between the plurality of nanosheets N1, N2, and N3 and a space between the first nanosheet N1 and the upper surface FT.

Figure 17A:
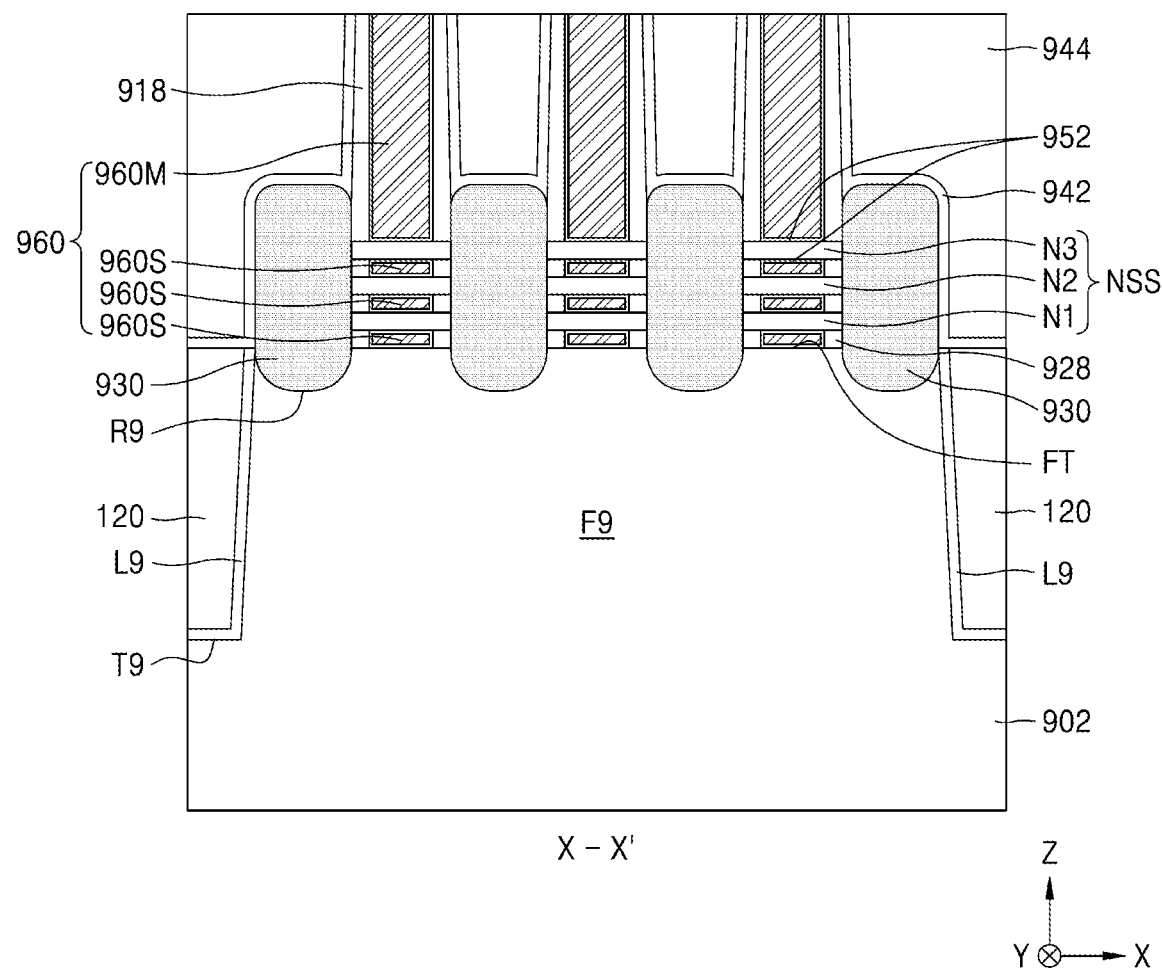
Figure 17B:
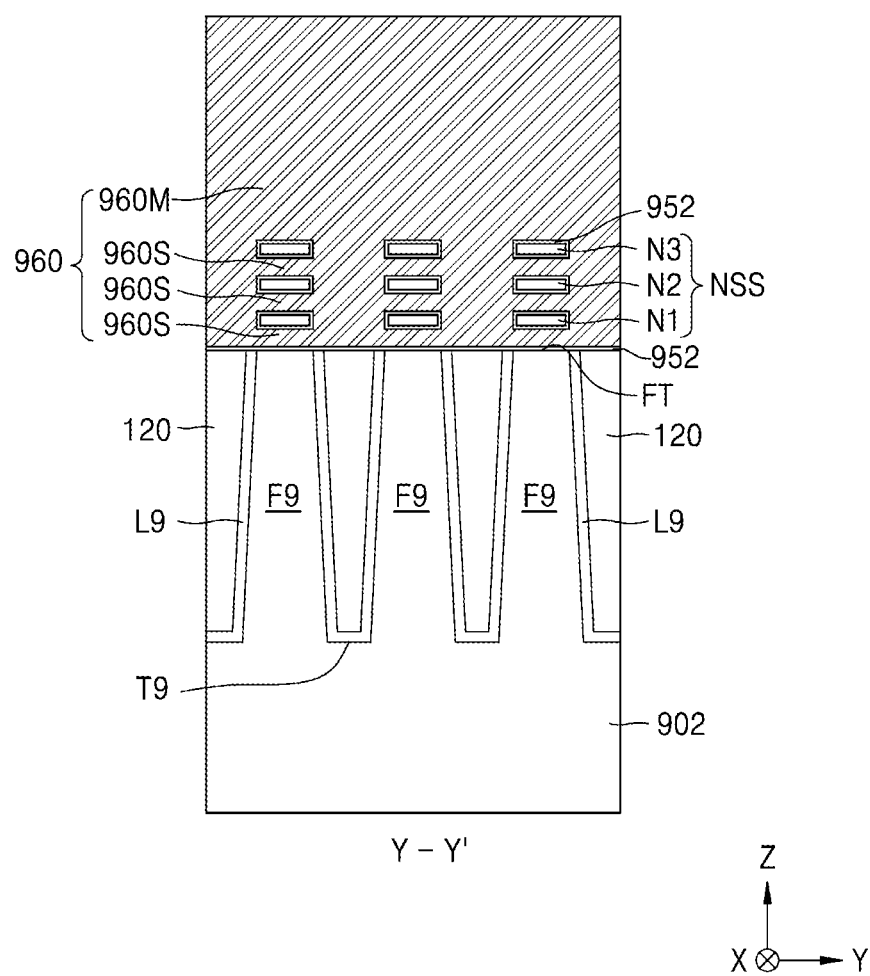

Referring to FIGS. 17A and 17B, the gate insulating layer 952 covering exposed surfaces of the plurality of nanosheets N1, N2, and N3 and the fin-type active area F9 is formed. The gate insulating layer 952 may be formed to cover an upper surface of the semiconductor liner L9 and an upper surface of the isolation layer 120.

Thereafter, the plurality of gate lines 960 filling the plurality of gate spaces GS (see FIGS. 16A and 16B) on the gate insulating layer 952 are formed. Each of the plurality of gate lines 960 may include the main gate part 960M and the plurality of sub-gate parts 960S. By performing a planarization process while forming the plurality of gate lines 960, a height of each of the protective insulating layer 942 and the inter-gate insulating layer 944 may be lowered.

Thereafter, as shown in FIGS. 6A to 6C, the interlayer insulating layer 974 covering the plurality of gate lines 960 is formed, and then the plurality of contact holes 980 which respectively expose the plurality of source/drain areas 930 are formed by partially etching the interlayer insulating layer 974, the inter-gate insulating layer 944, and the protective insulating layer 942. The integrated circuit device 900 may be formed by forming the metal silicide layer 982 on an upper surface of each of the plurality of source/drain areas 930 exposed through the plurality of contact holes 980 and forming the contact plug 984 filling the contact hole 980 on the metal silicide layer 982.

Figure 18A:
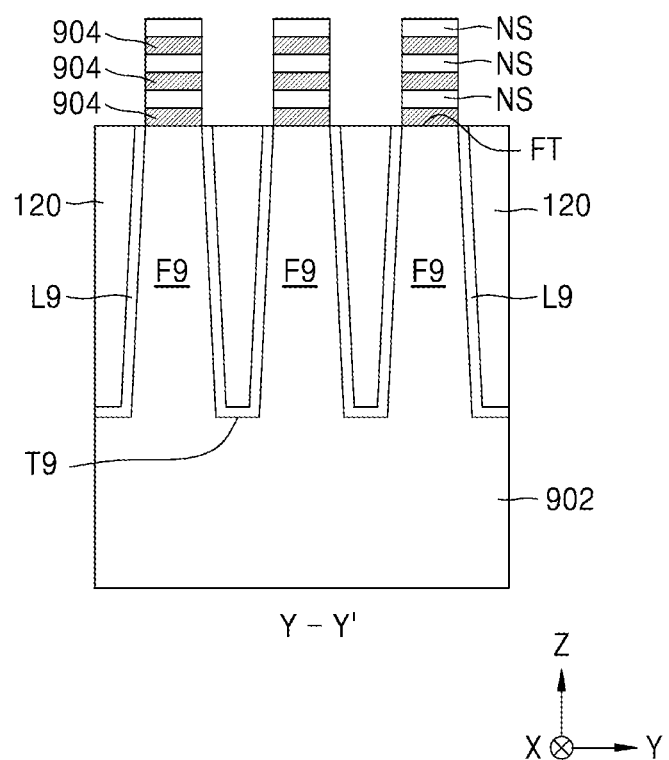
FIGS. 18A and 18B are cross-sectional views illustrating a method of manufacturing an integrated circuit device according to example embodiments of the inventive concept.
Figure 18B:
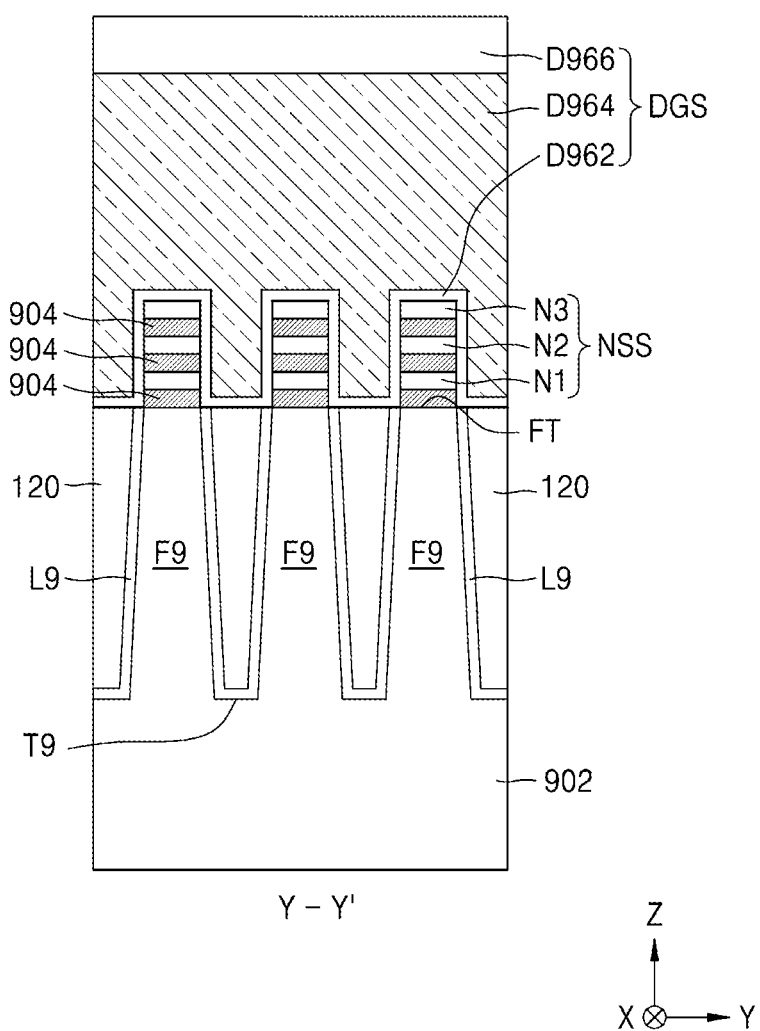

FIGS. 18A and 18B are cross-sectional views illustrating a method of manufacturing an integrated circuit device according to example embodiments of the inventive concept. A method of manufacturing the integrated circuit device 900 shown in FIGS. 6A to 6C is described with reference to FIGS. 18A and 18B. FIGS. 18A and 18B are cross-sectional views taken along line Y-Y' of FIG. 6A. In FIGS. 18A and 18B, like reference numerals in FIGS. 10A to 17B denote like elements, and thus their repetitive description may be omitted herein.

Referring to FIG. 18A, by performing the processes described with reference to FIGS. 10A to 13B, a result in which the semiconductor liner L9 having the protrusion part PR9 and the isolation layer 120 filling the trench T9 on the semiconductor liner L9 are formed as shown in FIGS. 13A and 13B, and then parts of the semiconductor liner L9, which protrude upwardly than the upper surface of the isolation layer 120, are removed to expose both side walls of each of the plurality of nanosheets N1, N2, and N3 in a direction intersecting with the fin-type active area FA. As a result, only a part of the semiconductor liner L9, which is between the substrate 902 and the isolation layer 120 in the trench T9, may remain on the substrate 902.

Referring to FIG. 18B, from a result of FIG. 18A, by the method described with reference to FIGS. 14A and 14b, the plurality of dummy gate structures DGS are formed on a stacked structure of the plurality of sacrificial semiconductor layers 904 and the plurality of nanosheet semiconductor layers NS, the plurality of outer insulation spacers 918 respectively covering both side walls of the plurality of dummy gate structures DGS are formed, the plurality of nanosheet semiconductor layers NS are divided into the plurality of nanosheet stacks NSS including the plurality of nanosheets N1, N2, and N3 by etching portions of the plurality of sacrificial semiconductor layers 904 and the plurality of nanosheet semiconductor layers NS, and the plurality of recesses R9 are formed on the fin-type active area F9 exposed between the plurality of nanosheet stacks NSS are formed.

Thereafter, the plurality of inner insulation spacers 928 are formed by a similar method to that described with reference to FIGS. 15A and 15B, and by a similar method to that described with reference to FIGS. 16A and 16B, the plurality of source/drain areas 930, the protective insulating layer 942, and the inter-gate insulating layer 944 may be formed, then the plurality of dummy gate structures DGS may be removed to form the gate spaces GS through which side walls of the plurality of sacrificial semiconductor layers 904 are respectively exposed, and the plurality of sacrificial semiconductor layers 904 may be removed through the gate spaces GS. Thereafter, by performing the processes described with reference to FIGS. 17A and 17B, the integrated circuit device 900 shown in FIGS. 6A to 6C may be manufactured. According to the methods of manufacturing the integrated circuit device 900, which have been described with reference to FIGS. 10A to 17B, 18A, and 18B, as described with reference to FIGS. 12A and 12B, the crystalline semiconductor layer 730 covering surfaces of each of the fin-type active area F9, the plurality of sacrificial semiconductor layers 904, and the plurality of nanosheet semiconductor layers NS and the amorphous semiconductor layer 732 covering surfaces of the mask pattern MP9 are formed, and then as described with reference to FIGS. 13A and 13B, the isolation layer 120 is formed. Therefore, after forming the isolation layer 120, the semiconductor liner L9 having the protrusion part PR9 remains from the crystalline semiconductor layer 730 and the amorphous semiconductor layer 732 on the side walls of each of the plurality of sacrificial semiconductor layers 904 and the plurality of nanosheet semiconductor layers NS, and thus, it may be reduced or prevented that the plurality of nanosheet semiconductor layers NS are consumed or damaged while forming the isolation layer 120. In addition, the semiconductor liner L9 remaining on a result in which the isolation layer 120 is formed may protect the plurality of nanosheet semiconductor layers NS during a process of manufacturing the integrated circuit device 900, thereby reducing or preventing an increase in a difference between an upper CD and a lower CD in the plurality of nanosheet stacks NSS including the plurality of nanosheets N1, N2, and N3. Therefore, the integrated circuit device 900 having improved performance may be manufactured.

While the inventive concept has been particularly shown and described with reference to example embodiments thereof, it will be understood that various changes in form and details may be made therein without departing from the scope of the following claims.

What is claimed is:

1. A method of manufacturing an integrated circuit device, the method comprising:
    forming a mask pattern on a substrate;
    forming a fin-type active area, using the mask pattern as an etching mask, by etching a portion of the substrate;
    forming a crystalline semiconductor layer extending on a surface of the fin-type active area with a first thickness and an amorphous semiconductor layer extending on a surface of the mask pattern with a second thickness that is greater than the first thickness;
    forming an isolation layer on the crystalline semiconductor layer and the amorphous semiconductor layer;
    forming an extended crystalline semiconductor layer on a side wall of the mask pattern by crystalizing a first portion of the amorphous semiconductor layer adjacent to an interface between the crystalline semiconductor layer and the amorphous semiconductor layer;
    removing a second portion of the amorphous semiconductor layer remaining on the extended crystalline semiconductor layer;
    removing the mask pattern;
    performing a recess process for removing a portion of the isolation layer such that a portion of the fin-type active area protrudes upwardly beyond the isolation layer; and
    forming a semiconductor liner comprising a protrusion portion that protrudes outward and is adjacent to an edge of an upper surface of the fin-type active area by modifying the extended crystalline semiconductor layer and the crystalline semiconductor layer while performing the recess process.

2. The method of claim 1, wherein the forming of the crystalline semiconductor layer and the amorphous semiconductor layer is performed using an epitaxy process.

3. The method of claim 1, wherein each of the crystalline semiconductor layer and the amorphous semiconductor layer includes silicon (Si).

4. The method of claim 1, wherein the forming of the extended crystalline semiconductor layer comprises annealing the amorphous semiconductor layer, and the isolation layer covers the crystalline semiconductor layer and the amorphous semiconductor layer while annealing the amorphous semiconductor layer.

5. The method of claim 1, after the removing of the mask pattern and before the performing of the recess process, further comprising:
    reducing a size of the extended crystalline semiconductor layer by using an etching solution.

6. The method of claim 1, wherein in the forming of the semiconductor liner, the semiconductor liner comprises a side portion that extends on the side wall of the fin-type active area.

7. The method of claim 1, wherein in the forming of the semiconductor liner, the semiconductor liner has a first horizontal width from the side wall of the fin-type active area, and the protrusion portion has a second horizontal width from the side wall of the fin-type active area, the second horizontal width being greater than the first horizontal width.

8. The method of claim 1, wherein the fin-type active area includes silicon germanium (SiGe) or silicon (Si), and the semiconductor liner includes crystalline Si.

9. The method of claim 1, wherein the semiconductor liner includes undoped silicon or doped silicon.

10. The method of claim 1, wherein
    in the forming of the semiconductor liner, the semiconductor liner comprises an upper portion extending on the upper surface of the fin-type active area,
    the upper portion of the semiconductor liner has a first vertical height from the upper surface of the fin-type active area, and
    the protrusion portion has a second vertical height from the upper surface of the fin-type active area, the second vertical height being greater than or equal to the first vertical height.

11. A method of manufacturing an integrated circuit device, the method comprising:
    forming a semiconductor structure on a substrate;
    forming a mask pattern on the semiconductor structure;
    forming a fin-type active area comprising a portion of the substrate and a portion of the semiconductor structure, using the mask pattern as an etching mask, by etching the semiconductor structure and the substrate;
    forming a crystalline semiconductor layer extending on a surface of the fin-type active area with a first thickness and an amorphous semiconductor layer extending on a surface of the mask pattern with a second thickness that is greater than the first thickness;
    forming an isolation layer on the crystalline semiconductor layer and the amorphous semiconductor layer;
    forming an extended crystalline semiconductor layer on a side wall of the mask pattern by crystalizing a first portion of the amorphous semiconductor layer adjacent to an interface between the crystalline semiconductor layer and the amorphous semiconductor layer;
    removing a second portion of the amorphous semiconductor layer remaining on the extended crystalline semiconductor layer;
    removing the mask pattern;
    performing a recess process for removing a portion of the isolation layer such that a portion of the fin-type active area comprising the semiconductor structure protrudes upwardly beyond the isolation layer; and
    forming a semiconductor liner comprising a protrusion portion that protrudes outward and is adjacent to an edge of an upper surface of the fin-type active area by modifying the extended crystalline semiconductor layer and the crystalline semiconductor layer while performing the recess process.

12. The method in claim 11, wherein
    the substrate includes silicon (Si), and
    the semiconductor structure comprises a semiconductor layer including silicon germanium (SiGe).

13. The method of claim 11, wherein each of the crystalline semiconductor layer and the amorphous semiconductor layer includes silicon (Si).

14. The method of claim 11, wherein the forming of the extended crystalline semiconductor layer comprises annealing the amorphous semiconductor layer, and the isolation layer covers the crystalline semiconductor layer and the amorphous semiconductor layer while annealing the amorphous semiconductor layer.

15. The method of claim 11, after the removing of the mask pattern and before the performing of the recess process, further comprising:
reducing a size of the extended crystalline semiconductor layer by using an etching solution.

16. The method of claim 11, wherein in the forming of the semiconductor liner, the semiconductor liner has a first horizontal width from the side wall of the semiconductor structure, and the protrusion portion has a second horizontal width from the side wall of the semiconductor structure, the second horizontal width being greater than the first horizontal width.

17. The method of claim 11, wherein in forming the semiconductor structure on the substrate, the semiconductor structure comprises a lower semiconductor layer and an upper semiconductor layer sequentially stacked on the substrate,
the lower semiconductor layer includes SiGe, and
the upper semiconductor layer includes Si.

18. A method of manufacturing an integrated circuit device, the method comprising:
forming a stacked structure on a substrate, the stacked structure comprising a plurality of sacrificial semiconductor layers and a plurality of nanosheet semiconductor layers that are stacked alternately with the plurality of sacrificial semiconductor layers;
forming a mask pattern on the stacked structure;
forming a fin-type active area comprising a first portion of the substrate, using the mask pattern as an etching mask, by etching a first portion of the stacked structure and a second portion of the substrate;
forming a crystalline semiconductor layer extending on, with a first thickness, the fin-type active area and the stacked structure remaining on the fin-type active area and an amorphous semiconductor layer extending on the mask pattern with a second thickness that is greater than the first thickness;
forming an isolation layer on the crystalline semiconductor layer and the amorphous semiconductor layer;
forming an extended crystalline semiconductor layer on a side wall of the mask pattern by crystalizing a first portion of the amorphous semiconductor layer adjacent to an interface between the crystalline semiconductor layer and the amorphous semiconductor layer;
removing a second portion of the amorphous semiconductor layer remaining on the extended crystalline semiconductor layer;
removing the mask pattern;
performing a recess process for removing a portion of the isolation layer such that a second portion of the stacked structure protrudes upwardly beyond the isolation layer; and
forming a semiconductor liner comprising a protrusion portion that protrudes outward and is adjacent to an edge of an upper surface of an uppermost one of the plurality of nanosheet semiconductor layers by modifying the extended crystalline semiconductor layer and the crystalline semiconductor layer while performing the recess process.

19. The method of claim 18, further comprising:
after the forming of the semiconductor liner, dividing the plurality of nanosheet semiconductor layers into a plurality of nanosheet stacks comprising a plurality of nanosheets by etching the second portion of the stacked structure on the fin-type active area;
removing the plurality of sacrificial semiconductor layers remained on the fin-type active area after the plurality of nanosheet stacks are formed;
forming a gate insulating layer on surfaces of the plurality of nanosheets and the fin-type active area; and
forming a gate line on the plurality of nanosheets and between the plurality of nanosheets.

20. The method of claim 19, wherein,
after the performing of the recess process, a portion of the semiconductor liner is between the fin-type active area and the isolation layer, and
the gate insulating layer is on an upper surface of the semiconductor liner.

* * * * *